United States Patent [19]

Kano et al.

[11] Patent Number: 5,922,212
[45] Date of Patent: *Jul. 13, 1999

[54] SEMICONDUCTOR SENSOR HAVING SUSPENDED THIN-FILM STRUCTURE AND METHOD FOR FABRICATING THIN-FILM STRUCTURE BODY

[75] Inventors: Kazuhiko Kano; Kenichi Nara, both of Obu; Toshimasa Yamamoto, Bisai; Nobuyuki Kato, Seto; Yoshitaka Gotoh, Toyoake; Yoshinori Ohtsuka, Okazaki; Kenichi Ao, Tokai, all of Japan

[73] Assignee: Nippondenso Co., Ltd, Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/663,001

[22] Filed: Jun. 7, 1996

[30] Foreign Application Priority Data

| Jun. 8, 1995 | [JP] | Japan | 7-142100 |
| Jun. 8, 1995 | [JP] | Japan | 7-142101 |
| Jun. 8, 1995 | [JP] | Japan | 7-142105 |

[51] Int. Cl.⁶ .................................................. C23F 1/00
[52] U.S. Cl. .................. 216/2; 438/50; 438/52; 438/53; 438/513; 438/518; 438/705; 438/723; 438/743; 438/766
[58] Field of Search .................. 437/228, 228 S, 437/228 E, 228 N, 901, 921, 922; 216/2; 156/657.1, 662.1; 438/743, 705, 723, 513, 518, 766, 50, 52, 53

[56] References Cited

U.S. PATENT DOCUMENTS

| 4,963,394 | 10/1990 | Willer ................................. 427/250 |
| 5,095,401 | 3/1992 | Zavracky et al. .................... 361/283 |
| 5,164,339 | 11/1992 | Gimpelson ........................... 437/235 |
| 5,165,289 | 11/1992 | Tilmans ............................. 73/862.59 |
| 5,326,726 | 7/1994 | Tsang et al. ........................ 437/228 |
| 5,332,469 | 7/1994 | Mastrangelo ........................ 156/643 |
| 5,417,115 | 5/1995 | Burns ................................... 73/778 |
| 5,461,916 | 10/1995 | Fujii et al. ....................... 73/514.32 |
| 5,500,549 | 3/1996 | Takeuchi et al. .................... 257/415 |
| 5,504,356 | 4/1996 | Takeuchi et al. .................... 257/254 |
| 5,572,057 | 11/1996 | Yamamoto et al. ................. 257/417 |
| 5,587,343 | 12/1996 | Kano et al. ......................... 437/228 |
| 5,619,050 | 4/1997 | Uenoyama et al. ................. 257/254 |
| 5,620,931 | 4/1997 | Tsang et al. ......................... 438/50 |
| 5,622,633 | 4/1997 | Ohtuska et al. ...................... 438/53 |
| 5,627,397 | 5/1997 | Kano et al. ......................... 257/417 |
| 5,668,033 | 9/1997 | Ohara et al. ........................ 438/113 |
| 5,683,591 | 11/1997 | Offenberg ............................ 216/2 |

FOREIGN PATENT DOCUMENTS

| 58-159843 | 9/1983 | Japan | B01J 14/08 |
| 5275702 | 10/1993 | Japan | H01L 29/784 |
| 6163934 | 6/1994 | Japan | H01L 24/84 |
| 7201734 | 8/1995 | Japan | H01L 21/20 |
| 92/03740 | 3/1992 | WIPO . | |

OTHER PUBLICATIONS

Payne, et al: "Surface Micromachined Accelerometer: A Technology Update", SAE 910496, pp. 127–135.
Orpana et al: "Control of Residual Stress of Polysilicon Thin Films by Heavy Doping in Surface Micromachining", IEEE, 1991, pp. 957–960.

Primary Examiner—Nam Nguyen
Assistant Examiner—Steven H. VerSteeg
Attorney, Agent, or Firm—Pillsbury Madison & Sutro LLP

[57] ABSTRACT

A semiconductor sensor having a thin-film structure body, in which thin-film structure is prevented from bending due to the internal stress distribution in the thickness direction, is disclosed. A silicon-oxide film is formed as a sacrificial layer on a silicon substrate, and a polycrystalline-silicon thin film is formed on the silicon-oxide film. Thereafter, phosphorus (P) is ion-implanted in the surface of the polycrystalline-silicon thin film, and thereby the surface state of the polycrystalline-silicon thin film is modified. A portion of distribution of stress existing in the thickness direction of the polycrystalline-silicon thin film is changed by this modification, and stress distribution is adjusted. By removal of the silicon-oxide film, a movable member of the polycrystalline-silicon thin film is disposed above the silicon substrate with a gap interposed therebetween.

20 Claims, 46 Drawing Sheets

5,922,212

SEMICONDUCTOR SENSOR HAVING SUSPENDED THIN-FILM STRUCTURE AND METHOD FOR FABRICATING THIN-FILM STRUCTURE BODY

CROSS REFERENCE TO RELATED APPLICATION

This application is based upon and claims the benefit of priority of the prior Japanese Patent Applications Nos. 7-142100, 7-142101 and 7-142105, the contents of which are incorporated herein by reference.

BACKGROUND OF THE INVENTION

1. Field of the Invention

The present invention relates to a method for fabricating a thin-film structure body, for example, suitable for fabrication of a semiconductor sensor in which a beam structure composed of a thin film is formed on a semiconductor substrate to detect a physical quantity such as acceleration, yaw rate, vibration, or the like by displacement of the beam structure.

2. Description of the Related Art

Recently, the demand has grown for a more compact and lower cost semiconductor acceleration sensor. To this end, a differential-capacitance type semiconductor acceleration sensor that employs polycrystalline silicon as an electrode is disclosed in PCT WO 92/03740. A sensor of this type is described utilizing FIG. 33 and FIG. 34. FIG. 33 indicates a plan view of the sensor, and FIG. 34 is a C—C sectional view of FIG. 33.

A movable member 116 of beam structure is disposed above a silicon substrate 115 with a predetermined gap interposed therebetween. The movable member 116 composed of polycrystalline silicon thin film comprises beam sections 121 and 122, a weight section 123, and movable electrode sections 124. The movable member 116 is fixed on an upper surface of the silicon substrate 115 by anchor sections 117, 118, 119, and 120. That is to say, the beam sections 121 and 122 extend from the anchor sections 117, 118, 119, and 120 of the movable member 116, and the weight section 123 is supported by these beam sections 121 and 122. The movable electrode sections 124 are formed on this weight section 123. Two fixed electrodes 125 are disposed on the silicon substrate 115 and oppose the movable electrode section 124. Accordingly, the structure is configured so when acceleration is applied in a direction parallel to the surface of the silicon substrate 115 (indicated by X in FIG. 33), the electrostatic capacitance between the movable electrode portion 124 and the fixed electrodes 125 increases on one side and decreases on the other.

In fabrication of this sensor, as shown in FIG. 35, a sacrificial layer 126 of silicon-oxide film or the like is formed on the silicon substrate 115, and along with holes 127 are formed in the sacrificial layer 126 at places which become anchor sections. Thereafter, as shown in FIG. 36, a polycrystalline silicon film 128 which becomes the movable member 116 is deposited on the sacrificial layer 126 and configured in the specified pattern. Furthermore, as shown in FIG. 37, the sacrificial layer 126 below the movable member 116 is etched away with an etchant, and the movable member 116 is disposed above the silicon substrate 115 with a predetermined gap interposed therebetween.

However, as shown in FIG. 38, during film formation, internal stress σ is exerted from the interface of the sacrificial layer 126 to the movable member 116 composed of polycrystalline silicon thin film, and internal stress σ gradually changes and increases in the direction of film thickness. As a result, internal stress distribution exists in the direction of film thickness of the movable member 116, and the resulting movable member is warped. That is to say, as shown in FIG. 33, the movable electrode section 124 assumes a cantilever structure taking the weight section 123 as a fixed end, and the movable electrode section 124 is warped due to internal stress distribution existing in the direction of film thickness. As a result, the movable electrode section 124 and the fixed electrode 125 could not be disposed opposite each other with good precision. Additionally, deflection due to internal stress distribution is generated in the weight section 123 as well. As a result, the movable electrode section 124 which protrudes from this weight section 123 is also displaced and the movable electrode section 124 and the fixed electrode 125 could not be disposed opposite each other with good precision.

As a general means to reduce internal stress of a film structure body such as this, a long-term, high-temperature heat treatment on the film structure body (for example 24 hours at 1,150° C.) is performed. However, this method could not be combined with an IC process because of the resulting damage on transistors and the like peripheral structure circuitry provided in the periphery of the movable member 116 on the silicon substrate 115. Furthermore, application in a semiconductor substrate acceleration sensor integrated with peripheral circuitry was not practical.

SUMMARY OF THE INVENTION

Accordingly, it is an objective of the present invention to provide a semiconductor sensor whose thin-film structure disposed above a substrate is formed into a desired configuration, preventing undesirable deflection.

During formation of the thin film for movable member, as shown in FIG. 38, distribution $\sigma_{z1}$ of internal stress exists in the film-thickness direction. Here, leveled distribution $\sigma z_2$ at which internal stress σ in the film-thickness direction becomes substantially uniform can be obtained by performing the above-described long-term, high-temperature heat treatment (for example 24 hours at 1,150° C.). However, reduction of deflection is possible even if internal stress σ did not necessarily cause the distribution $\sigma_{z2}$ at which the internal stress σ in the film-thickness direction becomes substantially uniform. That is to say, deflection is determined at the bending moment acting upon the thin film, to cause the bending moment to be reduced is linked to reduction of deflection, and causing local stress in the proximity of the surface to be changed is sufficient for causing the bending moment to be reduced.

In this regard, a semiconductor sensor according to the present invention, which comprises a substrate and a thin film suspendedly disposed above the substrate with a predetermined gap interposed therebetween by etching away a sacrificial layer, wherein the thin film includes a lower portion and an upper portion where internal stress existing is made different from that in the lower portion to adjust stress distribution in a thickness direction of the thin film.

Specifically, a method for fabricating thereof includes: forming a sacrificial layer on the substrate forming a thin film on the sacrificial layer and thereafter modifying a portion of distribution of stress existing in a thickness direction of the thin film to form the upper portion.

It is preferable that, as the adjustment of stress distribution, modification of a thin-film surface by introduction of a stress-adjusting substance, local etching, or formation of cap layer of a heterogeneous or homogeneous material, should be applied.

According to the present invention, the thin film is provided so that stress distribution is adjusted by differing the internal stress induced between the upper portion the lower portion. Accordingly, the reduction of deflection of the thin film after sacrificial-layer etching is possible without resorting to long-term, high-temperature heat treatment (for example 24 hours at 1,150° C.).

In case the modification processing of the thin-film surface is performed after a step in which a maximum-temperature is applied after the thin film formation, since stress remaining in the thin film has been substantially determined before the modification processing is performed, stress-distribution adjustment can be effectively performed by the modification processing.

Furthermore, if the modification processing of the thin-film surface is performed prior to etching of the sacrificial layer, the sacrificial layer functions as a mask material and the material (wiring and substrate) below the sacrificial layer is protected from the operation of the modification processing.

Specifically, in a case where a stress-adjusting substance is implanted into the surface portion of the thin film as the modification processing, since the implantation of the stress-adjusting substance is performed before the sacrificial layer etching, a region disposed lower than the sacrificial layer can avoid being doped with the stress-adjusting substance by the sacrificial layer. Therefore, the distribution of stress existing in the thickness direction of the thin film can be changed while the impurity concentration of the diffusion layer formed on the substrate as an active element avoids varying due to the implanted stress-adjusting substance. Accordingly, the accuracy requirement of the region of the thin film where the stress-adjusting substance is implanted can be relaxed, and so the stress-adjusting substance can be implanted while preventing a decline in productivity.

On the other hand, if the modification processing of the thin-film surface is performed after the sacrificial layer etching, configuration of the thin film due to stress occurring subsequently to sacrificial-layer etching can be measured and reflected in conditions for surface-modification processing.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

First Embodiment

A specific first embodiment according to this invention will be described with reference to the drawings.

Figure 1:
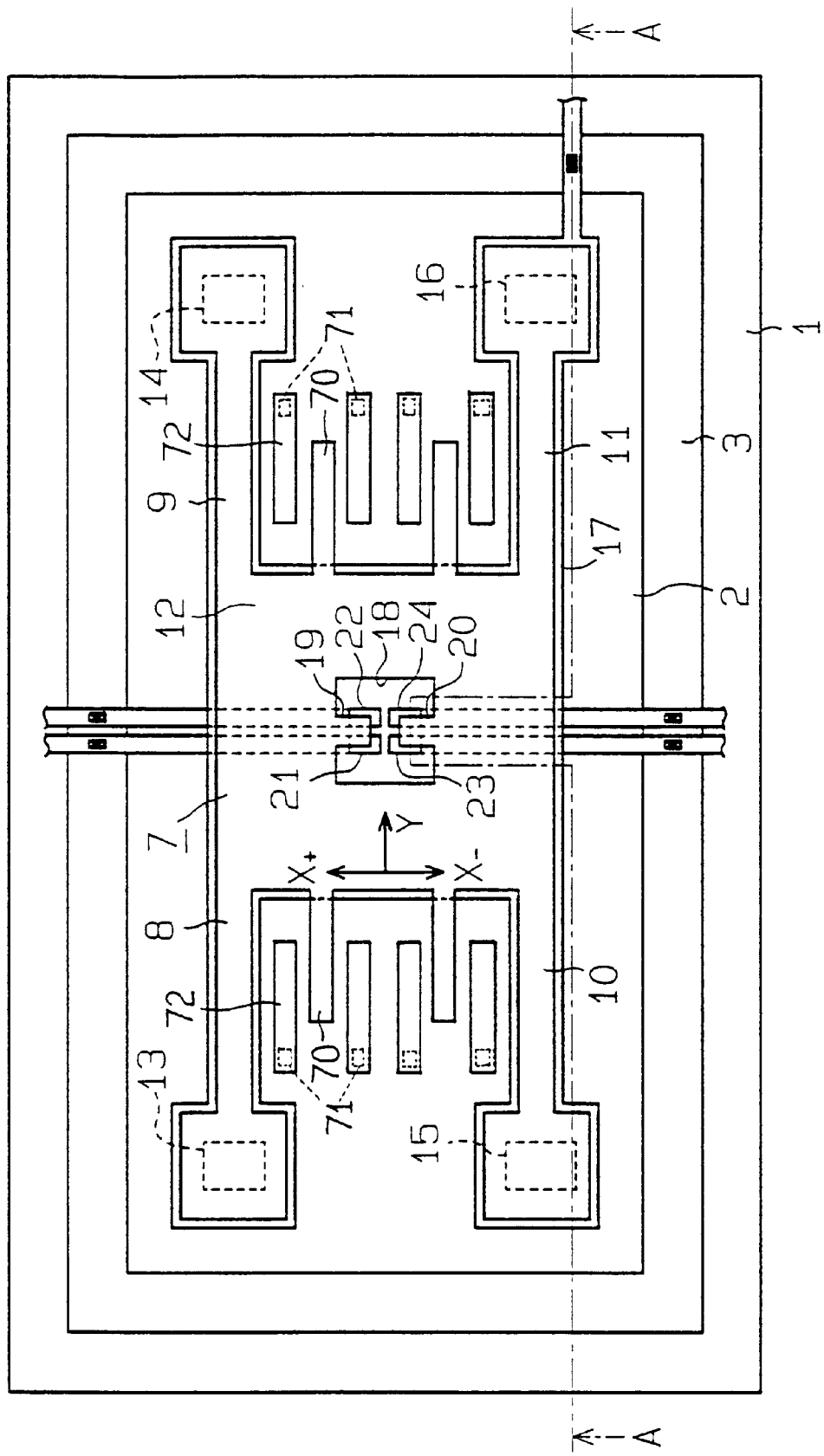
FIG. 1 is a plan view of a semiconductor acceleration sensor according to a first embodiment.
Figure 2:
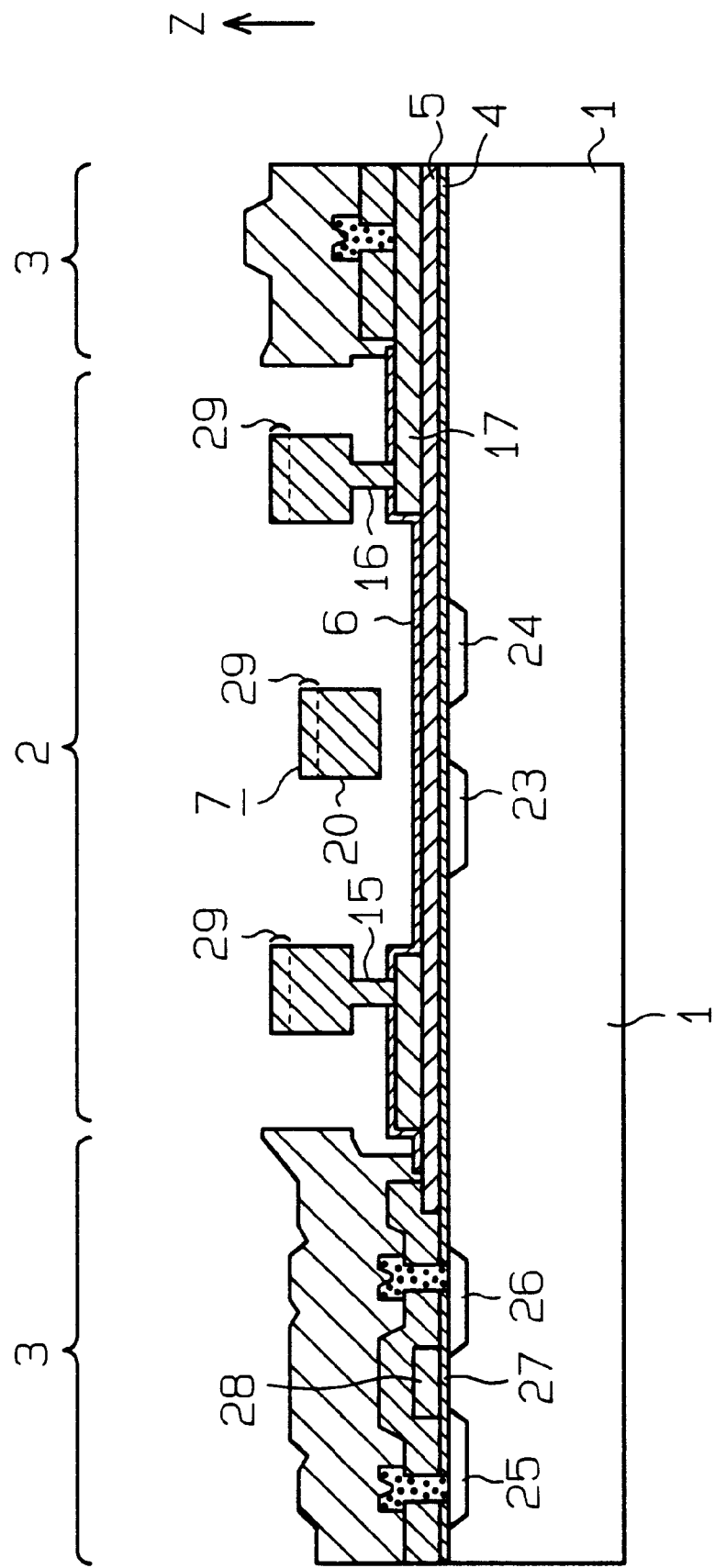
FIG. 2 is a sectional view taken along line A—A of FIG. 1.

A semiconductor acceleration sensor according to the present embodiment has an air-gap type MIS transistor structure. FIG. 1 indicates a plan view of a semiconductor acceleration sensor according to the present embodiment. FIG. 2 indicates a sectional view taken along line A—A of FIG. 1. In FIG. 1 there is a sensor-element formation region 2 and a circuit-formation region 3 to perform signal processing and the like on a silicon substrate 1. and FIG. 2 typically indicates a cross-section of the sensor-element formation region 2 as well as a cross-section of a MOS transistor of the circuit-formation region 3.

Insulation films 4, 5, and 6 are formed in the sensor-element formation region 2 on a p-type silicon substrate 1 as a semiconductor substrate, and the insulation films 4, 5, and 6 comprise $SiO_2$, $Si_3N_4$, or the like.

A movable member 7 comprising a polycrystalline silicon film is disposed on the silicon substrate 1 (insulation film 6). The movable member 7 includes beam sections 8, 9, 10, and 11, a movable electrode section 70, and a weight section 12. The movable member 7 is fixed to the substrate 1 by anchor sections 13, 14, 15, and 16, and is disposed above the substrate 1 with a predetermined gap (air gap) interposed therebetween. This movable member 7 (thin film) is disposed, by etching away a sacrificial layer provided thereunder, above the silicon substrate 1 with a gap corresponding to the thickness of the sacrificial layer interposed therebetween. In greater detail, a polycrystalline silicon layer 17 is disposed on the insulation film 5 on the sensor-element formation region 2, and the anchor sections 13, 14, 15, and 16 are provided on this polycrystalline silicon layer 17. The beam sections 8, 9, 10, and 11 of band configuration extend from these anchor sections 13, 14, 15, and 16, and the weight section 12 of square configuration is supported between beam sections 8, 9, 10, and 11.

Additionally, the movable electrode section 70 is provided on this weight section 12. Meanwhile, two fixed electrodes 72 are disposed on an anchor portion 71 so as to oppose with respect to one movable electrode section 70. Accordingly, the structure is such that in a case of acceleration applied in the X+ or X− direction, electrostatic capacitance between the movable electrode portion 70 and the fixed electrodes 72 increases on one side and decreases on the other.

The movable member 7 is displaced in directions parallel to and perpendicular to the substrate 1. Accordingly, the directions indicated by X+ and X− (i.e., the directions parallel to the substrate surface) in FIG. 1 and the direction indicated by z (i.e., the direction perpendicular to the substrate surface) in FIG. 2 become the acceleration-detection directions.

In this way, according to the present sensor the movable member 7 of beam structure is disposed above the silicon substrate 1 with a predetermined gap interposed therebetween. Moreover, this movable member 7 comprises a polycrystalline-silicon thin film, and a thin-film structure body is constructed.

A via hole 18 is provided in a center portion of the weight section 12, and the movable gate electrode sections 19 and 20 are formed by a configuration of this via hole 18. The movable gate electrode sections 19 and 20 constitute a cantilever of band configuration, and are provided on a central portion of the weight section 12 so as to mutually approach in the acceleration-detection directions X+ and X−. In this way, the movable gate electrode sections 19 and 20 are also provided above the silicon substrate 1 with a predetermined gap interposed therebetween.

Meanwhile, a first source electrode 21 and a first drain electrode 22 comprising an n-type impurity diffusion layer are disposed in parallel on the silicon substrate 1 below the movable gate electrode section 19 of the movable member 7 in a Y direction perpendicular to the acceleration-detection directions X+ and X−. These electrodes 21 and 22 assume an oblong configuration and extend in the acceleration-detection directions X+ and X−. Similarly, a second source electrode 23 and a second drain electrode 24 comprising an n-type impurity diffusion layer are disposed in parallel on the silicon substrate 1 below the movable gate electrode section 20 of the movable portion 7 in a Y direction perpendicular to the acceleration-detection directions X+ and X−. These electrodes 23 and 24 assume an oblong configuration and extend in the acceleration-detection directions X+ and X−. Further, the electrodes 21 through 24 are formed by implanting for example arsenic or the like into the surface of the silicon substrate 1. As shown in FIG. 1, the source and drain electrodes 21 through 24 respectively extend as diffusion layers in the circuit-formation region 3, and are connected to circuitry within the circuit-formation region 3.

A circuit comprising a plurality of transistors including MOSFETs or the like is formed in the circuit-formation region 3. FIG. 2 shows a MOSFET having a polycrystalline silicon gate electrode 28, a gate oxide film 27, a source electrode 25, and a drain electrode 26.

Additionally, as shown in FIG. 1, the polycrystalline silicon layer 17 is disposed below the movable member 7 in a region opposing the movable member 7, having a plan configuration roughly similar to the movable member 7. Moreover, the polycrystalline silicon layer 17 is pulled outwardly of the sensor-element formation region 2 and is electrically connected on the circuit-formation region 3. Accordingly, the polycrystalline silicon layer 17 and the movable member 7 including the weight section 12, the movable gate electrode sections 19 and 20 and the movable electrode section 70 are made equipotential through the anchor sections 13 through 16, and therefore an attractive electrostatic force exerting between the silicon substrate 1 and the movable member 7 is cancelled.

Furthermore, the movable member 7 (movable gate electrode sections 19 and 20) may utilize, other than a polycrystalline-silicon thin film, an amorphous-silicon thin film or a thin film of a thermally resistant metal such as aluminum or tungsten. In particular, forming a thin film with a material employed in an ordinary IC fabrication process becomes simple by utilizing a thin film of polycrystalline silicon or amorphous silicon.

Additionally, as shown in FIG. 2, a surface-modified layer 29 for suppressing deformation is formed on the surface of the movable member 7 (polycrystalline-silicon thin film), and the movable member 7 extends straight with no deflection up or down due to this surface-modified layer 29. According to the present embodiment, the surface-modified layer 29 is an ion-implanted layer implanted with phosphorus (P).

A mode of operation of the present acceleration sensor will be described hereinafter.

A pair of so-called field-effect transistors (FET) are respectively structured by the movable gate electrode sections 19 and 20 and the source electrodes 21 and 23 and drain electrodes 22 and 24 on the silicon substrate 1. When voltage is applied between the source electrodes and the drain electrodes and between the movable gate electrode sections 19 and 20 and the silicon substrate 1, channel regions are formed on the surface of the silicon substrate 1 between the source electrodes and the drain electrodes, respectively, and thereby current (first drain current) flows between the first source electrode 21 and the first drain electrode 22, and current (second drain current) flows between the second source electrode 23 and the second drain electrode 24.

In a case where the present acceleration sensor is subjected to acceleration and the movable gate electrode sections 19 and 20 (movable member 7) are displaced in the X+ direction (i.e., the direction parallel to the surface of the substrate 1) of FIG. 1, the surface area (in transistor terms, the channel width) of the channel region between the first source electrode 21 and the first drain electrode 22 is decreased, and the first drain current flowing between the two electrodes is decreased. Meanwhile, the surface area (in transistor terms, the channel width) of the channel region between the second source electrode 23 and the second drain electrode 24 is increased, and the second drain current flowing between the two electrodes is increased. Similarly, in a case where the movable gate electrode sections 19 and 20 (movable member 7) are displaced in the X− direction (i.e., the direction parallel to the surface of the substrate 1) of FIG. 1, the first drain current is increased and the second drain current is decreased. In this way, the current flowing between the source and drain electrodes 21 and 22 and the current flowing between the source and drain electrodes 23 and 24 due to displacement of the movable gate electrode sections 19 and 20 in the acceleration-detection directions X+ and X− change in mutually reverse phase.

Additionally, by applying electrical potential between the movable electrode section 70 disposed on the weight section 12 and the fixed electrode 72 opposing thereto so that horizontal displacement becomes 0, the acceleration sensor of this embodiment can be controlled under closed-loop control, and acceleration can be detected by the magnitude of the potential to be applied between the movable electrode section 70 and fixed electrode 72.

Additionally, in a case where the present acceleration sensor is subjected to acceleration and the movable gate electrode sections 19 and 20 (movable member 7) are displaced in the Z direction (i.e., the direction perpendicular to the surface of the substrate 1) of FIG. 2, the carrier concentration of the channel region is decreased by change in field strength, and so drain current of the two transistors is simultaneously decreased. In this way, the present sensor can detect acceleration by increase or decrease in current quantity, and as shown in FIG. 1, the current change passes through the diffusion layer in which the source and drain electrodes 21 through 24 are formed and is conveyed to the surrounding circuit-formation region 3 and processed.

At this time, according to the present acceleration sensor, the two source and drain electrodes 21 through 24 for detecting acceleration in directions parallel to the surface of the silicon substrate 1 by a differential process can be disposed proximately in the center portion of the weight section 12 by providing the via hole 18 in the weight section 12. Therefore, fluctuations in the characteristics of the two transistors can be minimized, and the restriction at detection-circuit side can be reduced.

A fabricating process for the present acceleration sensor will be described hereinafter with reference to FIG. 3 through FIG. 17.

Figure 3:
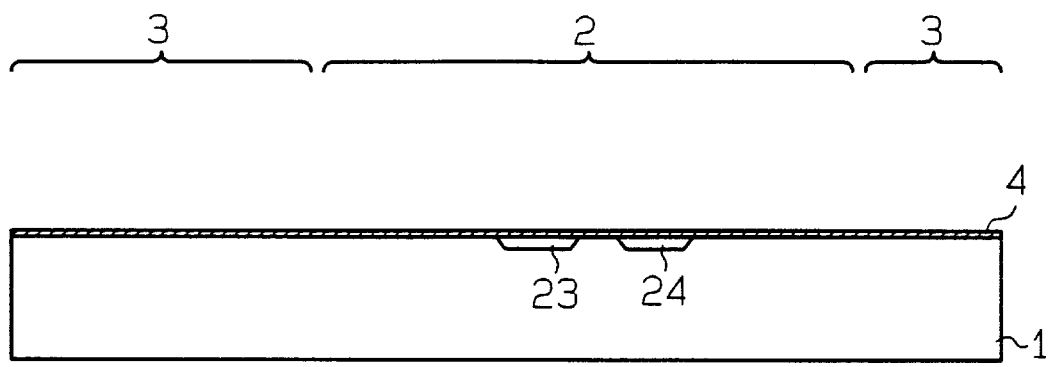
FIG. 3 through FIG. 17 are sectional views showing steps for fabricating the semiconductor acceleration sensor according to the first embodiment.

Firstly, as shown in FIG. 3, a p-type silicon substrate 1 is prepared, and after an insulation film (silicon-oxide film) 4 of approximately 50 nm has been formed on a surface, a photolithography process is performed in a desired region which becomes the source and drain electrodes in a sensor-element formation region 2. Source and drain electrodes (impurity diffusion layer) 21 through 24 are formed by ion-implantation or the like.

Figure 4:
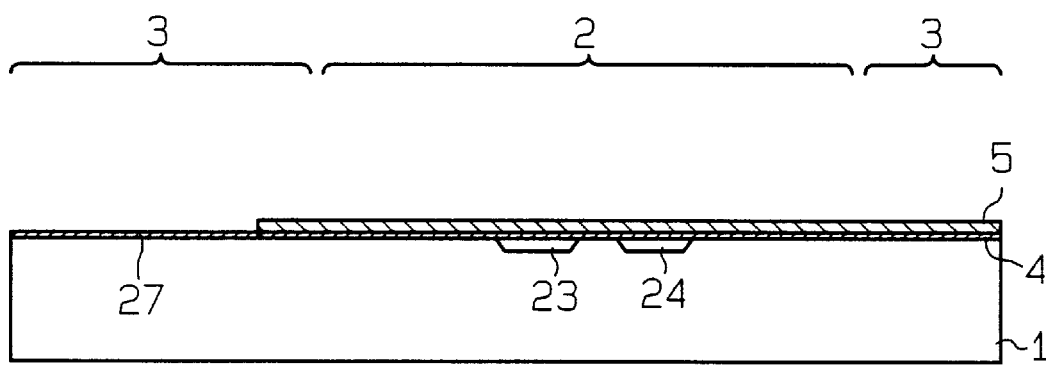

Accordingly, as shown in FIG. 4, an insulation film (silicon-nitride film) 5 of approximately 100 nm is formed, and thereafter, a photolithography process is performed and the insulation film (silicon-nitride film) 5 and insulation film (silicon-oxide film) 4 of the transistor-formation region of the circuit-formation region 3 are etched away. Further, a gate-oxide film 27 of approximately 20 nm is formed on the surface of the substrate 1 in the transistor-formation region of the circuit-formation region 3.

Figure 5:
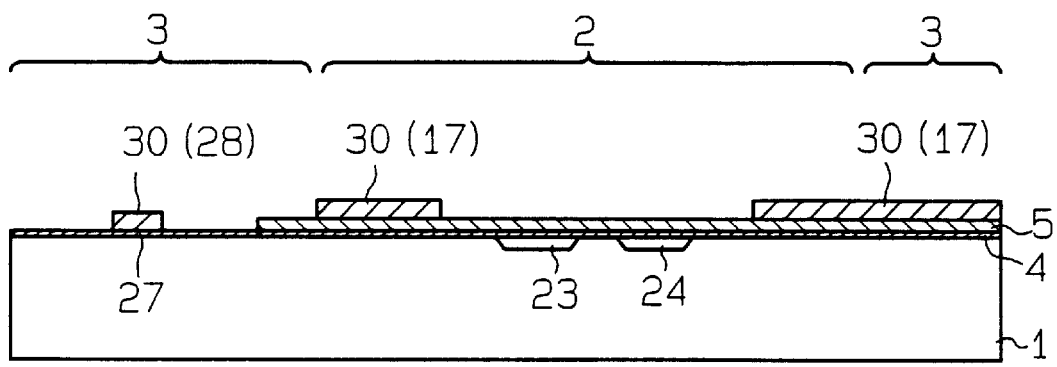

In continuation, as shown in FIG. 5, a polycrystalline silicon layer 30 of approximately 350 nm is formed by a low-pressured CVD process or the like. The entire surface of the polycrystalline silicon layer 30 is doped with an impurity of phosphorus or the like and resistance is lowered. Thereafter, the polycrystalline silicon layer 30 undergoes a photolithography process, caused by dry etching or the like, to become a gate electrode 28 of a transistor of the circuit-formation region 3 and an electrode section (17) for drawing to outside a sensor region of gate electrode sections 19 and 20 of the sensor.

Figure 6:
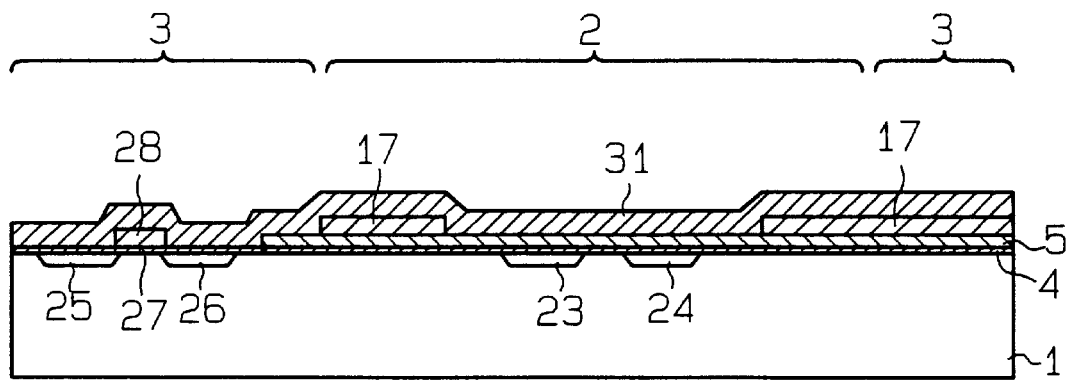

Further, as shown in FIG. 6, a photolithography process is performed in a desired region of the circuit-formation region 3. The source and drain electrodes 25 and 26 of a transistor are formed by ion-implantation or the like of phosphorus, arsenic, or the like. Thereafter, an interlayer insulation film 31 of, for example, borophosphosilicate glass (BPSG) or the like of approximately 500 nm is formed on the entire surface by, for example, a plasma enhanced CVD method.

Figure 7:
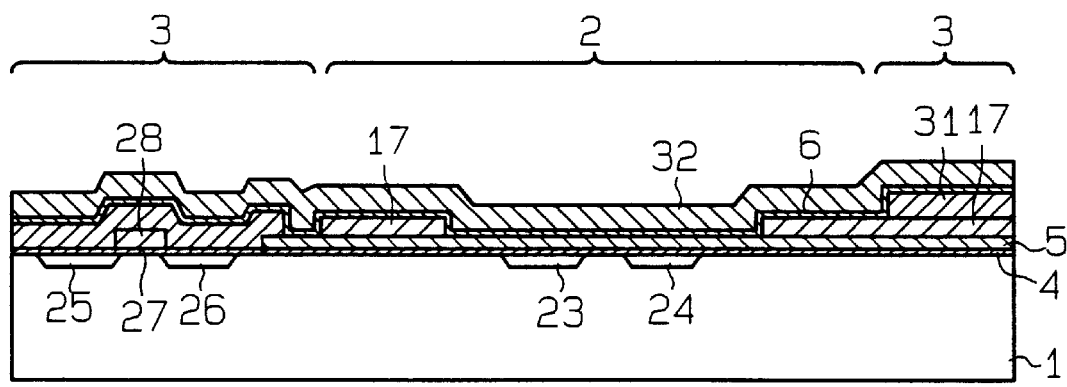

Further, as shown in FIG. 7, the interlayer insulation film 31 on the sensor-element formation region 2 undergoes a photolithography process and is etched away. Thereafter, an insulation film (silicon-nitride film) 6 of approximately 50 nm which becomes an etching stopper during sacrificial-layer etching is formed. Further, a silicon-oxide film 32 of approximately 1 $\mu$m which becomes a sacrificial layer is formed over the entire surface by a CVD process or the like.

Figure 8:
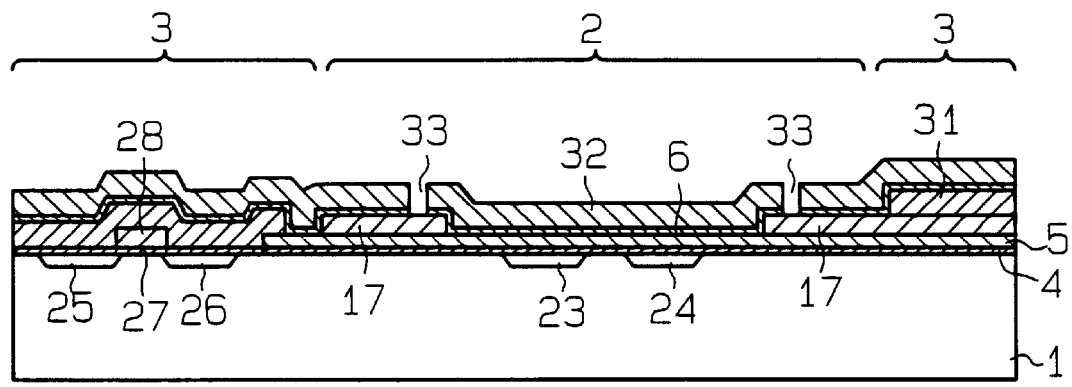

Next, as shown in FIG. 8, on the silicon-oxide film 32 and insulation film (silicon-nitride film) 6, contact sections 33 are formed, through a photolithography process, by dry etching or the like. The contact sections 33 will provide contact portions of the gate electrode sections 19 and 20 and the drawing electrode (17) to an exterior of the sensor-element formation region 2, and function as anchor sections 13, 14, 15, and 16.

Figure 9:
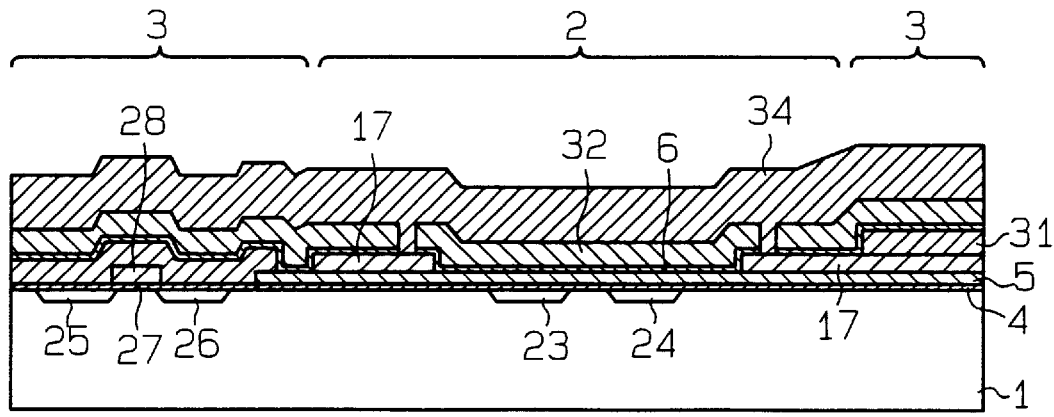

Further, as shown in FIG. 9, a polycrystalline-silicon thin film 34 of approximately 2 $\mu$m which is a movable-member formation film is formed by a low-pressured CVD process on the entire surface. An impurity being phosphorus or the like is doped in a surface-side proximity of this polycrystalline-silicon thin film 34 contiguous with at least the silicon-oxide film (sacrificial layer) 32 and resistance is lowered.

Figure 10:
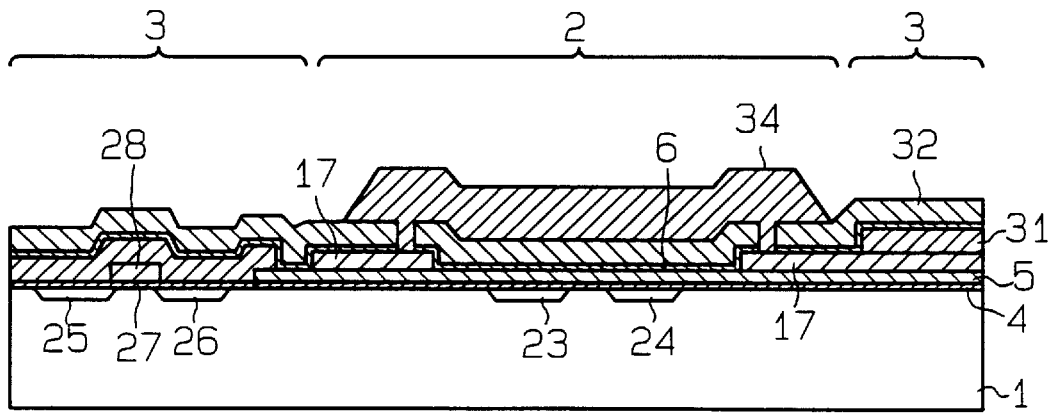

In continuation, as shown in FIG. 10, this polycrystalline-silicon thin film 34 undergoes a photolithography process and is patterned so that solely the sensor-element formation region 2 of oblong configuration as shown in FIG. 1 is allowed to remain. At this time, taper-etching by wet etching and RIE or the like is performed so that a side wall becomes canted. Because a step can be reduced (improvement of step coverage) by doing this, micro-machining of film-forming, etching, photolithography, and other processes in the following processes becomes possible.

Figure 11:
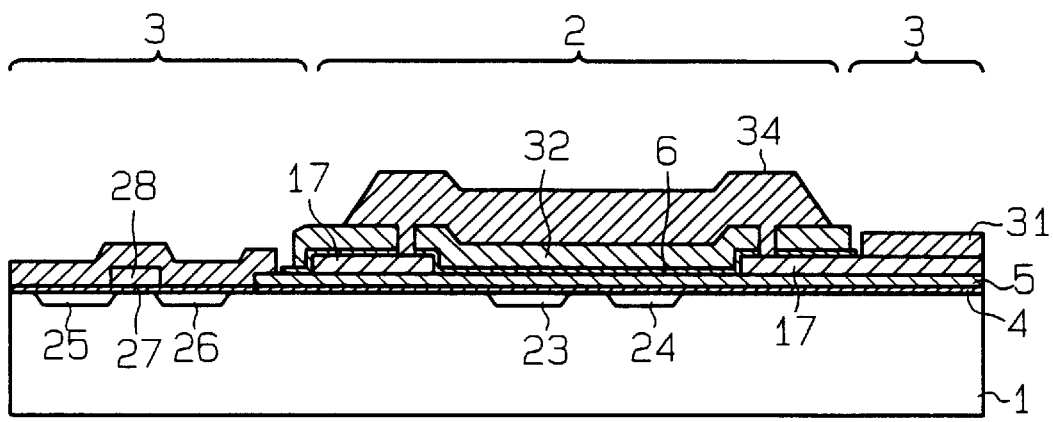

Next as shown in FIG. 11, the silicon-oxide film (sacrificial layer) 32 and insulation film (silicon-nitride film) 6 on the circuit-formation region 3 undergo a photolithography process and are etched away.

Figure 12:
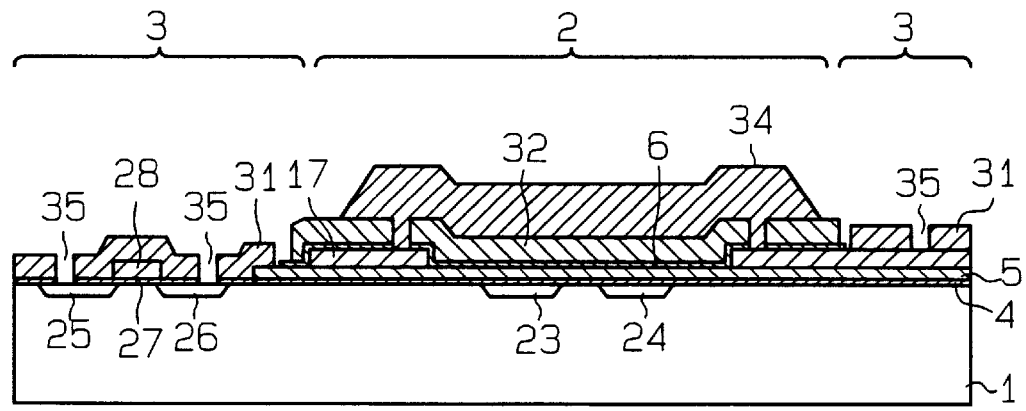

Further as shown in FIG. 12, a desired region of the interlayer insulation film 31 undergoes a photolithography process and contact holes 35 are formed by dry etching or the like.

Figure 13:
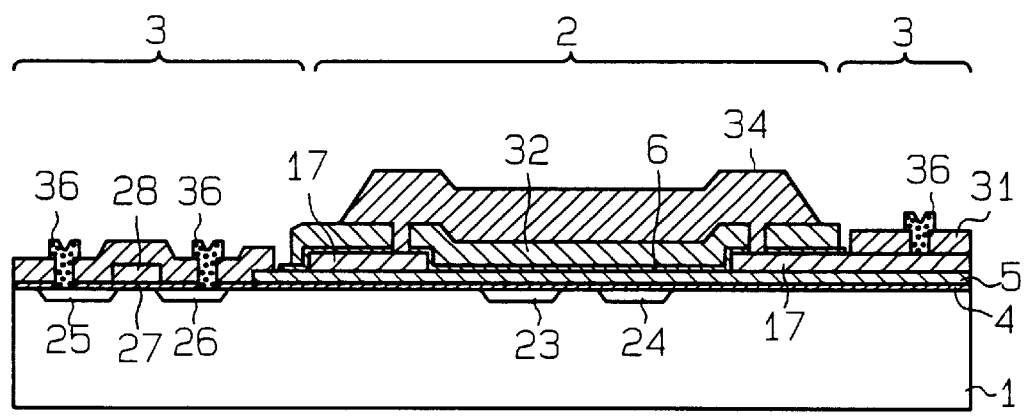

Next, as shown in FIG. 13, a film of approximately 60 nm of for example aluminum which is a metal-electrode material is formed, a photolithography process and etching process are performed, and metal wiring 36 is formed by patterning in a desired region.

Figure 14:
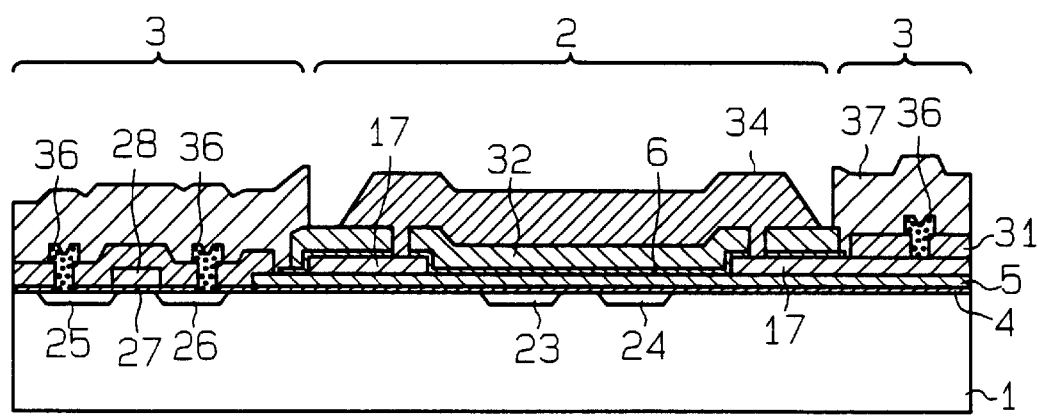

To continue, as shown in FIG. 14, a silicon-nitride film 37 of approximately 1.5 $\mu$m which is a protective film is formed on the entire surface by for example a plasma enhanced CVD process. Thereafter, the silicon-nitride film 37 on the sensor-element formation region 2 undergoes a photolithography process, and thereafter is etched away.

Figure 15:
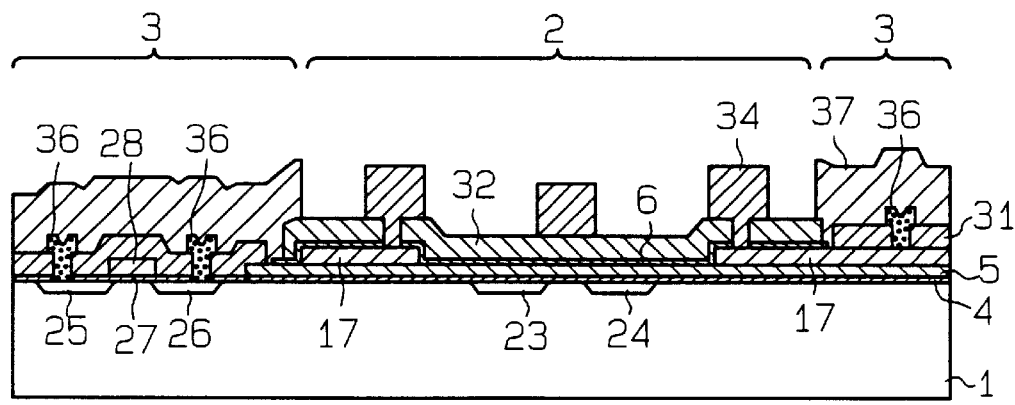

Accordingly, as shown in FIG. 15, after undergoing a photolithography process, the polycrystalline-silicon thin film 34 is etched to the desired pattern (the configuration of the movable member 7 of FIG. 1).

Figure 16:
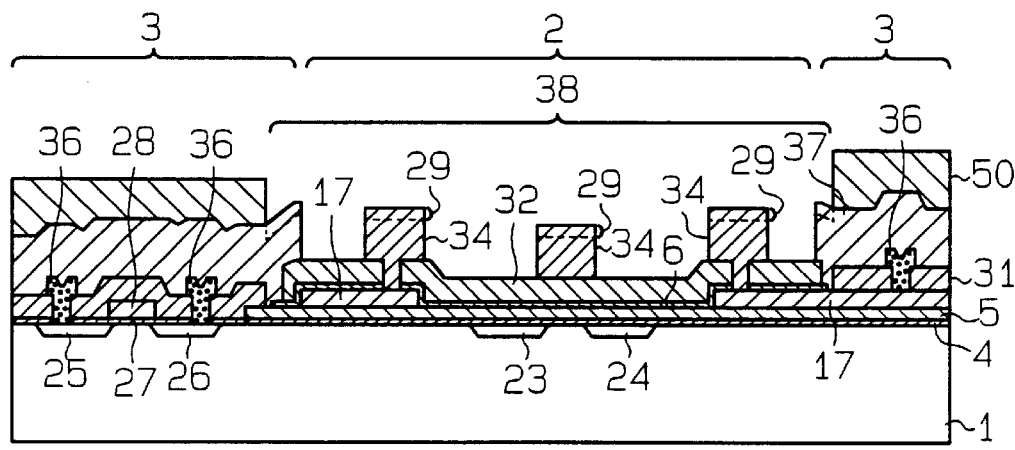

Further, as shown in FIG. 16, a suitable quantity of phosphorus (P) is ion-implanted into a surface portion of the polycrystalline-silicon thin film 34 employing a photoresist 50 which takes an opening 38 as a rough pattern. A surface-modified layer 29 is formed by this ion-implantation. Deformation of the thin-film structure body due to stress distribution existing in a film-thickness direction of the thin-film structure body after sacrificial-layer etching is adjusted by this surface-modified layer 29, and deflection is prevented. At this time, regions other than the thin-film structure body (movable-member formation region) are protected by the photoresist 50, ion-implantation is not performed for the peripheral circuit sections, pads, and the like, and there is no change in characteristics and so on of the circuitry.

Figure 17:
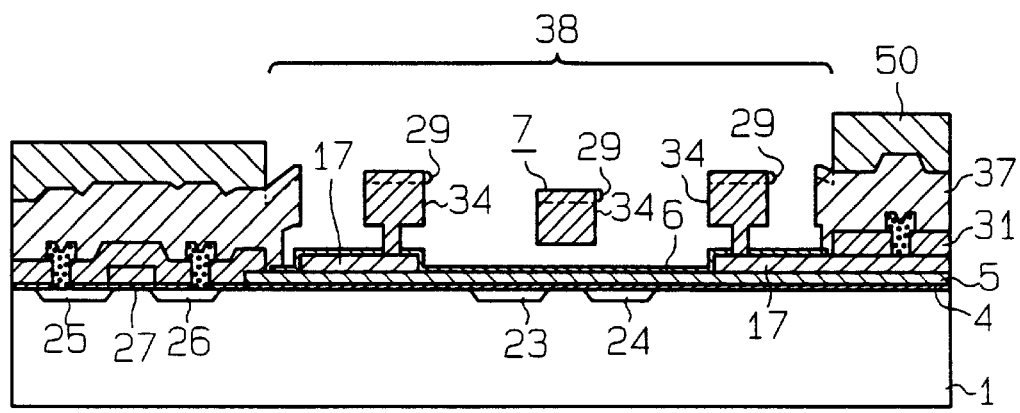

Finally, as shown in FIG. 17, the silicon-oxide film (sacrificial layer) 32 is etched by an aqueous solution of HF or the like in a state where the photoresist 50 has been allowed to remain, and the movable member 7 is disposed above the silicon substrate 1 with an air-gap interposed therebetween. At this time, the photoresist 50 can double in use as a mask during impurity introduction and sacrificial-layer etching. That is to say, need to add a new photolithography process when establishing the ion-implantation region to adjust stress is eliminated by employing the photoresist 50, which establishes the ion-implantation region, during etching of the sacrificial layer as well. Additionally, the photolithography process can be performed once in a case where the ion-implantation process and the sacrificial-layer etching process are carried out continuously, or in a case where resist etching need not be performed in two processes.

It is also acceptable to employ a thin film of silicon nitride or the like which is not etched by sacrificial-layer etching as a mask material in substitution of the photoresist 50 as the mask material.

Additionally, a step of approximately 2 $\mu$m occurs when forming the movable member 7, but if the pattern is rough, as is the opening 38, the photolithography process can be performed without problem.

In this way, a fabricating process for a MIS transistor type semiconductor acceleration sensor is completed.

A deflection-suppressing effect for the movable member 7 will be described with reference to FIG. 18 and FIG. 19.

Figure 18:
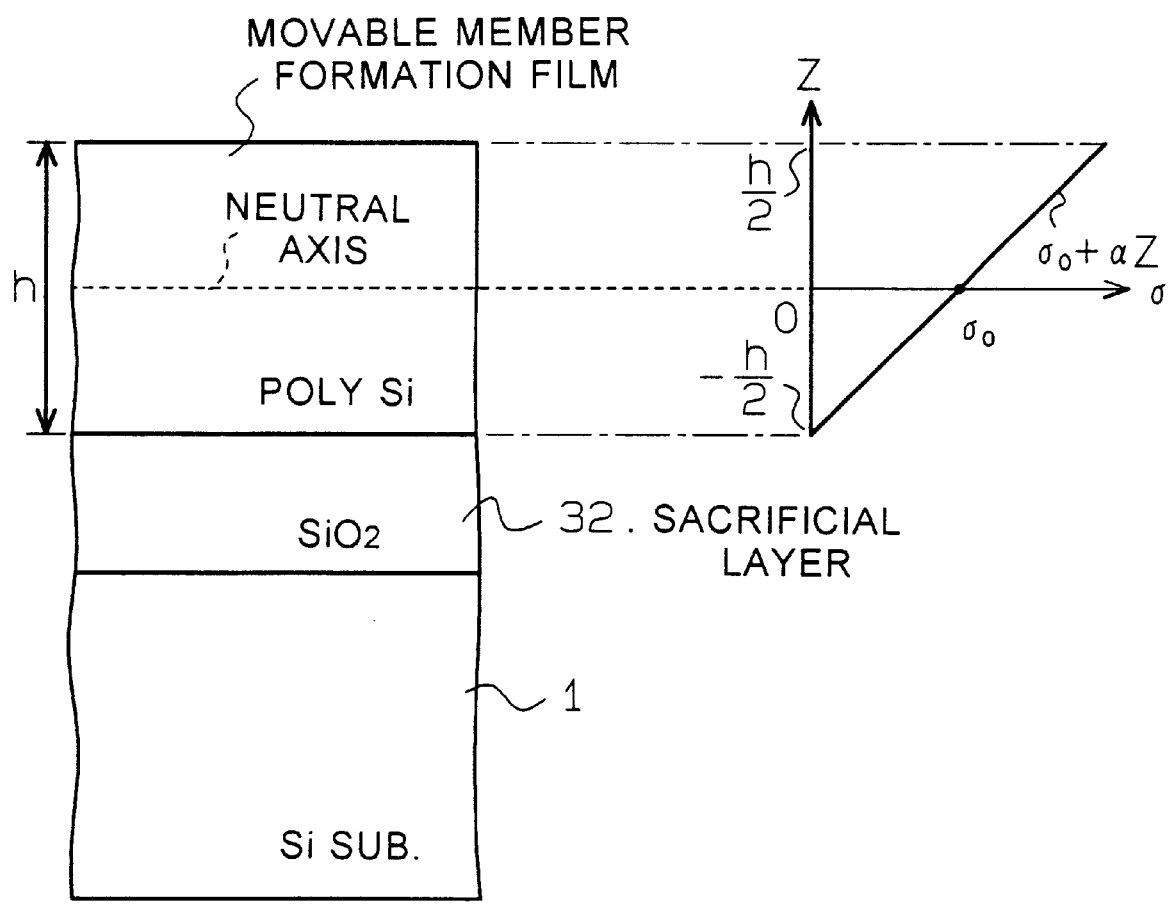
FIG. 18 is an explanatory diagram for describing a stress state of a movable member.

As shown in FIG. 18, when the polycrystalline-silicon thin film of thickness h is deposited on the silicon-oxide film 32 (sacrificial layer), a phenomenon wherein internal stress in the film-thickness direction becomes nonuniform generally occurs.

When the film-thickness direction is taken to be Z and internal stress in the film-thickness direction is taken to be $\sigma_z$, the bending moment M1 generated on the neutral axis is determined in the following manner.

$$M1 = \int_{-\frac{h}{2}}^{\frac{h}{2}} (\sigma_z Z) dZ \tag{1}$$

Additionally, beam deformation due to this bending moment M1 has a certain radius of curvature, and the radius of curvature R1 at that time is determined in the following manner.

$$R1 = \frac{EI_Z}{M1} \tag{2}$$

Herein, $I_Z = \frac{1}{12} h^3$

However, E is Young's modulus for the polycrystalline-silicon thin film (movable member), and $I_z$ is the sectional quadratic moment.

In this way, in a case where stress in the film-thickness direction is distributed nonuniformly, the thin-film structure body (beam) is deformed from the originally designed value. Additionally, wafers (within a lot) which have been processed simultaneously generally exhibit little variation between wafers, but wafers (between lots) which have not been processed simultaneously exhibit great variation between wafers.

In this regard, according to the present embodiment, deformation of the thin-film structure body is suppressed by inserting in the fabrication steps an adjusting process to suppress between-lot variation in deformation due to stress distribution existing in a film-thickness direction of the thin-film structure body. That is to say, in order to cause the configuration of the thin-film structure body to approach the originally designed value, as the adjusting process is inserted performing ion-implantation for the thin film which forms the thin-film structure body to modify the surface state of the thin-film structure body.

Figure 39:
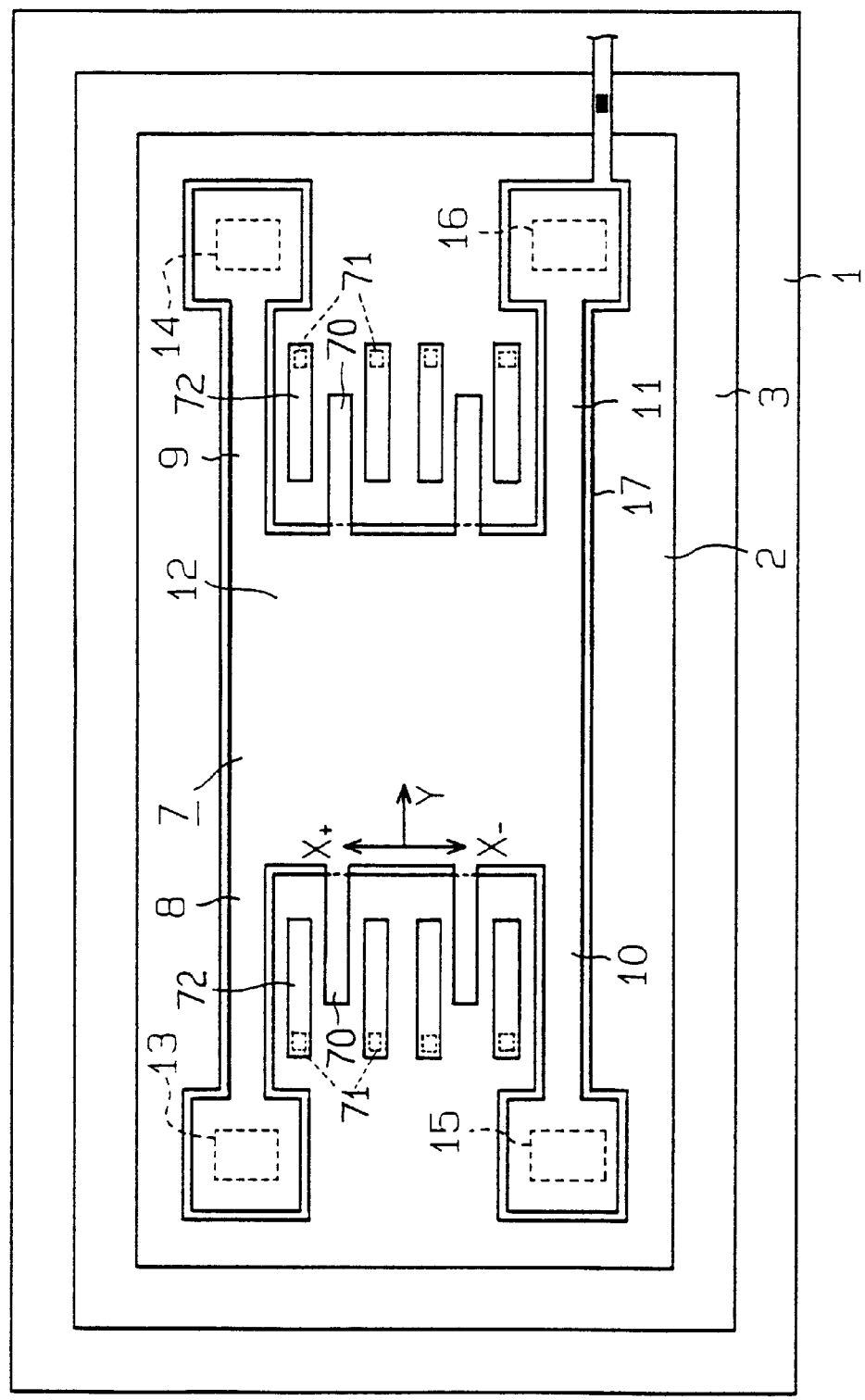
FIG. 39 is a plan view of a semiconductor acceleration sensor according to an application of the first embodiment.

In the sensor of FIG. 1, the movable gate electrode sections 19 and 20 and the movable electrode portions 70 and fixed electrode 72 which are the displacement-detecting portions of a cantilever structure may be raised as a portion wherein a large effect due to the present invention, i.e., a portion wherein deformation is suppressed. Additionally, as is indicated in FIG. 39, application is similarly possible in a movable electrode 70 or the like of a capacitance-detecting type acceleration sensor having no transistor-type detecting portion.

Figure 19:
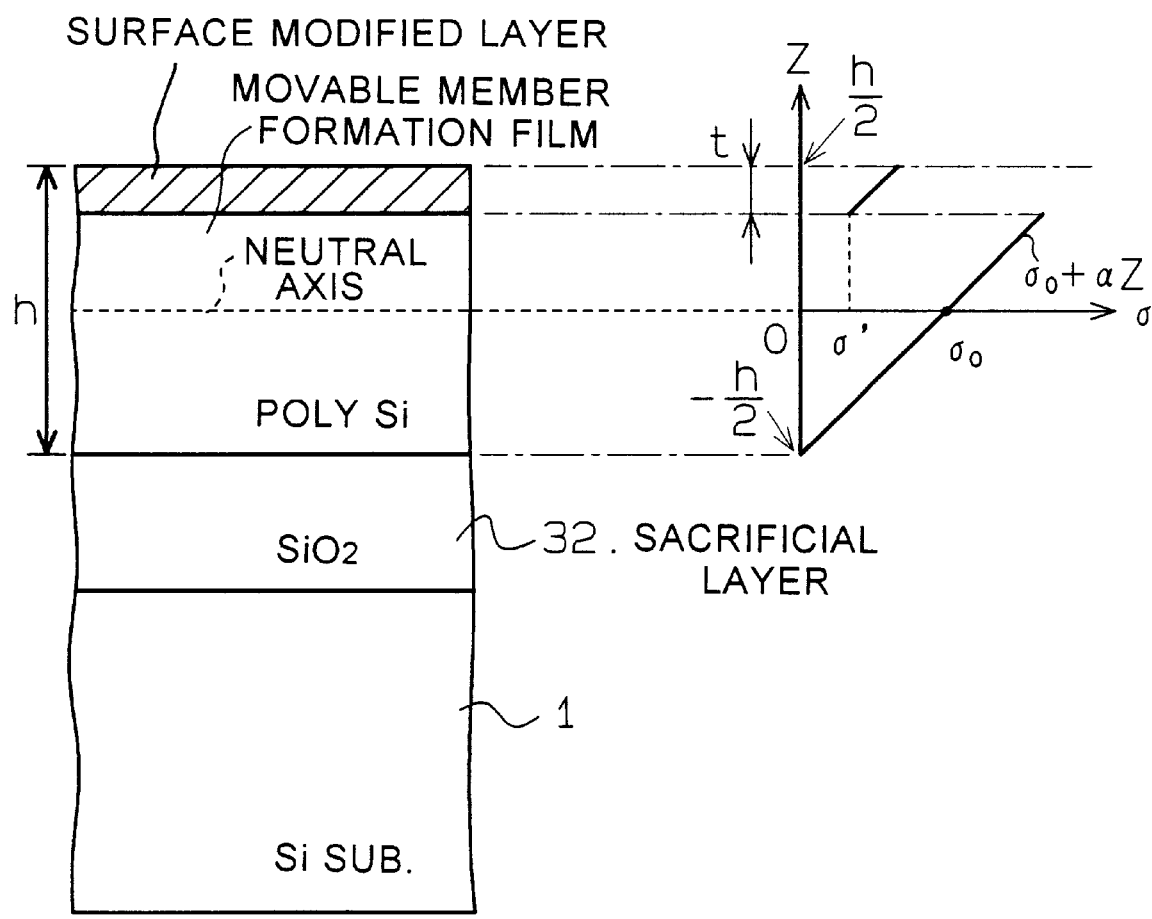
FIG. 19 is an explanatory diagram for describing a stress state of a movable member.

That is to say, the nature of the film can be changed for only a thickness t from the surface and local stress distribution proximately to the surface can be changed, as shown in FIG. 19. Accordingly, as shown in FIG. 19, a bending moment occurring at the neutral axis of the thin-film structure body can to be reduced by causing stress at the surface to approach the value on the neutral-axis side.

Figure 40:
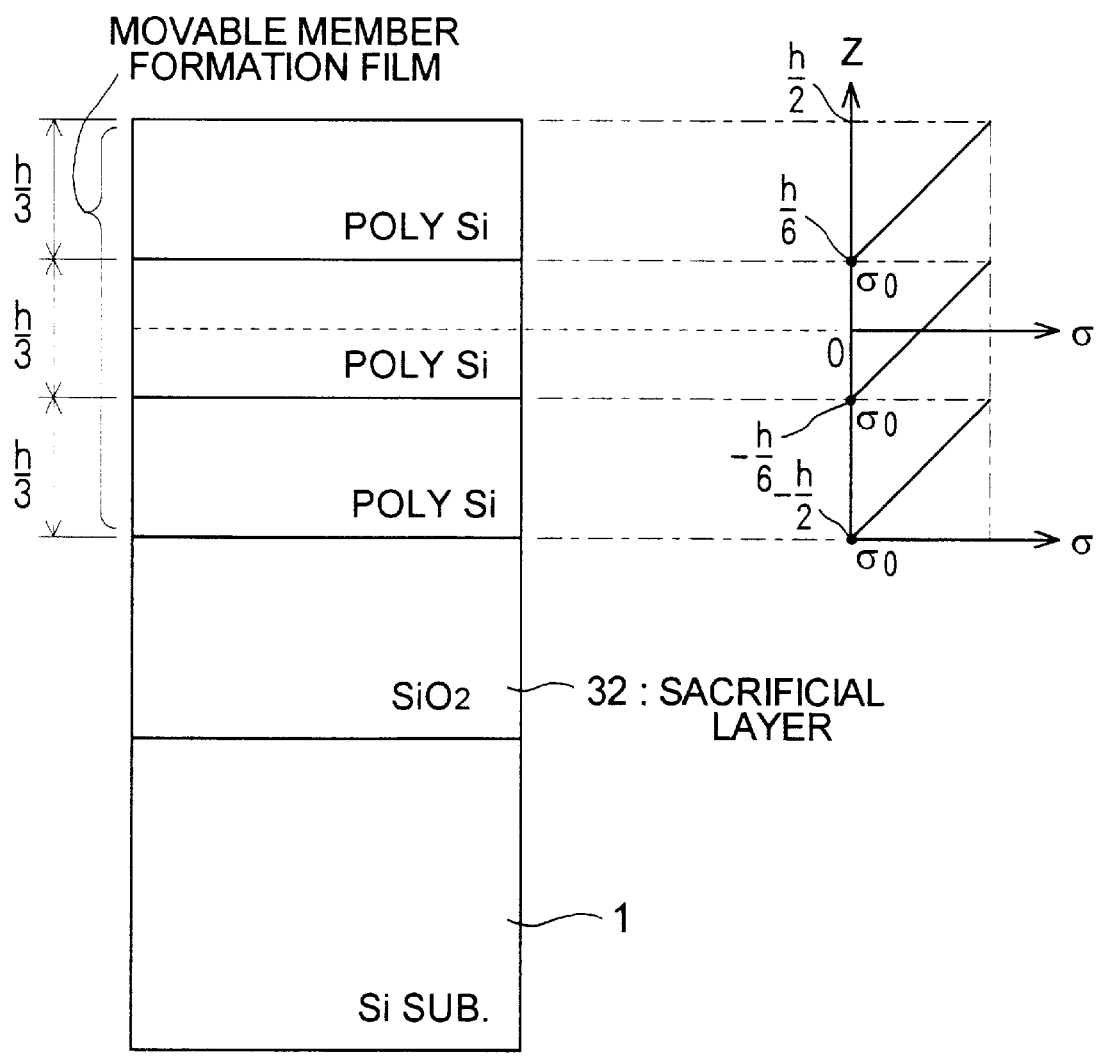
FIG. 40 is an explanatory diagram for describing a stress state of a movable member.
Figure 41:
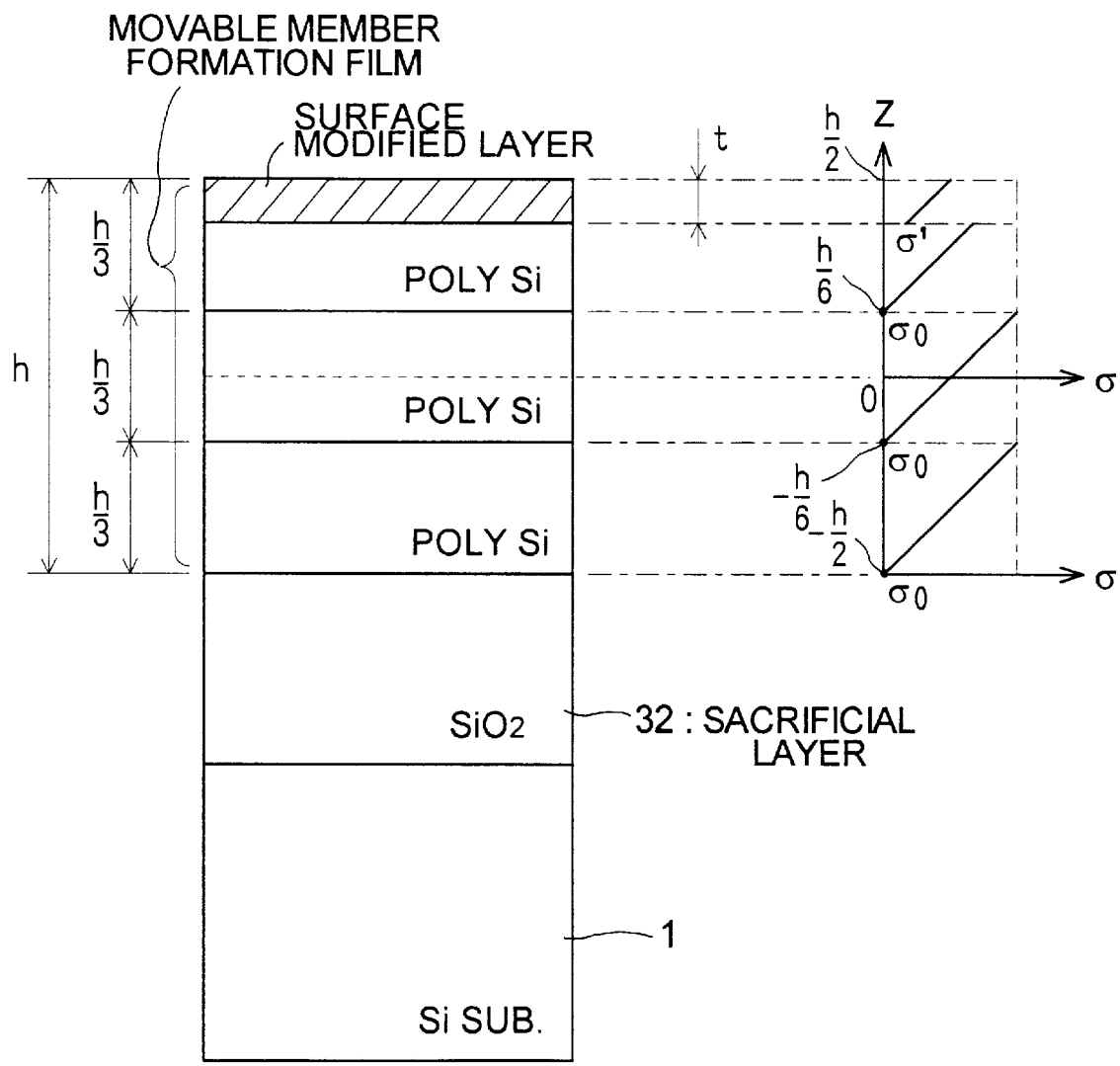
FIG. 41 is an explanatory diagram for describing a stress state of a movable member.

Additionally, according to the present embodiment, a method for reducing a bending moment of a polycrystalline-silicon thin film of a single-layer structure was described. But even in a case where a polycrystalline-silicon film, which becomes a thin-film structure body, is formed separatedly as shown in FIG. 40, if nature of the film is changed for only a thickness t from the surface and local stress distribution proximately to the surface is changed as shown in FIG. 41, a bending moment occurring at the neutral axis of the thin-film structure body can be reduced by causing stress at the surface to approach the value on the neutral-axis side.

Next, a process for adjusting stress distribution existing in the film-thickness direction of this thin-film structure body, including lot organization for wafers, will be described in greater detail.

Figure 20:
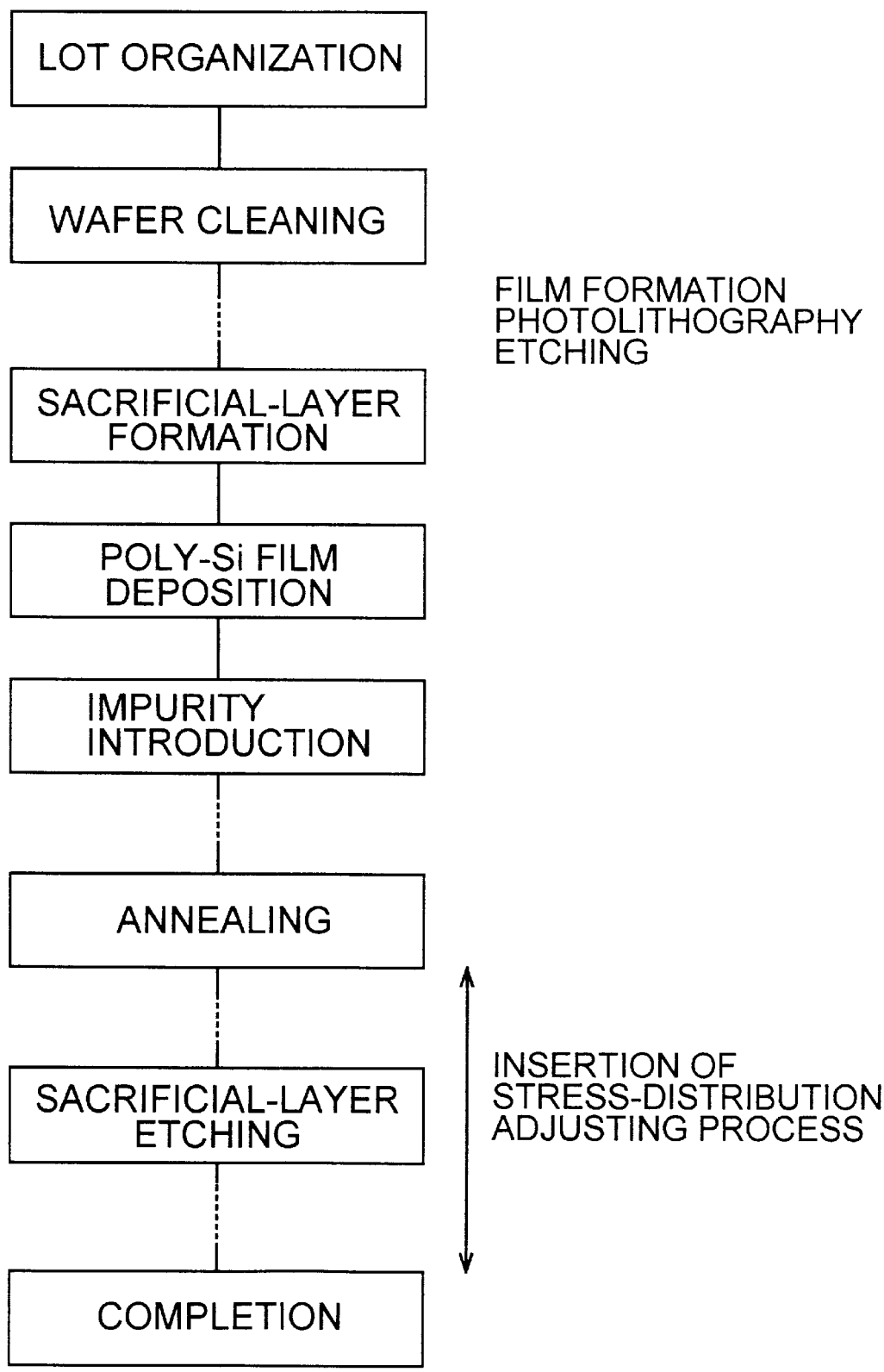
FIG. 20 is a diagram for describing process flow for a thin-film structure body.

As shown in FIG. 20, first, lot organization and wafer cleaning is performed. Film forming, photolithography, and etching are repeated a number of times before the polycrystalline-silicon thin film which becomes the movable member is formed. Then, after the sacrificial layer is formed, deposition of the polycrystalline-silicon thin film on the sacrificial layer is performed, and in continuation, introduction of the impurity (phosphorus) in the polycrystalline-silicon thin film is performed. Accordingly, film forming, photolithography, etching, and annealing for activating the impurity are performed a number of times. Thereafter, sacrificial-layer etching is performed and the movable member comprising the polycrystalline-silicon thin film is suspendedly separated from the substrate, and processing is completed.

It is preferred that the process for adjusting stress distribution (impurity introduction) be performed after forming of the polycrystalline-silicon thin film, and moreover, in the interval after the process in which temperature is highest and until sacrificial-layer etching. That is to say, in a case where annealing is performed at an excessively high temperature, even when the surface of the polycrystalline-silicon thin film has been modified by ion-implantation, there may be cases where the layer in which the impurity was introduced changes and the surface-modification effect is caused to be reduced or lost. However, the step for adjusting stress can be carried out most effectively by performing the step for adjusting stress after a maximum-temperature step followed by the deposition of the polycrystalline-silicon thin film 34 (i.e., by performing the step for adjusting stress subsequently to the maximum-temperature process which substantially determines stress remaining in the thin film).

Additionally, when the step for adjusting stress distribution is performed after the sacrificial-layer etching, the channel region fabricated in the silicon substrate 1 is exposed by the sacrificial-layer etching and impurity would be introduced into the exposed channel region, and so this is avoided. Additionally, the existence of the silicon-oxide film 32 (sacrificial layer) can prevent an adverse effect on the wiring located below the silicon-oxide film 32 and occurrence of defects on the silicon substrate. Moreover, damage to the thin-film structure body (polycrystalline-silicon thin film) which occurs in a case where ion-implantation is performed subsequently to the sacrificial-layer etching can be prevented. In other words, care required in the handling of the thin-film structure body (polycrystalline-silicon thin film) can be avoided.

In this way, it is preferred that the step for adjusting stress distribution be performed priorly to sacrificial-layer etching, but it is also acceptable to perform the step for adjusting stress distribution subsequently to the sacrificial-layer etching in a case where a step which can avoid an influence on the source and drain electrodes 21 through 24 is considered. That is to say, in a case where the channel region is covered with a film which is not etched during etching, or in a case where the channel region exists in a location in which the impurity is not directly introduced, for example in a location which is hidden by a thin-film structure or the like, it is acceptable to perform the step for adjusting stress distribution subsequently to the sacrificial-layer etching. In this case, the amount of deformation of the thin-film structure body (movable member) subsequently to the sacrificial-layer etching can be observed, and the degree of surface treatment (i.e., the degree of stress-distribution adjustment) of the thin-film structure body can be determined. By using this method, fabrication fluctuations in the amount of deformation of the thin-film structure body can be adjusted. When the step for adjusting stress distribution (i.e., ion-implantation) is carried out subsequently to the step for etching the sacrificial layer in this way, methods and conditions for the step for adjusting stress distribution can accurately be established by measuring the configuration of the thin film due to stress occurring subsequently to the sacrificial-layer etching.

Additionally, in a case where the impurity is introduced to the thin film simultaneously with forming the polycrystalline-silicon thin film (thin-film structure body), there may be cases where the film-forming temperature becomes the maximum temperature of the process step for adjusting stress distribution, in this case is after the step for forming the polycrystalline-silicon thin film.

Furthermore, as stated above, there may be cases where the surface-modification effect on the polycrystalline-silicon thin film is reduced by annealing, but in a case where the sensor comprising this thin film is used in a high-temperature atmosphere, there may be cases where configuration at high temperature changes with respect to configuration at room temperature. To avoid this, it is preferred that aging be performed at a temperature which is somewhat higher than the maximum temperature of the usage temperature range. The surface-modification effect is reduced somewhat by performing this aging. But by initially performing surface modification (i.e., ion-implantation) corresponding to an amount of reduction, the across-time change in the configuration of the movable member can be suppressed. Additionally, this annealing (aging) can be performed to double as sintering (for approximately 10 minutes at 450° C.) subsequent to installing control circuitry and the like within the same wafer as the thin-film structure body. However, this temperature or lower is preferred because a metal electrode is damaged at a temperature exceeding 450° C. That is to say, in a case where metal wiring exists, annealing is performed at the metal-wiring sintering temperature or lower to prevent migration of the metal.

According to the present embodiment, the silicon-oxide film 32 (sacrificial layer) is formed on the silicon substrate 1, the polycrystalline-silicon thin film 34 is formed on the silicon-oxide film 32, and thereafter, P (phosphorus) is ion-implanted as a stress-adjusting substance for this polycrystalline-silicon thin film 34, modifying the surface state of the thin film, changing a portion of distribution of stress existing in the thickness direction of the thin film, and adjusting the stress distribution so as to reduce deflection. Accordingly, when long-term, high-temperature heat treatment (for example 24 hours at 1,150° C.) is performed for the thin-film structure body, transistors and the like which make up peripheral circuitry are damaged. According to the present embodiment, deflection can easily be prevented without performing long-term, high-temperature heat treatment (without damaging transistors in peripheral circuitry).

Additionally, when the above-mentioned long-term, high-temperature heat treatment (for example 24 hours at 1,150° C.) is attempted, processing wafers under identical conditions (within a lot) is difficult and variation in the amount of deflection of the thin-film structure body occurs in wafers (between lots) unless processing under identical conditions is performed. In contrast, according to the present embodiment, ion-implantation is performed and the surface state is modified, between-lot variation in deformation due to distribution of stress existing in the film-thickness direction of the thin-film structure body can be suppressed. In this way, stress or variation in stress within the thin-film structure body generated by variation or the like in the fabrication process can be adjusted, and configuration of the thin-film structure body can be controlled.

Second Embodiment

Next, a second embodiment will be described mainly on points of difference from the first embodiment.

According to the present embodiment, the above-described ion-implantation is performed solely in a partial region (particular region) of a thin-film structure body. That is to say, ion-implantation (introduction of an impurity) for reduction of amount of deformation need not be performed for the entire thin-film structure body, but may acceptably be partially introduced only in a location where correction of deformation is desired, and a condition for impurity introduction may also acceptable be partially changed.

The present embodiment will be described in detail hereinafter.

In a case of a doubly supported beam structure, the doubly supported beam section is pulled from both sides, and so deformation is difficult even when stress distribution exists in the film-thickness direction, as shown in FIG. 18. However, a movable member 7 is pulled in an extension (the Y direction in FIG. 1) of a beam of a doubly supported beam but is not pulled in the X direction). For this reason, deformation due to distribution of stress existing in the film-thickness direction occurs even when restrained in this way.

Figure 21:
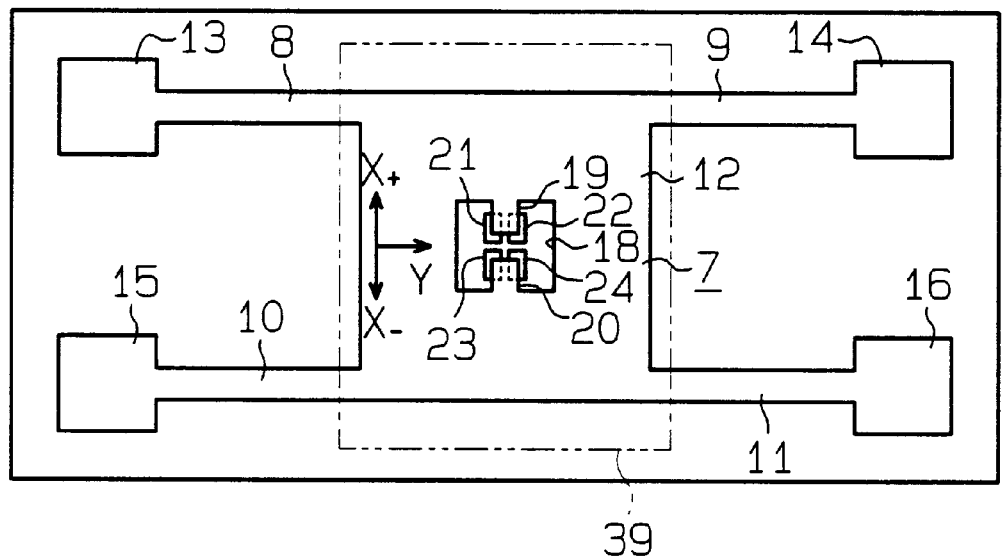
FIG. 21 and FIG. 22 are plan views for describing important steps for fabricating a semiconductor acceleration sensor according to a second embodiment.

In this regard, in FIG. 21 a region indicated by the reference numeral 39 is caused to be a stress-distribution adjusting region by surface modification, and surface-modification processing (ion-implantation) utilizing a photolithography process is performed for this region (a forming region for a weight section 12) 39. Here, the region 39 corresponds to an opening of the mask for the ion-implantation. Because of this, damage to peripheral elements can be suppressed to a minimum by performed modification processing in only a minimum required location.

Figure 22:
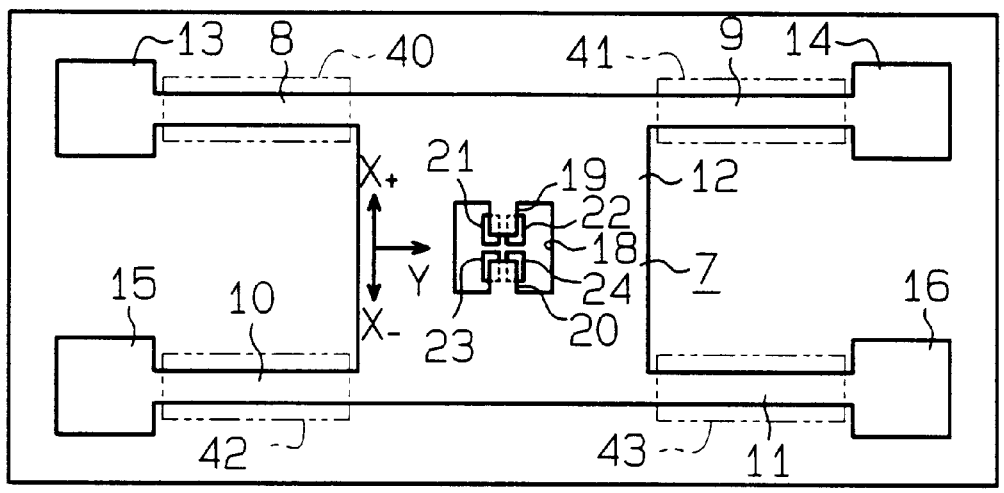

Furthermore, according to the present embodiment, another ion-implantation is also performed for regions (forming regions for beam sections 8, 9, 10 and 11) 40, 41, 42 and 43 indicated in FIG. 22, and sensitivity adjustment of the acceleration sensor is performed. That is to say, in addition to suppression of deformation by adjustment of distribution of stress existing in the film-thickness direction, sensitivity adjustment for the sensor is also performed. Sensitivity of the acceleration sensor indicated in FIG. 22 is determined by a spring coefficient k in this system of X and Y directions (directions parallel to the surface of the substrate). The spring coefficient k is determined by spring coefficient k1 determined by dimensions of the doubly supported beam structure and by apparent spring coefficient k2 determined by the stress σ of the thin-film structure body making up the beams.

$$k = k1 + k2 \quad (3)$$

$$k1 = \frac{4Eb^3h}{L^3} \quad (4)$$

$$k2 = \frac{4\sigma bh}{L} \quad (5)$$

wherein E is Young's modulus, b is a beam width, h is a beam thickness, and L is a beam length.

Herein, apparent spring coefficient k2 becomes large in a beam where tensile stress is strong, and so sensor sensitivity is reduced. In a case such as this, the spring coefficient due to stress can be lowered and sensitivity of the sensor can be raised by employing photolithography technology in a portion of the beam to open the regions 40, 41, 42 and 43, performing surface modification (ion-implantation) only in these openings, and adjusting stress, as shown in FIG. 22.

In this way, according to the present embodiment, stress existing in the thin film is adjusted only in a particular position, and so varying the stress of the thin film by position becomes possible and control of a plurality of configurations and spring-coefficient control can be performed within the thin film. That is to say, varying the stress of the thin film by position becomes possible and control of a plurality of configurations and spring-coefficient control can be performed within the thin film by carrying out ion-implantation in the thin film in a particular portion of the thin film or by changing a condition of ion-implantation according to the position.

Third Embodiment

Next, a third embodiment will be described mainly on points of difference from the first embodiment.

According to the present embodiment, surface-modification processing (ion-implantation) is performed in a state where a cantilever comprising a polycrystalline-silicon thin film has been deflected upwardly subsequently to performing sacrificial-layer etching, and deflection is adjusted.

Figure 23:
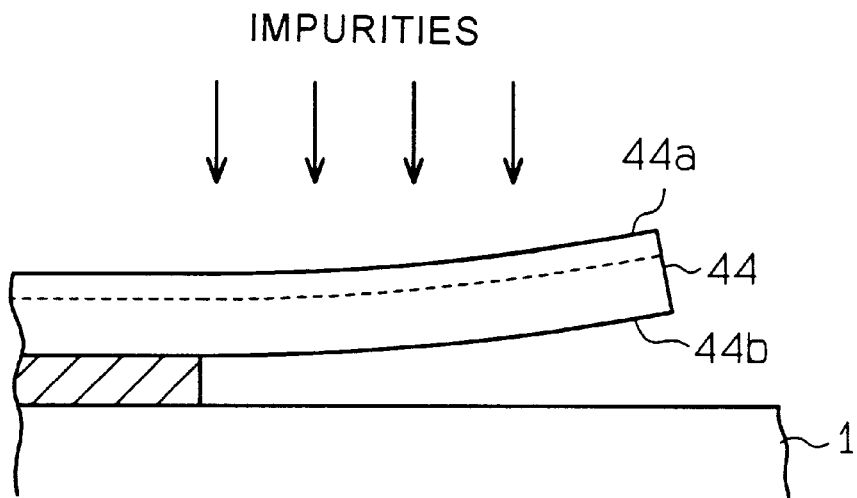
FIG. 23 and FIG. 24 are schematic views for describing the operation of a third embodiment.
Figure 24:
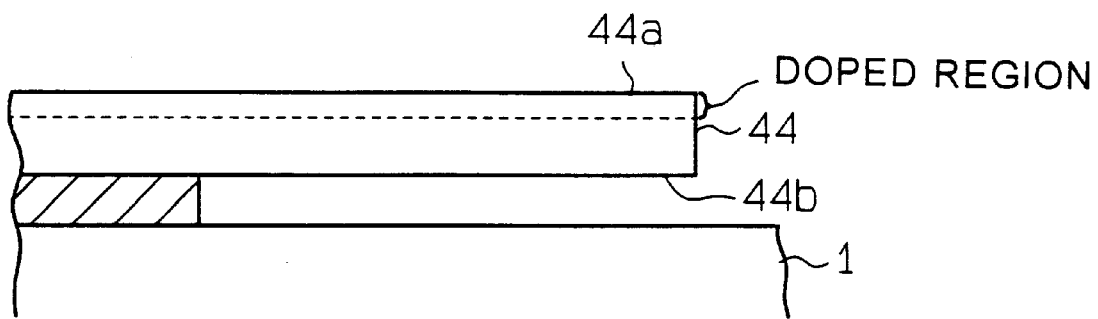

Firstly, a mechanism of reduction of amount of deformation employing an ion-implantation method will be described with reference to FIG. 23 and FIG. 24.

In a case where a cantilever 44 comprising a polycrystalline-silicon thin film is deformed toward an upward direction, tensile stress exists in an upper surface 44a of the cantilever 44, and compressive stress exists in a lower surface 44b of the cantilever 44. As a result of this, the cantilever 44 is deflected upwardly.

With respect to this, it is sufficient to weaken the tensile stress of the upper surface 44a of the cantilever 44 in order to cause the cantilever 44 to be straight. In this regard, impurities are introduced into the upper surface 44a of the cantilever 44 by an impurity-introducing method. Density (impurity concentration) of the upper surface 44a increases due to this introduction of impurity and distance between the atoms of the upper surface becomes narrower compared with before introduction, and so the tensile stress becomes weaker, and as a result thereof, the cantilever 44 which was upwardly deflected becomes straight as shown in FIG. 24. In this way, a method due to ion-implantation from above the substrate causes atomic density of the upper portion of the film to be raised, and so effectiveness exists in a case where compression of stress of the upper side of the thin film is weak (i.e., tensile stress is strong) in comparison with stress of the lower side.

Additionally, even in a case where a stress-distribution adjustment method can deform deflection of the cantilever only in a downward direction by adjusting deflection by surface modification of the thin film subsequently to the portion which becomes the cantilever of the thin-film structure body being formed so as to be deflected upwardly from a normal configuration, the step for adjusting stress can obtain the normal configuration by acting so that the deflection is constantly deflected upwardly from the normal configuration.

Figure 25:
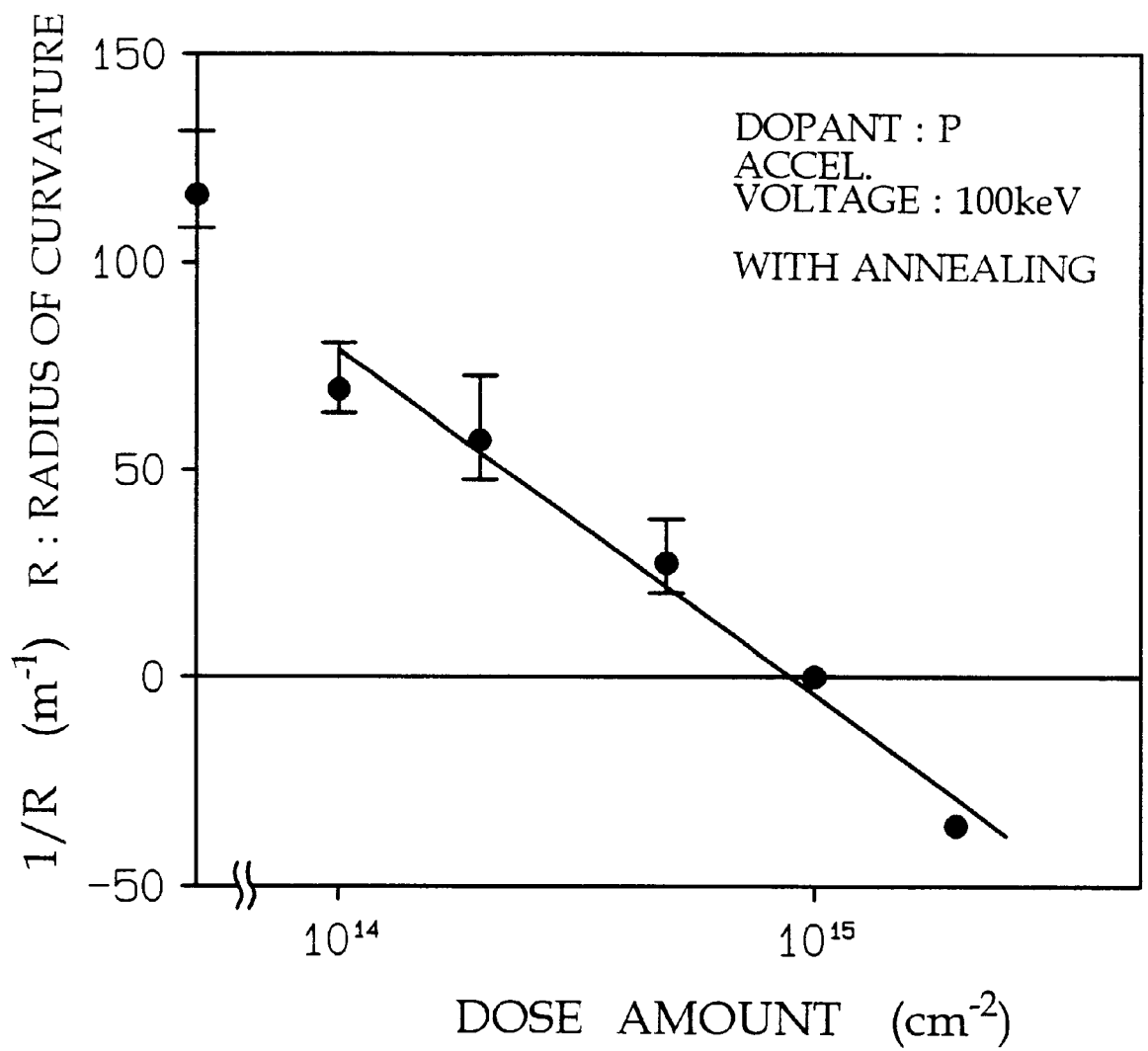
FIG. 25 is a graph showing the relationship between dosage and amount of deformation.
Figure 26:
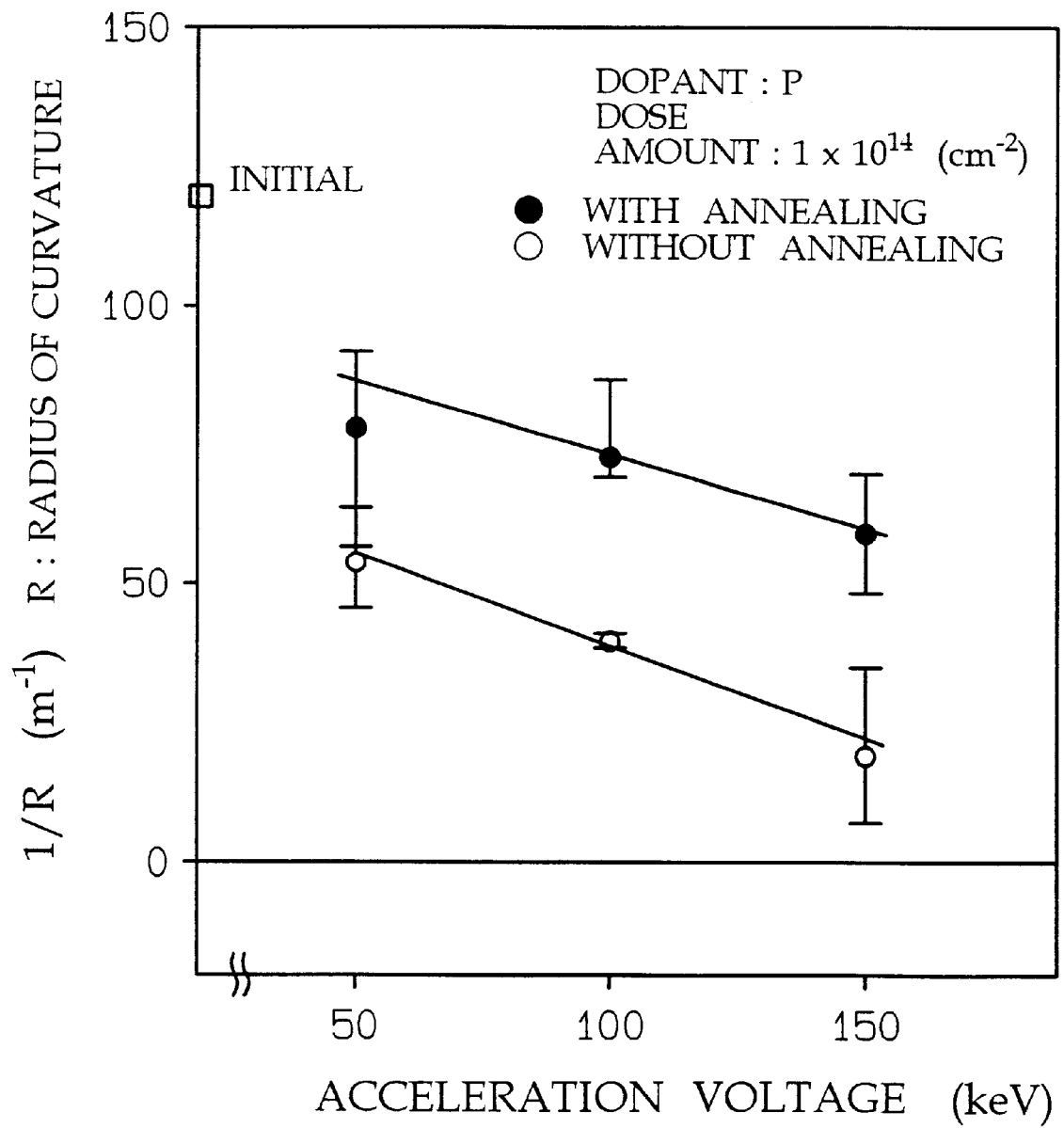
FIG. 26 is a graph showing the relationship between acceleration voltage and amount of deformation.

Next, experimental results for confirming an effect of reduction of deflection of a movable member are indicated in FIG. 25 and FIG. 26.

A relationship between impurity dosage and amount of deformation of a thin-film structure body (beam) is indicated in FIG. 25. Herein, amount of deformation is inversely proportional to radius of curvature R, and so 1/R is taken for the vertical axis, and the larger is R, that is, the smaller is 1/R, the smaller is the amount of deformation. Additionally, the cantilever deforms upwardly with respect to the surface of the substrate in case 1/R is a positive value, and deforms downwardly when 1/R is a negative value. It is understood from FIG. 25 that the larger is the impurity dosage, the smaller is 1/R and the greater is the effect of reduction of deflection. In order to suppress deformation, it is preferred that the dose amount be approximately b $10^{13}/cm^2$ to $10^{16}/cm^2$.

A relationship between acceleration voltage (acceleration energy in ion-implantation) and amount of deformation of a thin-film structure body (beam) is indicated in FIG. 26.

Herein, it is understood that if the dosage is the same, the higher is the acceleration voltage (than 50 keV), the smaller is 1/R and the greater is the effect of reduction of deflection. This is because when acceleration voltage is caused to be high, thickness of the impurity-introduction layer (doped region in FIG. 24) is increased and the effect of reduction of deflection is increased. To suppress deformation of the thin-film structure body (beam) in this way, it is preferred that the acceleration voltage of impurity introduction be caused to be approximately 50 keV or more.

In the embodiment, phosphorus (P) was ion-implanted in the polycrystalline-silicon thin film which becomes the thin-film structure body, but it is preferred that if the thin film is of p-type conductivity, impurity-implantation of ions which present the same p-type be performed, and if the thin film is of n-type conductivity, impurity-implantation of ions which present the same n-type be performed. It is also acceptable to introduce ions of atoms which make up the thin-film structure body or ions of inert atoms which do not exhibit electrical characteristics. By doing this, effects to the thin film due to the ion-implanted ions, such as a reduction of conductivity or the like, can be kept to a minimum.

In this way, according to the present embodiment, the portion which becomes the thin-film structure body is formed so as to be deflected upwardly from the normal configuration, and caused deflection is adjusted by ion-implantation, and so variation in stress occurring in a fabrication process can be adjusted and configuration of the thin film can be controlled to a normal configuration with a simple method by ion-implantation utilized in an IC-fabrication process.

Fourth Embodiment

Next, a fourth embodiment will be described mainly on points of difference from the third embodiment.

According to the foregoing third embodiment, a case where a cantilever is initially deformed upwardly was described, but according to the present embodiment, a case where a cantilever is initially deformed downwardly will be described.

The cantilever deformed downwardly is such that an upper surface of the cantilever has compressive stress and a lower surface of the cantilever has tensile stress. In this case, the amount of deformation can be reduced when impurities are introduced into the beam lower surface to raise the density (impurity concentration) of the lower surface and weaken the tensile stress of the lower surface.

Figure 27:
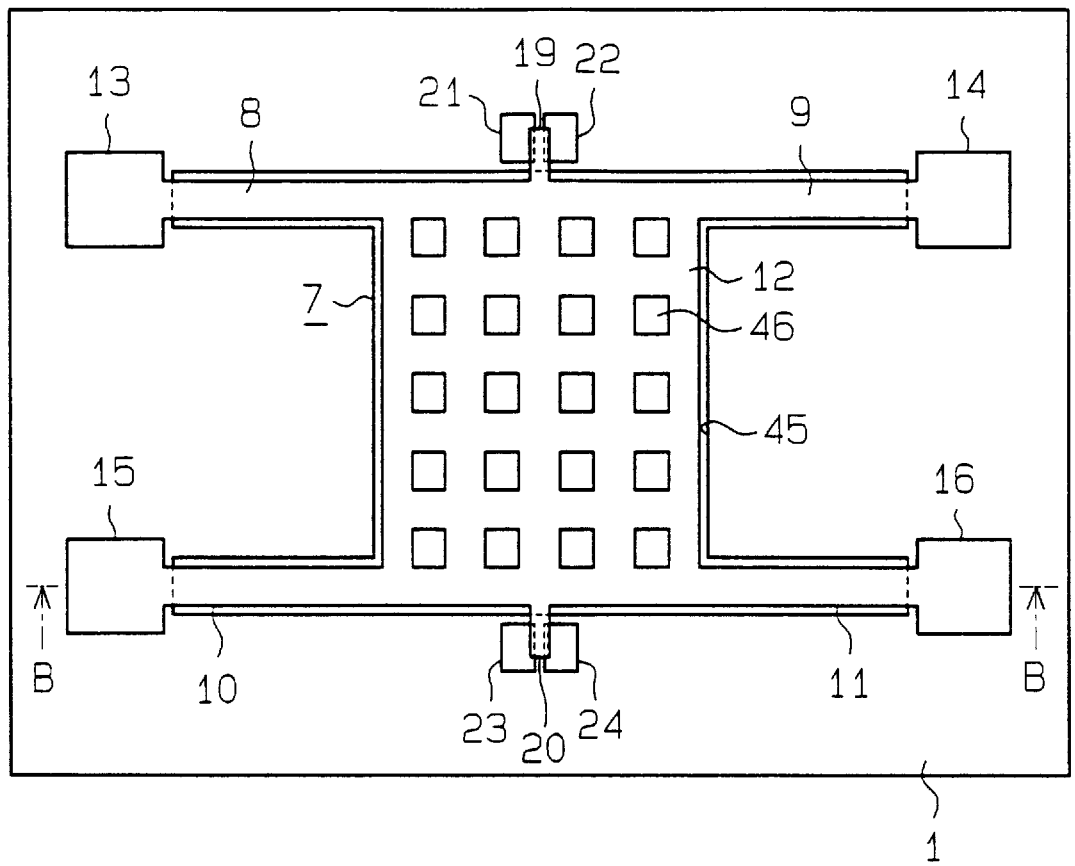
FIG. 27 is a plan view of a semiconductor acceleration sensor according to a fourth embodiment.
Figure 28:
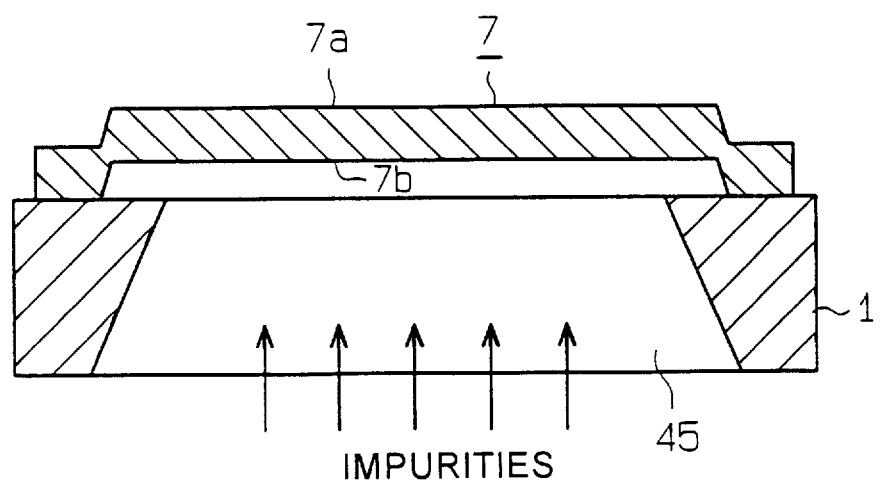
FIG. 28 is a sectional view taken along line B—B of FIG. 27.

FIG. 27 is a plan view of a movable-gate type acceleration sensor, and FIG. 28 is a sectional view taken along line B—B of FIG. 27.

Beam sections 8 through 11 and a weight section 12, which make up a movable member, are fixed to a silicon substrate 1 by anchor sections 13 through 16. A hole 45 which passes through vertically is provided on the silicon substrate 1 under the beam sections 8 through 11 and the weight section 12. The hole 45 is formed by etching the silicon substrate 1 from the lower-surface side utilizing an alkaline liquid. Tensile stress exists on a lower surface 7b of a thin-film structure body (movable member 7) and compressive stress exists on an upper surface 7a, and so ions (i.e., impurities) are introduced selectively to the lower surface 7b of the movable member 7 from the hole 45. The tensile stress of the lower surface 7b is weakened by this, and the amount of deformation of the thin-film structure body can be reduced.

Further, in FIG. 27 and FIG. 28 the hole 45 was provided on the silicon substrate to open onto both the beam sections 8 through 11 and the weight section 12, but opening onto the weight section 12 alone is acceptable, and opening onto the beam sections 8 through 11 alone is also acceptable.

Additionally, reference numeral 46 in FIG. 27 is a via hole provided on the weight section 12 to facilitate penetration of etching solution during sacrificial-layer etching. Further, the sacrificial-layer etching may be performed from the lower side of the substrate through the hole 45. The sensor indicated in FIG. 27 has a structure wherein movable gate electrode sections 19 and 20 are disposed on the weight section 12 in mutually separated directions from the side walls.

Fifth Embodiment

Next, a fifth embodiment will be described mainly on points of difference from the first embodiment.

According to the present embodiment, adjustment of stress distribution of a thin film is performed by performing modification of a surface with a method which substitutes for ion-implantation.

Figure 29:
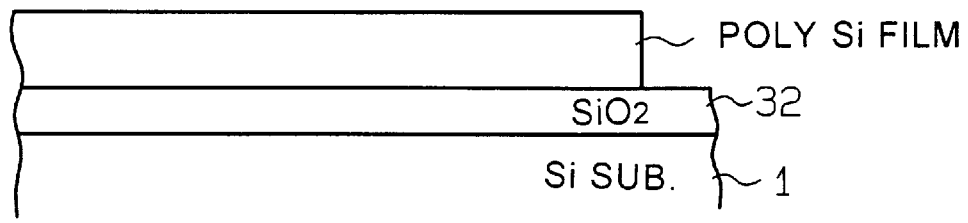
FIG. 29 through FIG. 32 are schematic views for describing the operation of a fifth embodiment.
Figure 30:

FIG. 29 indicates a thin-film structure body (cantilever beam structure) priorly to sacrificial-layer etching. In a cantilever beam structure such as this, in a case where compressive stress of a lower side of the thin film is weak and compressive stress of an upper side of the thin film is strong, conversely to the case of FIG. 18, the thin-film structure body is deformed downwardly with a radius of curvature when sacrificial-layer etching is performed as in FIG. 30. In this case, the thin-film surface is partially etched by a chemical liquid as a method of surface modification for adjusting distribution of stress existing in the film-thickness direction.

A case where the thin-film structure body is of polycrystalline silicon will be described in detail hereinafter.

Figure 31:
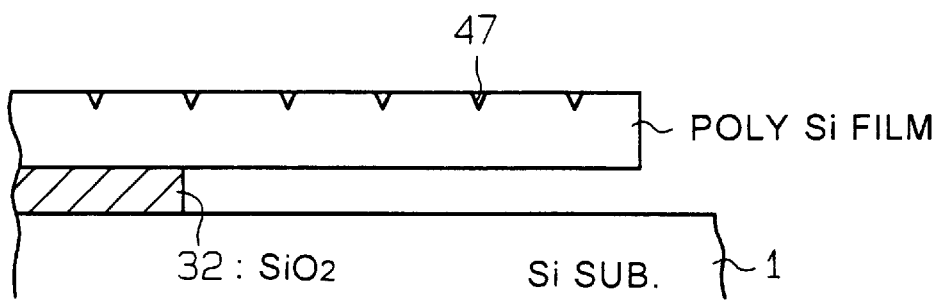

As shown in FIG. 31, although etching of the polycrystalline silicon is generally performed utilizing an alkaline chemical, in processing for surface modification, a chemical liquid which selectively etches the crystal grain boundary of the polycrystalline silicon surface is employed to form a concavity 47. In specific terms, a mixed solution of hydrofluoric acid and potassium dichromate is utilized to etch only a defect of monocrystalline silicon, or a mixed liquid of hydrofluoric acid and nitric acid is utilized to selectively etch a portion of high impurity concentration.

That is to say, it is known that when a polycrystalline silicon film is formed and an impurity is introduced, the impurity is segregated proximately to the crystal grain boundary. Utilizing this property of polycrystalline silicon, crystal defects are selectively etched when the former liquid (mixed solution of hydrofluoric acid and potassium dichromate) is employed, and the crystal grain boundary portion where impurity concentration is high is etched when the latter liquid (mixed liquid of hydrofluoric acid and nitric acid) is employed.

In this way, when sacrificial-layer etching is performed from the state indicated in FIG. 29, the apparent compressive stress of the surface portion is reduced as shown in FIG. 31, or the atomic density of the surface is decreased and a portion of strong compressive stress is reduced, and downward deformation of the thin-film structure body can be adjusted (suppressed). Because this method to surface-treat the upper surface of the thin-film structure body by chemical liquid exhibits an effect for eliminating apparent stress of the upper surface or for lowering surface density, there is effectiveness in a case where stress of the upper side of the thin-film structure body has stronger compression (i.e., weaker tensility) than stress of the lower side.

Figure 32:
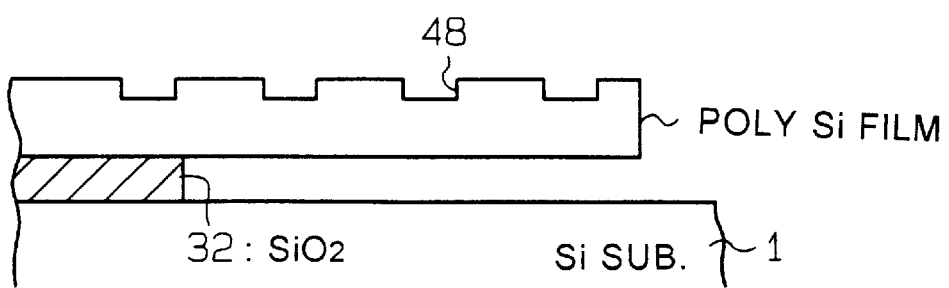

As a sample application of the present embodiment, downward deformation of a thin-film structure body can be adjusted and suppressed by removing a portion where compressive stress existing in the surface of the thin film is strong by performing patterning utilizing photolithography on the surface of the thin-film structure body as shown in FIG. 32 and performing wet or dry etching to create unevenness (indicated by 48 in FIG. 32) on the thin-film surface.

In the above embodiments, an ion-implantation method and etching (local etching) by a chemical liquid were given as a surface-modifying procedure as a method for adjusting distribution of stress existing in the film-thickness direction of the above-described thin-film structure body, but it is also acceptable to perform film deposition of a heterogenous or homogenous film by CVD or PVD as another surface-modifying procedure (cap layer formation). In specific terms, CVD such as excimer-laser assisted CVD or the like, spattering, vacuum evaporation deposition, or ion plating may be used. In this case as well, stress adjustment can be performed easily by diverting the IC process.

Alternatively, it is acceptable to deliberately inflict damage upon the surface of the thin film by ion-beam irradiation, plasma processing, or the like as a surface-modifying procedure. More specifically, a defect is created on the surface by ion-beam irradiation, the surface is struck by $O_2$ plasma to inflict damage, or the surface is struck by argon ions to inflict damage.

It is also acceptable to perform crystallization or amorphatization by laser annealing as a surface-modifying procedure.

It is also acceptable to perform nitriding or oxidizing as a surface-modifying procedure. Furthermore, it is acceptable to perform carburization, surface-oxidation treatment, surface-nitriding treatment, TRD, or the like as a surface-modifying procedure.

Additionally, an acceleration sensor was described for the foregoing embodiments, but utilization in a sensor to detect a physical quantity such as a yaw-rate sensor, pressure sensor, or the like is possible, and utilization in an actuator utilizing electrostatic force, a semiconductor vibration sensor to detect vibration, or the like is also possible.

In addition, it is acceptable to utilize, instead of the LPCVD process, another CVD process such as a plasma enhanced CVD process or the like, an evaporation process, or a spattering process as the method for forming the movable member (thin film).

Furthermore, the sacrificial layer may be a nitride film such as a silicon-nitride film or the like, or phosphosilicate glass (PSG), or borosilicate glass (BSG), or BPSG, instead of a silicon-oxide film.

Sixth Embodiment

A specific sixth embodiment according to the present invention will be described hereinafter with reference to the drawings.

Figure 42:
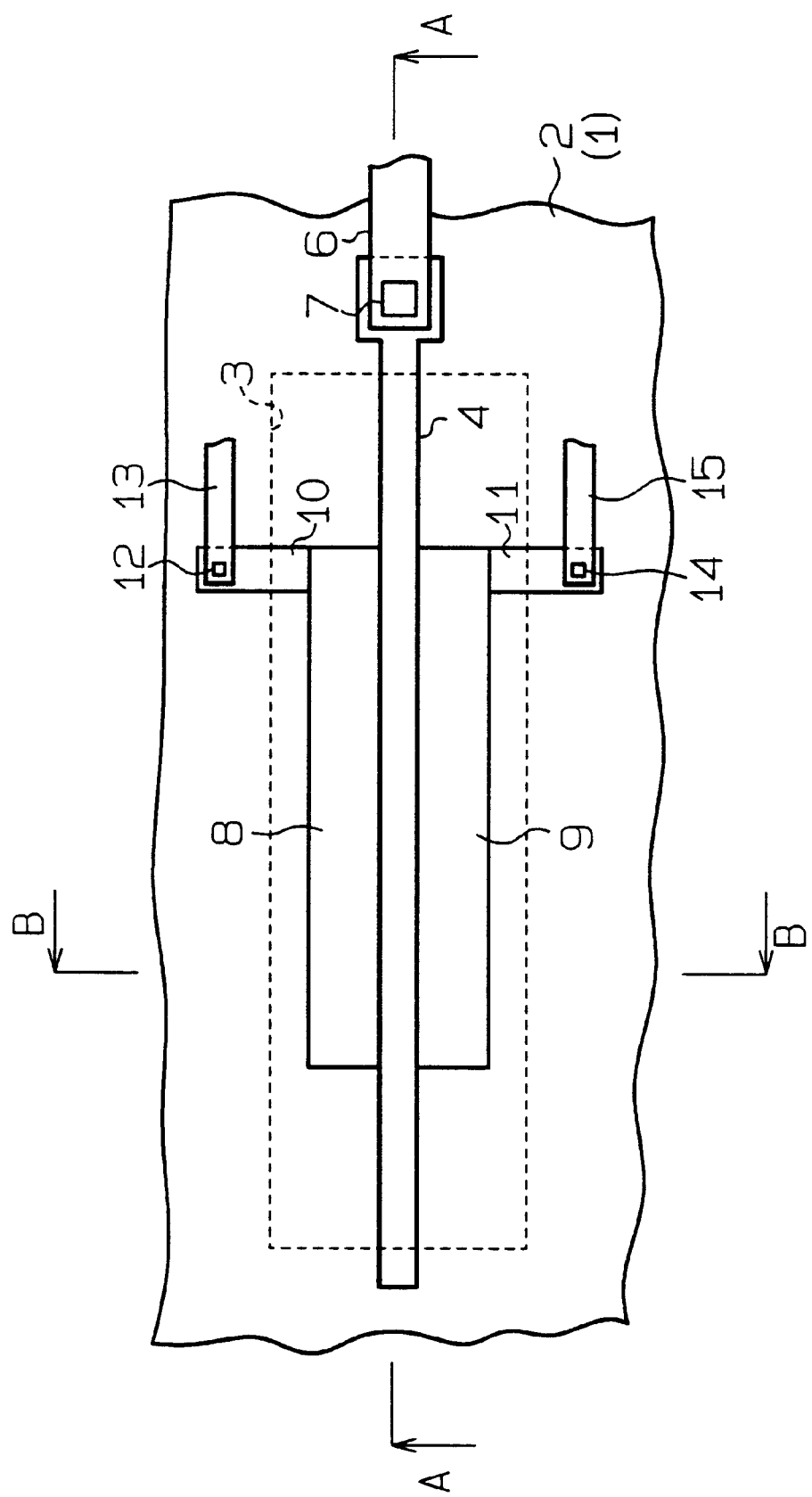
FIG. 42 is a plan view of a semiconductor acceleration sensor according to a sixth embodiment.
Figure 43:
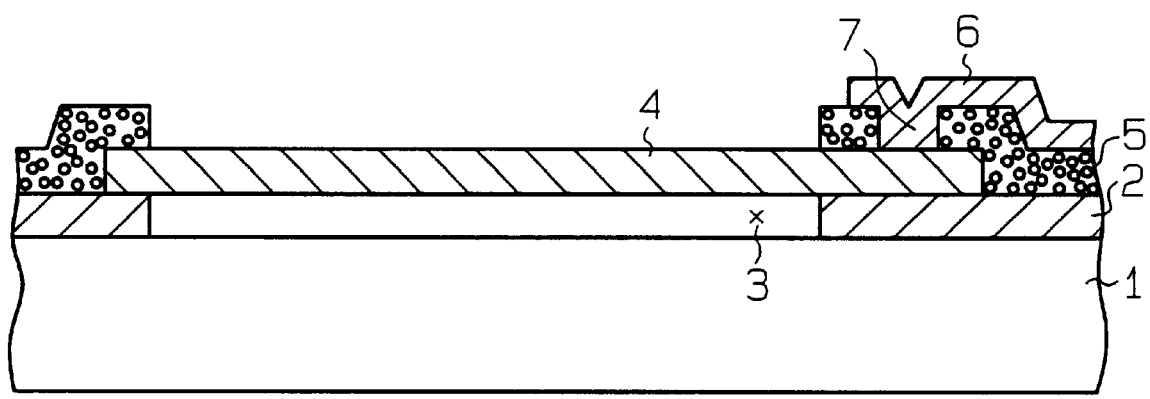
FIG. 43 is a sectional view taken along line A—A of FIG. 42.

FIG. 42 indicates a plan view of a semiconductor acceleration sensor according to this embodiment. Additionally, FIG. 43 indicates a sectional view taken along line A—A of FIG. 42, and FIG. 44 indicates a sectional view taken along line B—B of FIG. 42.

Figure 56:
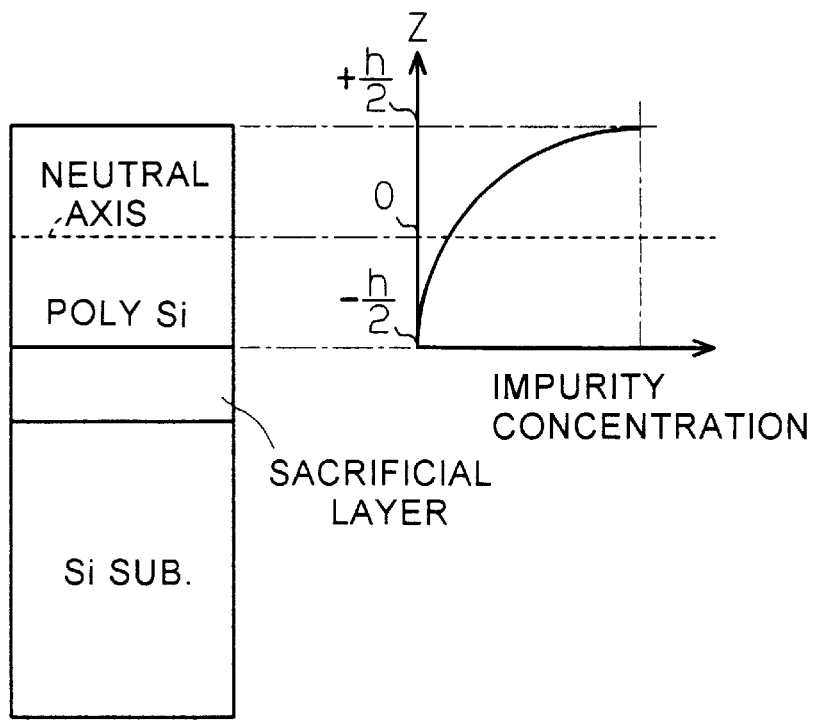
FIG. 56 is an explanatory diagram indicating impurity concentration distribution.

The present embodiment is a MIS transistor type semiconductor acceleration sensor. A silicon oxide film 2 is formed on a p-type silicon substrate 1. A region of oblong configuration having no silicon oxide film 2, i.e., a gap 3, is provided on the p-type silicon substrate 1 (see FIG. 42). Two ends of a movable member 4 as a gate electrode are supported on the silicon oxide film 2. This movable member 4 assumes a beam structure extending astride the gap 3, and is positioned above the silicon substrate 1 with a predetermined gap interposed therebetween. Furthermore, the movable member 4 is composed of a polycrystalline silicon thin-film extending linearly in a belt configuration. In greater detail, the movable member 4 is composed of a polycrystalline silicon layer of 2 μm thickness. Phosphorus (P) is introduced into the movable member 4, so that the introduced phosphorus (P) assumes, as shown in FIG. 56, a predetermined concentration distribution in the film-thickness direction. That is to say, in this embodiment, impurity concentration is controlled to be high in the upper-surface side and low in the lower-surface side.

Additionally, the p-type silicon substrate 1 and the movable member 4 are isolated by the silicon oxide film 2. Herein, the gap (air gap) 3 in a lower portion of the movable member 4 is formed by etching a portion of the silicon oxide film 2 as a sacrificial layer, and determines a gap length by the film thickness of the silicon oxide film 2 to be etched. At the time of this sacrificial layer etching, an etchant which etches the silicon oxide film 2 which is a sacrificial layer without etching the movable member 4 is utilized.

Additionally, an interlayer insulation film 5 is disposed on the silicon oxide film 2, and thereabove is disposed, via a contact hole 7, an aluminum wiring 6 for electrically connecting with the movable member 4.

Figure 44:
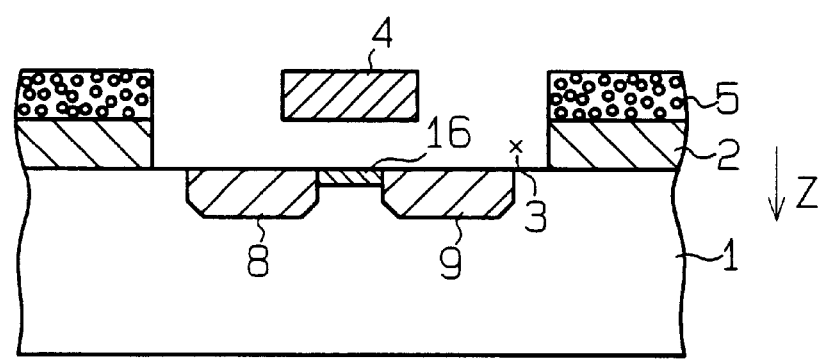
FIG. 44 is a sectional view taken along line B—B of FIG. 42.

In FIG. 44, fixed electrodes 8 and 9 composed of an impurity diffusion region are formed on the surface of the p-type silicon substrate 1 corresponding to both sides of the movable member 4. These fixed electrodes 8 and 9 are formed by introducing n-type impurities into the p-type silicon substrate 1 by an ion-implantation process or the like.

Additionally, as is shown in FIG. 42, wiring lines 10 and 11 composed of an impurity diffusion region are formed on the p-type silicon substrate 1. The wiring lines 10 and 11 are formed by introducing n-type impurities into the p-type silicon substrate 1 by an ion-implantation process or the like. Accordingly, the fixed electrode 8 and the wiring line 10, and the fixed electrode 9 and wiring line 11, are respectively electrically connected.

Furthermore, the wiring line 10 is electrically connected to an aluminum wiring 13 via a contact hole 12. Additionally, the wiring line 11 is electrically connected to an aluminum wiring 15 via a contact hole 14. Accordingly, the aluminum wirings 13, 15 and 6 are respectively connected to peripheral circuitry formed within the same substrate.

In addition, an inversion layer 16 is formed between the fixed electrodes 8 and 9 on the p-type silicon substrate 1. This inversion layer 16 is generated by applying voltage to the movable member (beam structure) 4.

Operation of the semiconductor acceleration sensor will be described next with reference to FIG. 44.

When voltage is applied between the movable member 4 as a gate electrode and the silicon substrate 1 and between the fixed electrodes 8 and 9, the inversion layer 16 is formed and current flows between the fixed electrodes 8 and 9. In a case wherein this acceleration sensor is subjected to acceleration and the movable member 4 is displaced in the Z direction (i.e., the direction perpendicular to the surface of the substrate) indicated in FIG. 44, the carrier concentration of the inversion layer 16 increases due to a change in the field strength, and current increases. In this way, this acceleration sensor can detect acceleration by increase or decrease in amount of current.

Next, a method for fabricating the semiconductor acceleration sensor structured in this manner will be described with reference to FIG. 45 to FIG. 54. Herein, the movable-member forming region (sensing region) is indicated on the left-hand side of the respective drawings, and a transistor making up a portion of peripheral circuitry is indicated on the right-hand side.

Figure 45:
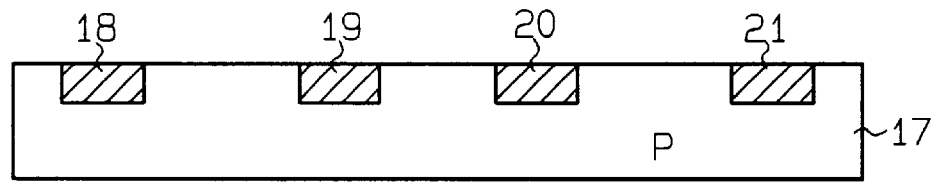
FIG. 45 through FIG. 54 are sectional views for describing steps for fabricating the semiconductor acceleration sensor according to the sixth embodiment.

As shown in FIG. 45, a p-type silicon substrate 17 is prepared and passes through a photolithographic process, and n-type diffusion regions 18, 19, 20 and 21, which become wiring lines for source/drain regions of the sensor and transistor, are formed by an ion-implantation process or the like.

Figure 46:
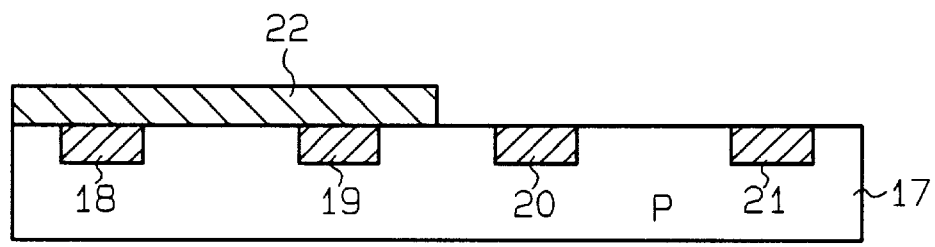

Next, as shown in FIG. 46, a silicon oxide film 22, a portion of which becomes a sacrificial layer, is formed in the sensor-forming region. It is also acceptable to form the silicon oxide film 22 on the entirety of the substrate and thereafter etch away the silicon oxide film of a region where the peripheral circuit-forming region is located.

Figure 47:
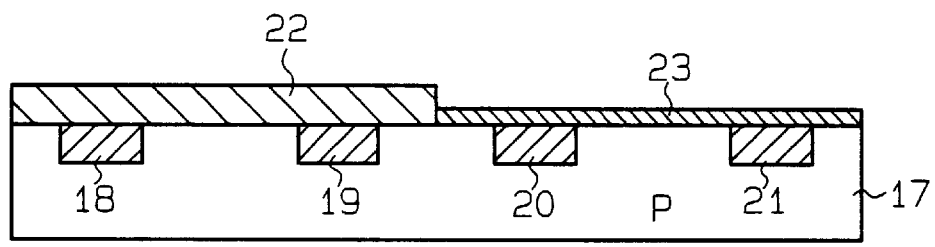

Then, as shown in FIG. 47, a gate oxide film 23 is formed by gate oxidation in the peripheral circuit-forming region.

Figure 48:
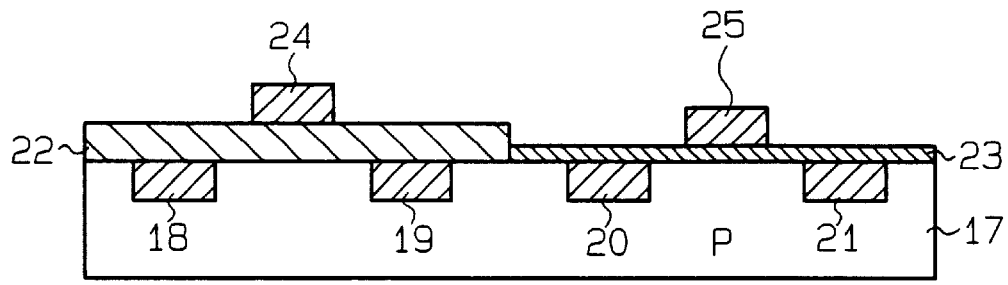

Accordingly, as shown in FIG. 48, a polycrystalline-silicon thin film which is movable-member forming material and gate-electrode forming material is deposited by a low-pressured chemical vapor deposition method, and phosphorus (P) is ion-implanted in the polycrystalline silicon of the sensor-forming region. A predetermined concentration distribution in the film-thickness direction as shown in FIG. 56 is obtained at this time by causing acceleration voltage (acceleration energy) to be changed.

Next, the polycrystalline-silicon thin film undergoes a photolithography process and is patterned by dry etching or the like to become a polycrystalline-silicon thin film for movable-member forming use 24 of the sensor and a polycrystalline-silicon thin film for gate-electrode forming use 25 of the transistor. That is to say, the polycrystalline-silicon thin film for movable-member forming use 24 is disposed on the silicon oxide film 22. It is also acceptable to separately form the polycrystalline-silicon thin film for movable-member forming use 24 and polycrystalline-silicon thin film for gate-electrode forming use 25.

Figure 49:
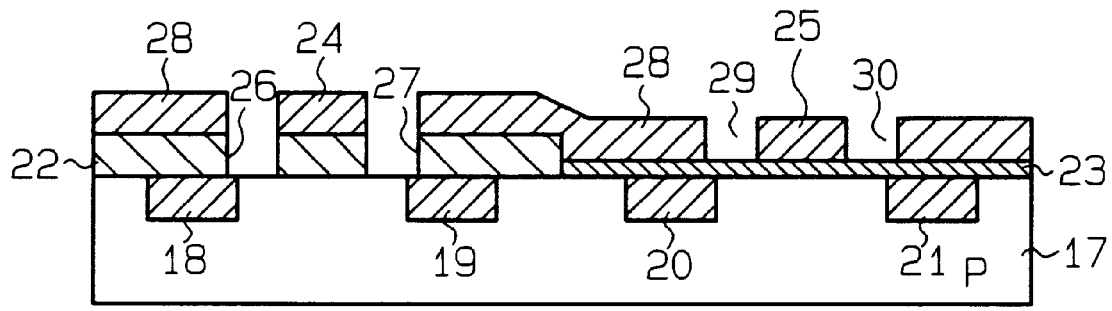

To continue, as shown in FIG. 49, after coating a photoresist 28, to form fixed electrodes of the sensor, openings 26 and 27 are formed on the silicon oxide film 22 in both ends of the polycrystalline-silicon thin film for movable-member forming use 24 through a photolithographic process. Furthermore, to form a source/drain regions of the transistor, openings 29 and 30 are formed on the photoresist 28 in association with the polycrystalline-silicon thin film for gate-electrode forming use 25 through a photolithographic process.

Figure 50:
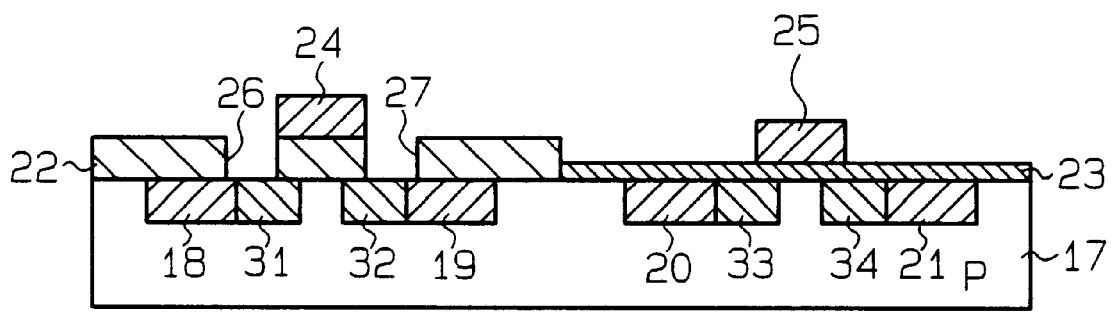

Then, impurities are introduced self-aligningly with respect to the polycrystalline-silicon thin film for movable-member forming use 24 and polycrystalline-silicon thin film for gate-electrode forming use 25 by ion-implantation or the like from the openings 26 and 27 of the silicon oxide film 22 and the openings 29 and 30 of the photoresist 28, as shown in FIG. 50, thereby forming fixed electrodes 31 and 32 made up of an n-type impurity diffusion region and source/drain regions 33 and 34 of the transistor.

Figure 51:
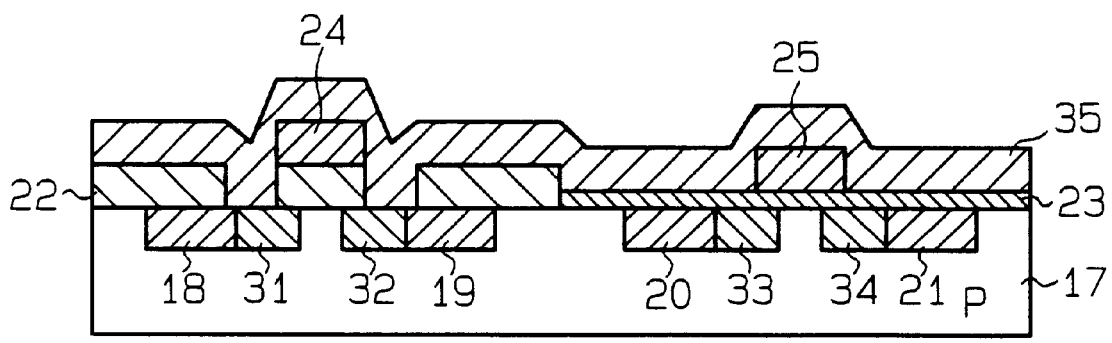
Figure 52:
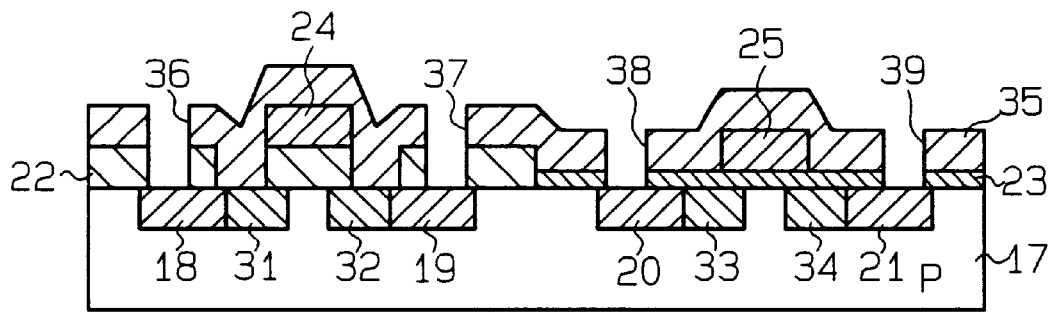

Next, as shown in FIG. 51, an interlayer insulation film (silicon oxide film) 35, which is disposed for electrically isolating the polycrystalline-silicon thin film for movable-member forming use 24 and aluminum wirings and the polycrystalline-silicon thin film for gate-electrode forming use 25 and aluminum wirings, is deposited. Then, as shown in FIG. 52, contact holes 36, 37, 38 and 39 for electrically connecting the diffusion regions for wiring use 18, 19, 20 and 21 and the aluminum wirings are formed in the interlayer insulation film 35 through a photolithographic process.

Figure 53:
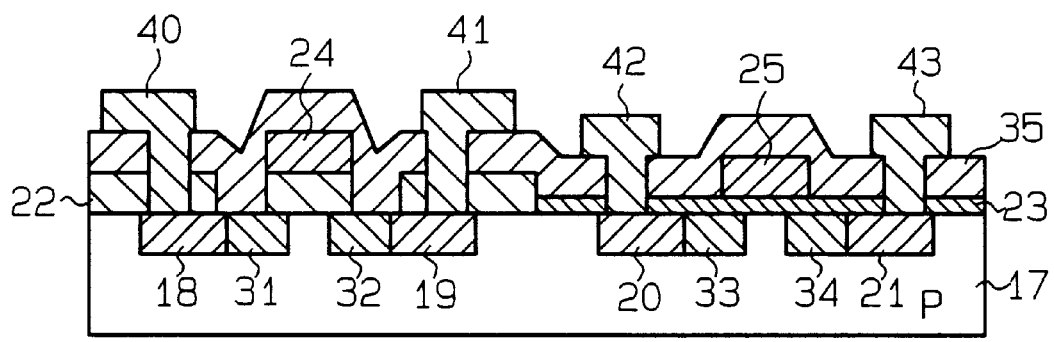
Figure 54:
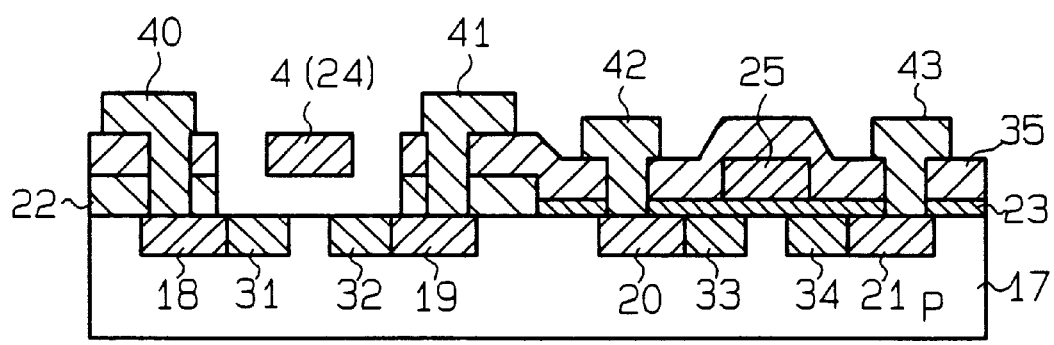

Furthermore, as shown in FIG. 53, aluminum which is an electrode member is deposited, and aluminum wirings 40, 41, 42, 43 and the like are formed through a photolithographic process. Accordingly, as shown in FIG. 54, a part of the interlayer insulation film (silicon oxide film) 35 and the silicon oxide film 22 below the polycrystalline-silicon thin film for movable-member forming use 24 are etched employing a hydrofluoric acid based etchant. As a result thereof, the movable member 4 of beam structure is disposed above the silicon substrate 17 via an air gap.

In this way, a fabricating process for a MIS transistor semiconductor acceleration sensor is completed.

Deflection of the movable member 4 is suppressed by utilizing a predetermined impurity concentration distribution in the film-thickness direction when implanting impurities in the polycrystalline-silicon thin film for movable-member forming use 24 in a process for fabricating a sensor such as this.

A deflection-suppressing effect for the movable member 4 will be described hereinafter with reference to FIG. 55 through FIG. 58.

Figure 55:
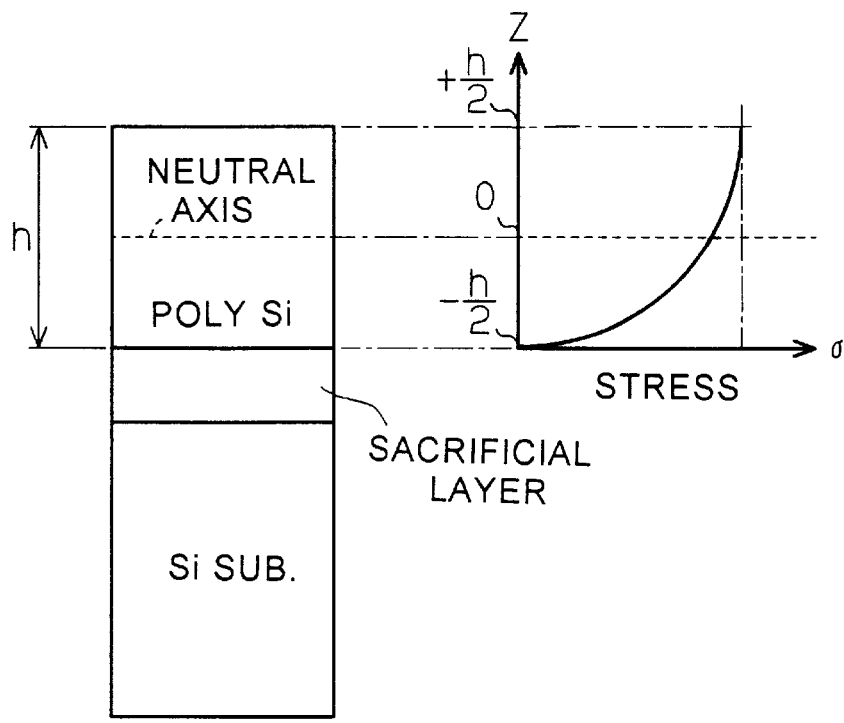
FIG. 55 is an explanatory diagram for describing a stress state of a movable member.

As shown in FIG. 55, when the polycrystalline-silicon thin film of thickness h is deposited on the silicon-oxide film 22 (sacrificial layer), a phenomenon wherein internal stress in the film-thickness direction becomes nonuniform generally occurs.

As discussed in the first embodiment, when the film-thickness direction is taken to be Z axis and internal stress in the film-thickness direction is taken to be $\sigma_Z$, the bending moment M1 generated on the neutral axis is represented as follows.

$$M1 = \int_{-\frac{h}{2}}^{\frac{h}{2}} (\sigma_z Z) dZ \quad (6)$$

Additionally, beam deformation due to this bending moment M1 has a certain radius of curvature, and the radius of curvature R1 at that time is determined as follows.

$$R1 = \frac{EI_Z}{M1} \quad (7)$$

Herein, $I_Z = \frac{1}{12}h^3$

However, E is Young's modulus for the polycrystalline-silicon thin film (movable member), and $I_Z$ is the sectional quadratic moment.

In this way, in a case where stress in the film-thickness direction is distributed nonuniformly, the thin-film structure body (beam) is deformed from the originally designed value.

In this regard, in order to cause the configuration to approach the originally designed value, the present embodiment suppresses deformation by controlling an impurity concentration distribution in the film-thickness direction.

It is known that residual stress in a thin film generally is changed by the film-deposition procedure (deposition system), film-deposition conditions, heat-treatment temperature, heat-treatment time, impurity concentration, and so on.

Figure 57:
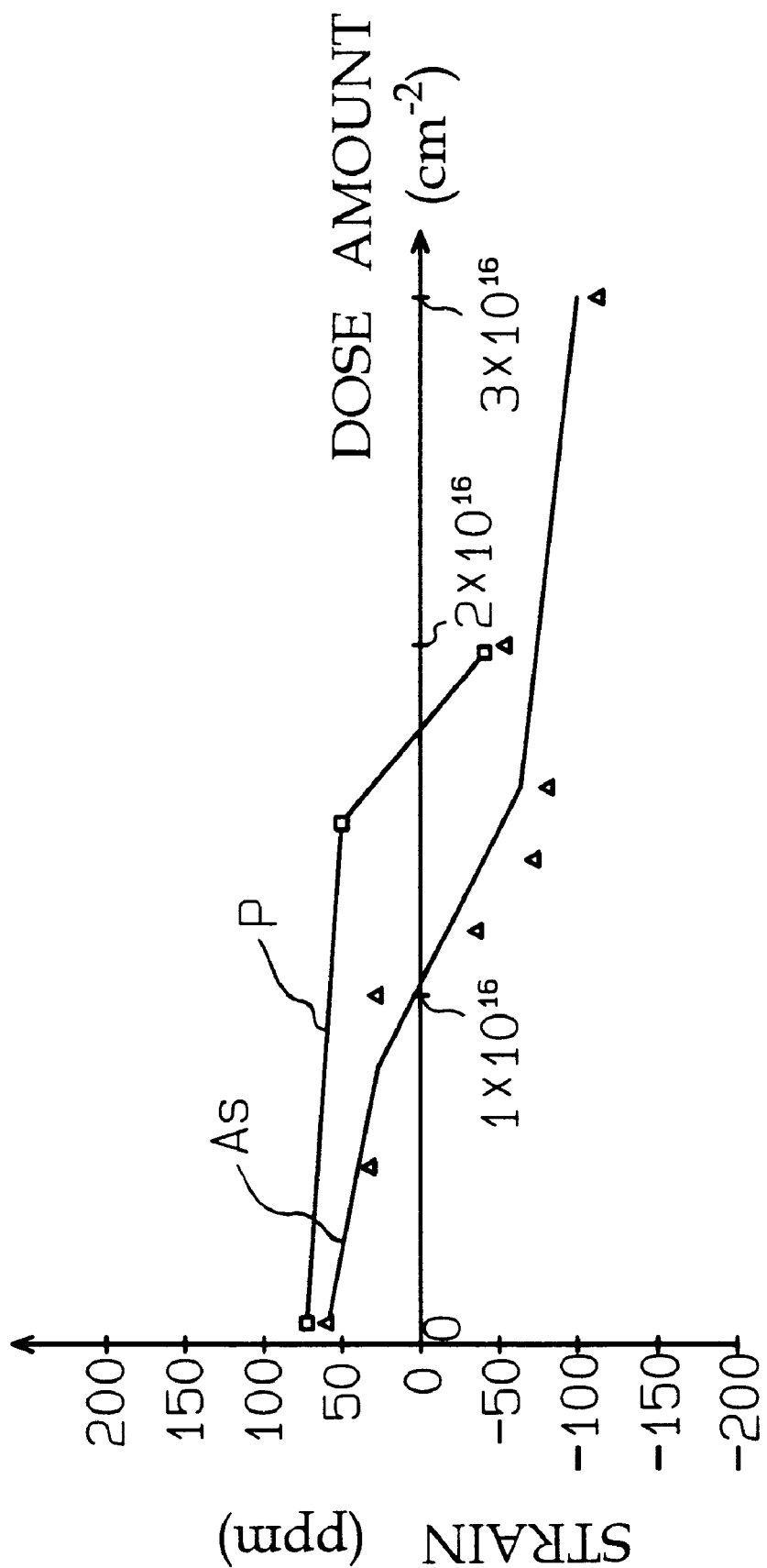
FIG. 57 is a graph indicating the relationship between dosage and residual stress.

For example, it is known that residual stress of a polycrystalline silicon thin film is changed by impurity concentration as shown in FIG. 57 (Orpana et al., "Control of residual stress of polysilicon thin films by heavy doping in surface micromachining", 1991 IEEE pp. 957–960). In this reference, a horizontal low-pressured CVD furnace with film-depositing conditions of 570° C. of deposition temperature, 500 mTorr of pressure, 1,050° C. of heat-treating temperature, and 60 min of heat-treating time and with phosphorus (P) and arsenic (As) as impurities is utilized. This reference reports a result that when impurities of P, As, and the like are introduced into a polycrystalline-silicon thin film, residual stress (residual stress is expressed as the product of strain and the Young's modulus for the film) changes from tensile stress to compressive stress along with the quantity of ion-implantation.

In this way, utilizing the dependency of residual stress on impurity concentration, the amount of deflection of the polycrystalline-silicon thin film is caused to be reduced.

Figure 58:
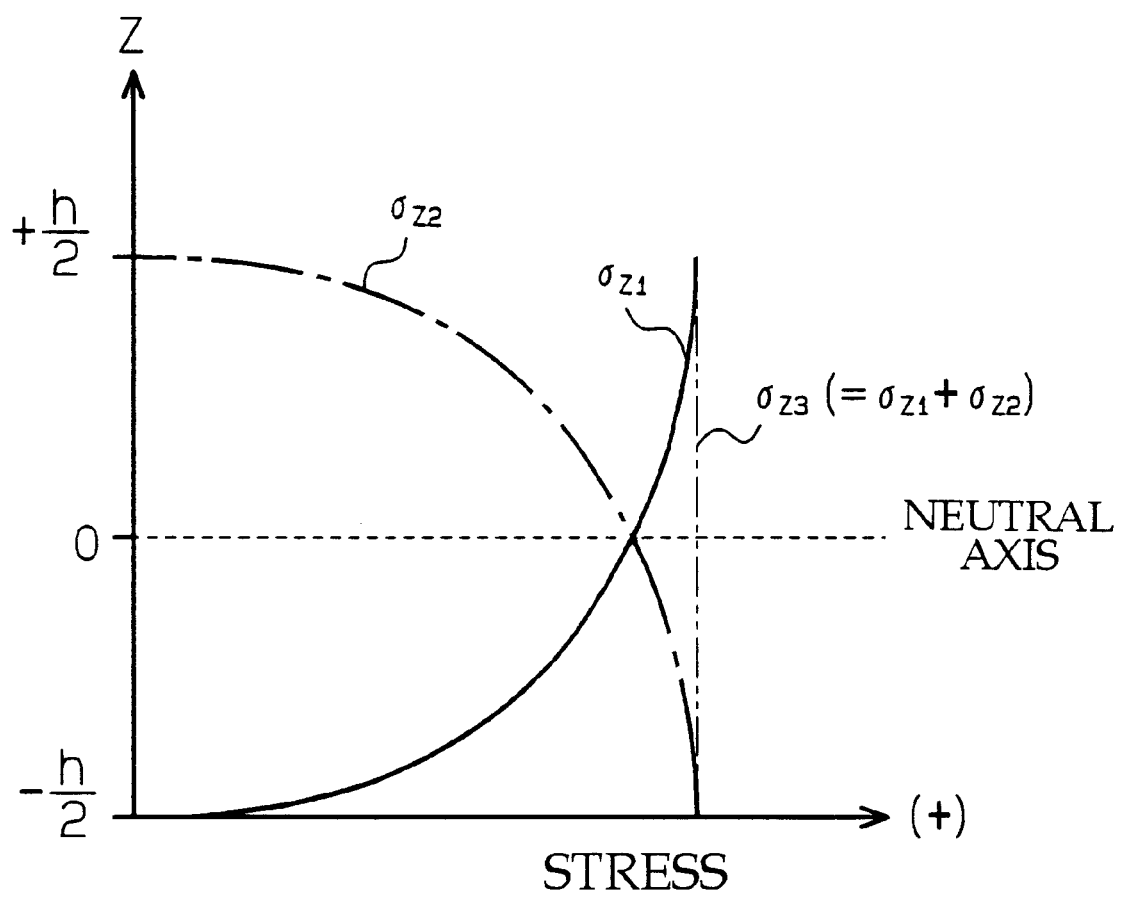
FIG. 58 is a diagram indicating stress distribution.

In FIG. 58, $\sigma_{z1}$ indicated by a solid line indicates an example of stress distribution of a polycrystalline-silicon thin film. When a semiconductor acceleration sensor is formed by the polycrystalline-silicon thin film of this FIG. 58, the beam is deflected away from the substrate. In this regard, ion-implantation which becomes an impurity concentration distribution in the film-thickness direction as shown in FIG. 56 is performed with respect to the polycrystalline-silicon thin film having stress distribution $\sigma_{z1}$. When a predetermined impurity concentration distribution in the film-thickness direction is formed in this way, stress distribution $\sigma_{z2}$ indicated by a single broken line in FIG. 58 is generated (i.e., stress due to impurity concentration distribution is generated). As a result of this, stress as indicated by a double broken line in FIG. 58 assumes distribution $\sigma_{z3}$ which has become a uniform value by applying an appropriate impurity concentration distribution in the film-thickness direction of the polycrystalline-silicon thin film in this way. That is to say, the stresses in the film-thickness direction cancel each other out ($\sigma_{z3}=\sigma_{z1}+\sigma_{z2}$), and the moment generated on the neutral axis approaches 0 and deflection becomes smaller.

Herein, stress distribution subsequently to ion-implantation need not necessarily be such that stress becomes uniform in the film-thickness direction as with the $\sigma_{z3}$ of FIG. 58; for example, it is sufficient to be vertically symmetrical with respect to Z=0 (neutral axis), and, in essence, it is sufficient for the stress to be distributed in the film-thickness direction so that the value calculated in equation (6) approaches 0.

In this way, according to the present embodiment, the silicon-oxide film 22 is formed as a sacrificial layer on the silicon substrate 17, the polycrystalline-silicon thin film 24 is formed thereabove as a thin-film for movable-member forming use, and thereafter, phosphorus (P) is ion-implanted as an internal-stress adjusting substance so as to yield a predetermined concentration distribution in the film-thickness direction, and thereby deflection of the movable member 4 is suppressed. That is to say, by establishing a predetermined concentration distribution of the phosphorus (P) in the film-thickness direction of the thin film, the bending moment due to internal stress distributed in the film-thickness direction of the thin film becomes smaller and thus deflection is suppressed. Additionally, long-term, high-temperature heat treatment (for example 24 hours at 1,150° C.) would be suppress deflection, but such treatment causes transistors and the like which make up peripheral circuitry to be damaged. However, according to the present embodiment, deflection can be prevented without performing long-term, high-temperature heat treatment (without damaging transistors in peripheral circuitry).

As a sample application of the present embodiment, the internal-stress adjusting substance introduced according to the above-described embodiment was P (phosphorus), but another impurity such as B (boron), As (arsenic), or the like, or an inert atom, or an atom making up a thin film, or the like may be used instead of phosphorus (P).

Additionally, according to the foregoing embodiment, a predetermined impurity concentration distribution in the film-thickness direction was obtained by causing acceleration voltage during ion-implantation to be changed. It is also acceptable to obtain a predetermined concentration distribution in the film-thickness direction by varying the implanted substance during ion-implantation. Namely, in a case where B (boron) is implanted, it is acceptable take $BF_3$ as an ion source, selectively separate $BF_3$, $BF_2$, BF, and B with a mass analyzer, switch among $BF_3$, $BF_2$, BF, and B, and implant the wafer in a state where acceleration voltage has been caused to be uniform. Ion-implantation depth differs for the several separated substances ($BF_3$, $BF_2$, BF, and B), and concentration distribution in the film-thickness depth can be controlled.

Seventh Embodiment

Next, a seventh embodiment will be described mainly on points of difference from the sixth embodiment.

Figure 59:
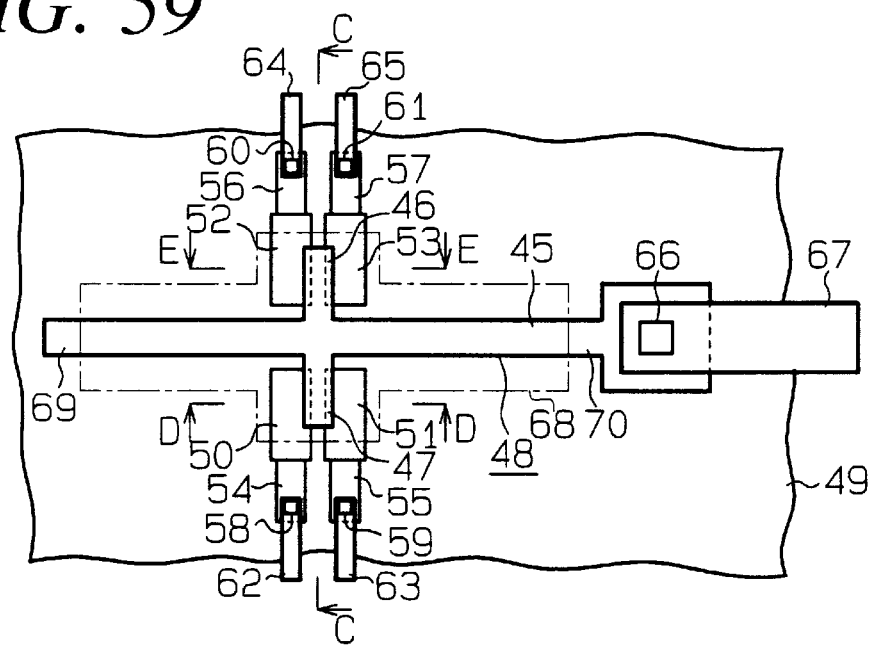
FIG. 59 is a plan view of a semiconductor acceleration sensor according to a seventh embodiment.
Figure 60:
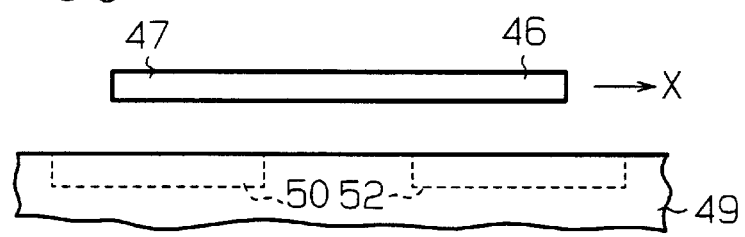
FIG. 60 is a sectional view taken along line C—C of FIG. 59.
Figure 61:
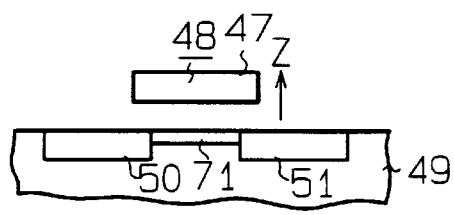
FIG. 61 is a sectional view taken along line D—D of FIG. 59.
Figure 62:
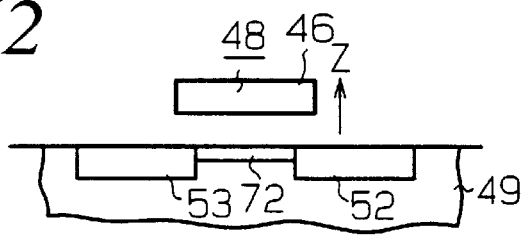
FIG. 62 is a sectional view taken along line E—E of FIG. 59.

FIG. 59 indicates a plan view of a semiconductor acceleration sensor according to this embodiment, FIG. 60 indicates a sectional view taken along line C—C of FIG. 59, FIG. 61 indicates a sectional view taken along line D—D of FIG. 59, and FIG. 62 indicates a sectional view taken along line E—E of FIG. 59.

According to the sixth embodiment indicated in FIG. 42, a single beam has a function as an elastic body, a function as a weight, and a function as an electrode, but according to the seventh embodiment indicated in FIG. 59, a movable member 48 of polycrystalline silicon thin film, which comprises a single doubly supported beam structure 45 having a function as an elastic body and a function as a weight and two electrode sections 46 and 47 having a function as a weight and a function as an electrode, is formed.

Fixed electrodes 50 and 51 as well as 52 and 53 composed of an n-type impurity diffusion region are formed on a p-type silicon substrate 49 below the electrode sections 46 and 47 in alignment with both sides of electrode sections 46 and 47 of the movable member 48. The respective fixed electrodes 50, 51, 52 and 53 are connected to diffusion regions for wiring use 54, 55, 56 and 57, and are connected to aluminum wirings 62, 63, 64 and 65 via contact holes 58, 59, 60 and 61. The movable member 48 is connected to an aluminum lead 67 via a contact hole 66.

An etching region 68 indicates a region where a portion of an insulation film (not illustrated) is etched as a sacrificial layer, and by performing sacrificial layer etching, the movable member 48 (polycrystalline-silicon thin film) is fixed to fixed ends 69 and 70 at two places, and the electrode sections 46 and 47 assume a movable structure.

FIG. 60 indicates that the fixed electrodes 50, 51, 52 and 53 are formed longer at both sides of the drawing than the electrode sections 46 and 47. FIG. 61 and FIG. 62 indicate that: voltage is applied between the electrode sections 46 and 47 and the substrate 49, as well as between the fixed electrodes 50 and 51 and between the fixed electrodes 52 and 53; inversion layers 71 and 72 are formed between the fixed electrodes 50 and 51 and between the fixed electrodes 52 and 53; and electrical currents flow respectively between the fixed electrodes 50 and 51 and between the fixed electrodes 52 and 53.

Operation of a semiconductor acceleration sensor capable of two-dimensional detection will be described next with reference to FIG. 60, FIG. 61 and FIG. 62.

In case this acceleration sensor is subjected to acceleration and the electrode sections 46 and 47 (movable member) are (is) displaced in the X direction indicated in FIG. 60 (i.e., a direction parallel to the surface of the substrate 49), then by a change in the surface area (the gate width in transistor terms) of the inversion layer formation region between both fixed electrodes, current flowing between the fixed electrodes 50 and 51 decreases, and current flowing between the fixed electrodes 52 and 53 conversely increases. Meanwhile, in case this acceleration sensor is subjected to acceleration and the electrode sections 46 and 47 are displaced in the Z direction (i.e., a direction perpendicular to the surface of the substrate 49) indicated in FIGS. 61 and 62, the foregoing currents are simultaneously reduced because the carrier concentrations of the inversion layers 71 and 72 are reduced.

In this way, this acceleration sensor can detect acceleration of two dimensions by two amounts of current. That is to say, structure is such that a pair of combinations of a movable electrode and two fixed electrodes are provided and an inversion layer formation region, i.e., gate width, increases on the one hand and decreases on the other hand due to displacement in a direction parallel to the substrate surface. Accordingly, it becomes possible to detect acceleration in directions respectively parallel to and perpendicular to the substrate surface from the increase or decrease of the two amounts of current. That is to say, in a case wherein the two amounts of current change in same phase, the beams are displaced in a direction perpendicular to the substrate surface, and in a case wherein the two amounts of current change in reverse phase, the beams are displaced in a direction parallel to the substrate surface, and acceleration can be detected.

In a sensor such as this, the impurity concentration distribution in the film-thickness direction is formed so as to cancel out stress distribution in the film-thickness direction with respect to the movable member (polycrystalline-silicon thin film) 48. Due to this, although the electrode sections 46 and 47 on the movable member 48 assume a cantilever beam structure taking the beam 45 as a fixed end, the bending moment becomes smaller and deflection of the electrode sections 46 and 47 can be suppressed.

Eighth Embodiment

Next, an eighth embodiment will be described mainly on points of difference from the sixth embodiment.

Figure 63:
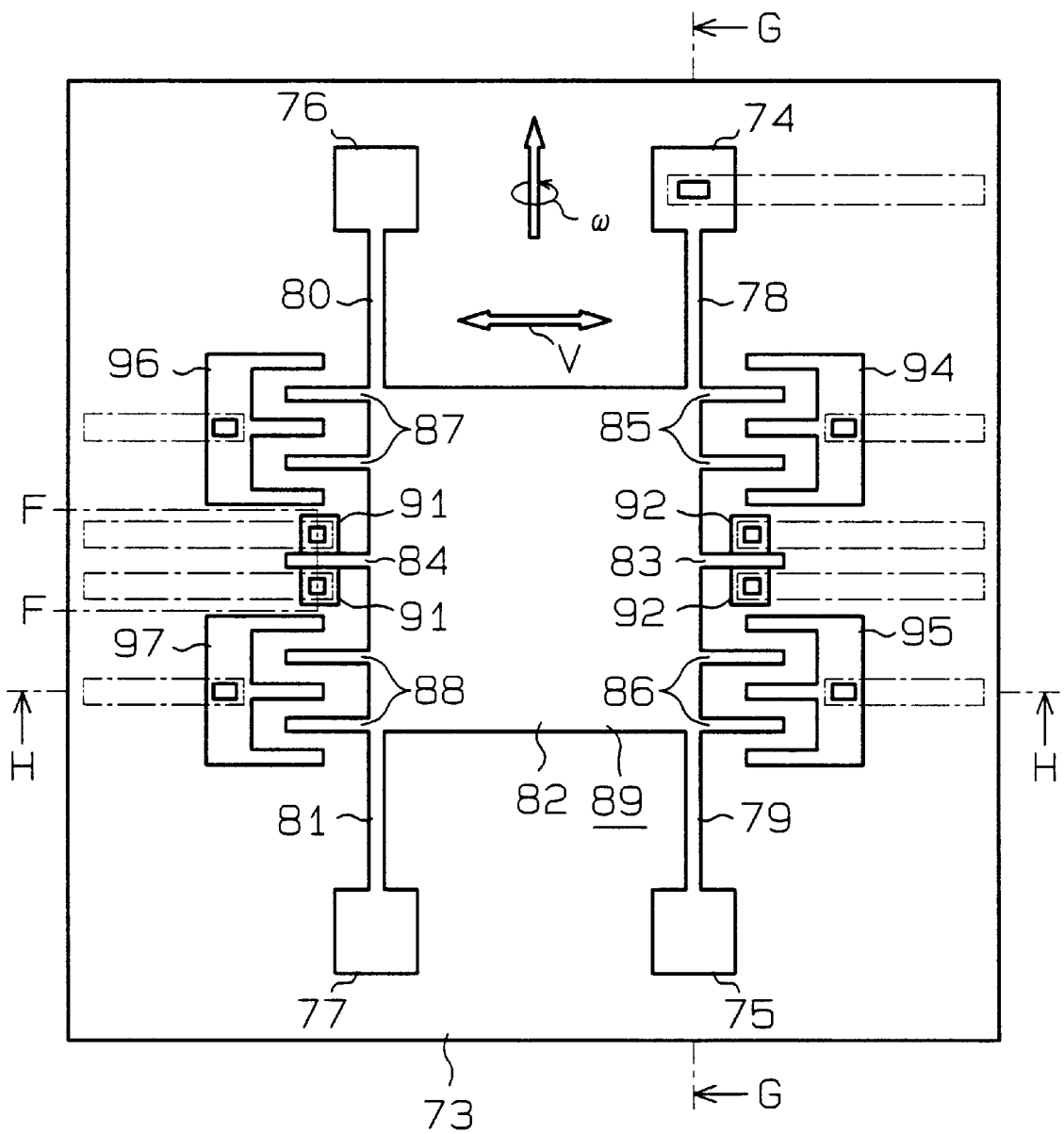
FIG. 63 is a plan view of a semiconductor yaw-rate sensor according to an eighth embodiment.

This embodiment is a specific embodiment of a semiconductor yaw rate sensor. FIG. 63 indicates a plan view of a semiconductor yaw rate sensor, FIG. 64 indicates a sectional view taken along line F—F of FIG. 63, FIG. 65 indicates a sectional view taken along line G—G of FIG. 63, and FIG. 66 indicates a sectional view taken along line H—H of FIG. 63.

Anchor sections 74, 75, 76 and 77 are formed in four places on a silicon substrate 73. A weight 82 is supported by beams 77, 78, 79 and 80 one respective end of which is supported by these anchor sections 74, 75, 76 and 77. Movable electrodes 83 and 84 protrude from this weight 82, and these movable electrodes 83 and 84 function as transistor gates. Additionally, vibration electrodes 85, 86, 87 and 88 extending in parallel protrude from this weight 82 with predetermined gaps interposed mutually therebetween.

The weight 82, movable electrodes 83 and 84, and vibration electrodes 85, 86, 87 and 88 in FIG. 63 are caused to be displaceable in a direction parallel to the substrate surface (i.e., the V direction in FIG. 63) and in a direction perpendicular to the substrate surface. Additionally, the anchor sections 74 to 77, beams 78 to 81, weight 82, movable electrodes 83 and 84, and vibration electrodes 85 to 88 are formed integrally, and a movable member 89 is structured by these. This movable member 89 is composed of a polycrystalline silicon thin film.

Figure 65:
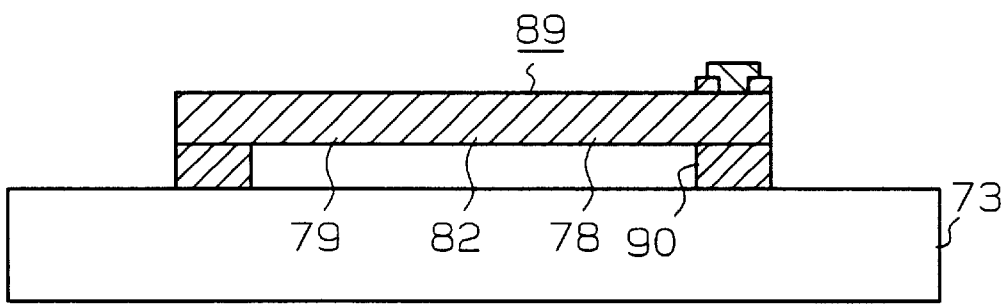
FIG. 65 is a sectional view taken along line G—G of FIG. 63.
Figure 66:
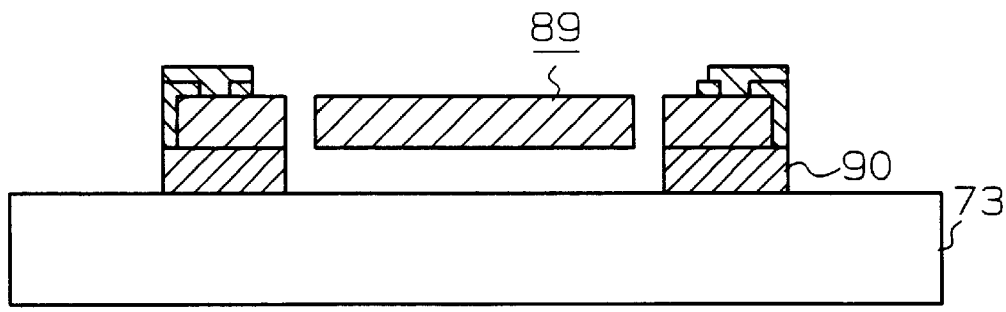
FIG. 66 is a sectional view taken along line H—H of FIG. 63.

As is shown in FIG. 65, an insulation film 90 is formed above the silicon substrate 73, and the beams 78, 79, 80 and 81 and weight 82 are suspended above this insulation film 90.

Figure 64:
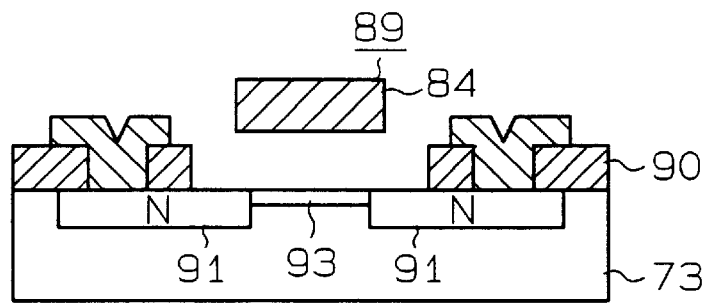
FIG. 64 is a sectional view taken along line F—F of FIG. 63.

As is shown in FIG. 64, fixed electrodes 91 (source/drain region) composed of an impurity diffusion region are formed on the silicon substrate 73 below the movable electrode 84 so as to align with both sides of the movable electrode 84. Similarly, fixed electrodes 92 (source/drain region) composed of an impurity diffusion region are formed on the silicon substrate 73 below the movable electrode 83 so as to align with both sides of the movable electrode 83. Additionally, as is shown in FIG. 64, an inversion layer 93, which is produced by applying voltage between the silicon substrate 73 and the movable electrode 84, is formed between the fixed electrodes 91 on the silicon substrate 73. Similarly, an inversion layer is formed between the fixed electrodes 92 on the silicon substrate 73 when voltage is applied between the silicon substrate 73 and the movable electrode 83.

Fixed electrodes for exciting use 94, 95, 96 and 97 are disposed opposingly on the top surface of the silicon substrate 73 in a state separated by a predetermined gap with respect to the respective vibration electrodes 85, 86, 87 and 88. Accordingly, when voltage is applied between the electrodes 85 and 94, the electrodes 86 and 95, the electrodes 87 and 96, and the electrodes 88 and 97, and mutually attracting electrostatic force is applied, the weight 82 and movable electrodes 83 and 84 are vibrated in a direction parallel to the substrate 73 (the V direction in FIG. 63). When yaw rate ω is exerted in this vibrating state, Coriolis force is exerted, and the weight 82 and movable electrodes 83 and 84 are displaced in a direction perpendicular to the substrate. This change is detected as a change in drain currents between the fixed electrodes 91 and between the fixed electrodes 92 provided in correspondence with the movable electrodes 83 and 84.

In a sensor such as this, a predetermined impurity concentration distribution in the film-thickness direction is formed so as to cancel out stress in the film-thickness direction with respect to the movable member (polycrystalline-silicon thin film) 89. By means of this, the movable electrodes 83 and 84 and the vibration electrodes 85, 86, 87 and 88, which assume cantilever beam structures taking the weight 82 as a fixed end, are structured such that the bending moment becomes smaller, whereby deflection of the movable electrodes 83 and 84 and the vibration electrodes 85, 86, 87 and 88 can be suppressed. As a result of this, the vibration electrodes 85, 86, 87 and 88 can be disposed opposingly with good precision with respect to the fixed electrodes for exciting use 94, 95, 96 and 97. Additionally, because deflection of the weight 82 is suppressed as well, the movable electrodes 83 and 84 and vibration electrodes 85, 86, 87 and 88 protruding from this weight 82 can also be disposed with good precision.

Figure 33:
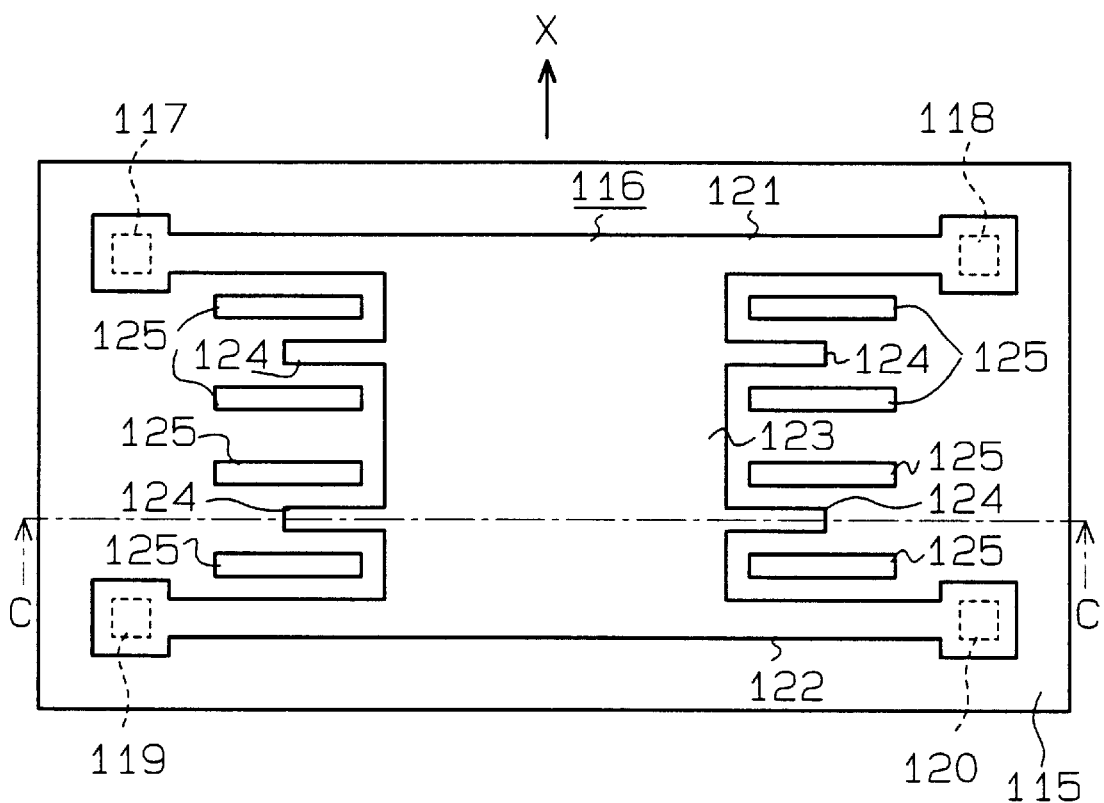
FIG. 33 is a plan view of a conventional semiconductor acceleration sensor.
Figure 34:
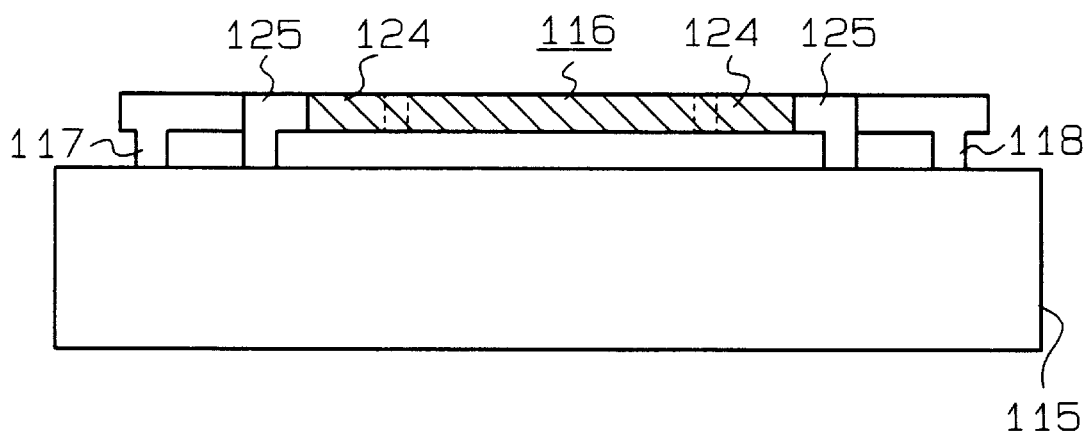
FIG. 34 is a sectional view taken along line C—C of FIG. 33.
Figure 35:
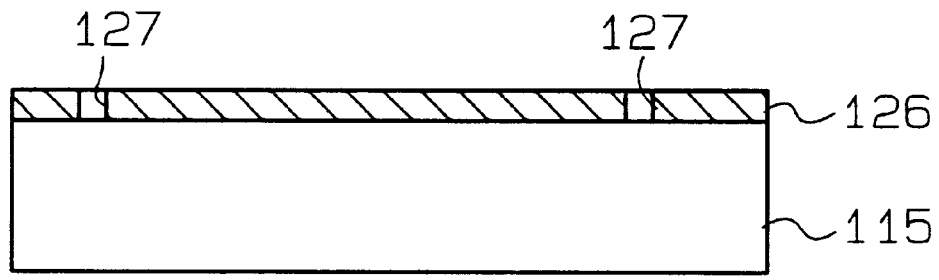
FIG. 35 through FIG. 37 are sectional views for describing steps for fabricating the conventional semiconductor acceleration sensor of FIG. 33.
Figure 36:
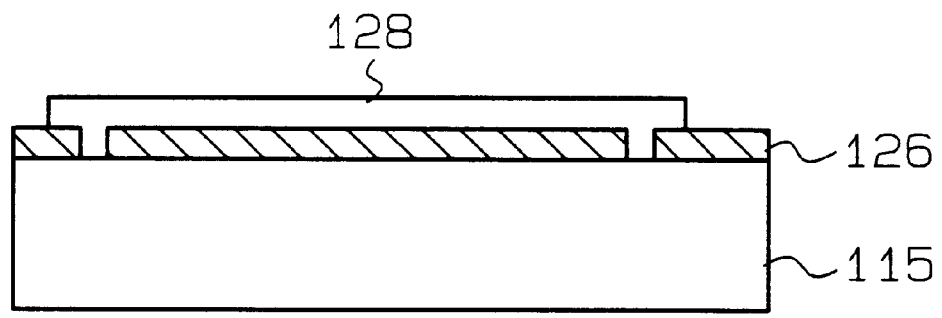
Figure 37:
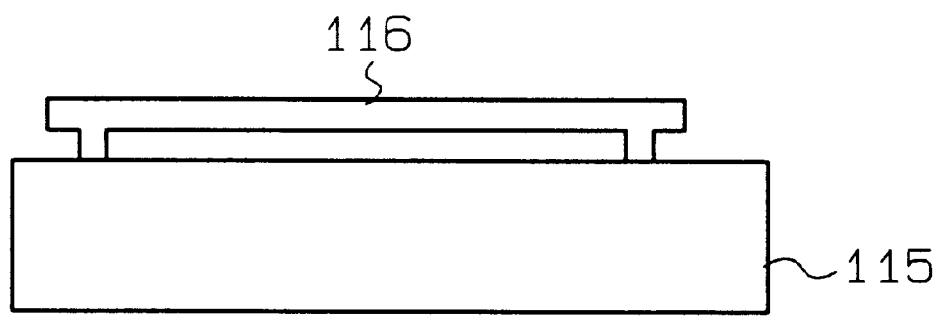
Figure 38:
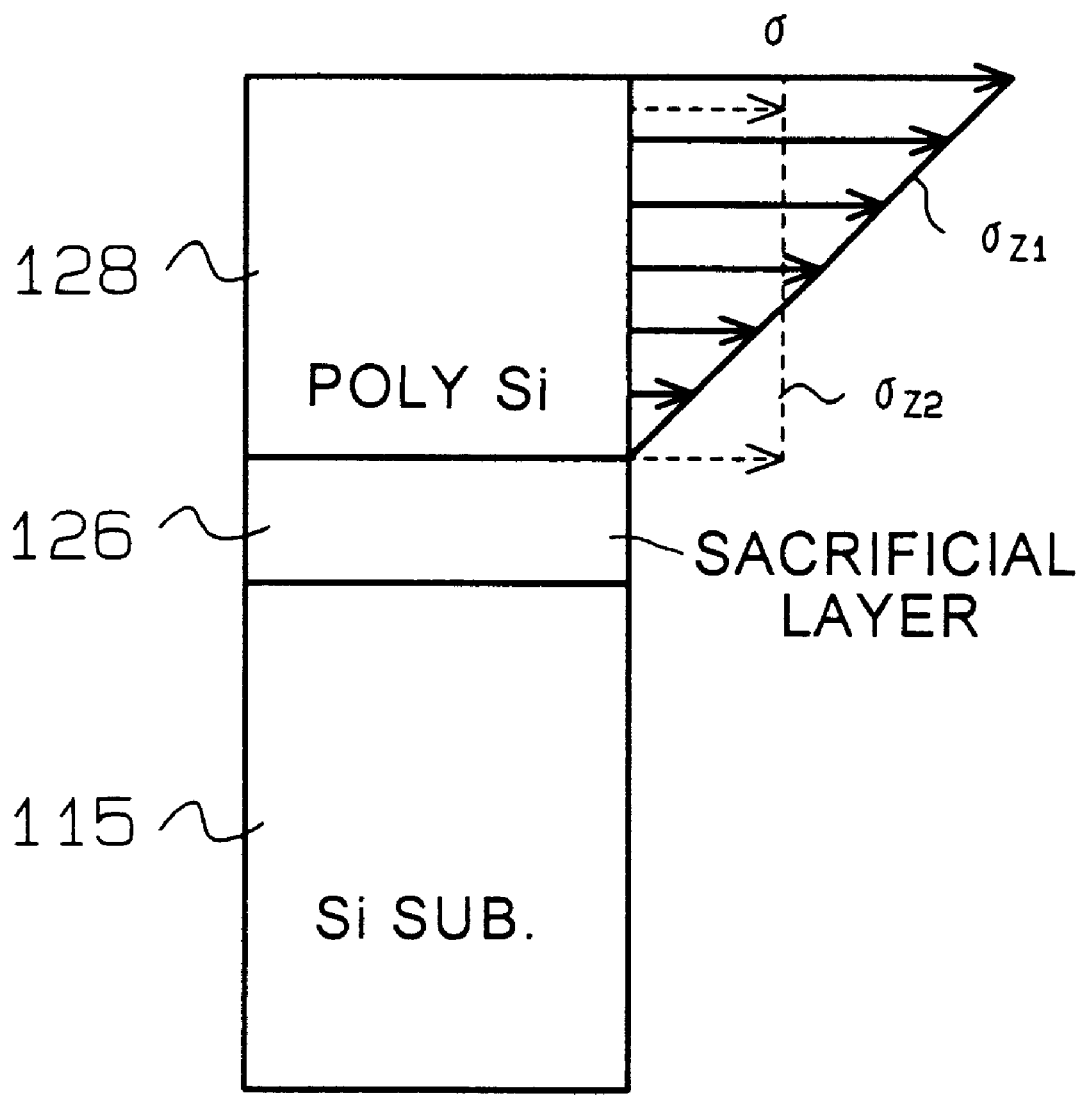
FIG. 38 is an explanatory diagram for describing a stress state of a movable member.

Furthermore, the present invention is not exclusively limited to the above-described sixth through eighth embodiments; for example the foregoing sixth and seventh embodiments are specific embodiments of a MIS transistor type semiconductor acceleration sensor, but specific embodiment in a differential-capacitance type semiconductor acceleration sensor indicated in FIG. 33 is also acceptable. In this case, deflection of a movable member 116 composed of a polycrystalline silicon thin film is suppressed. Accordingly, deflection of a movable electrode section 124 is also suppressed, and the movable electrode section 124 and a fixed electrode 125 can be disposed opposingly with good precision. Additionally, deflection of a weight section 123 can also be suppressed, the movable electrode section 124 protruding from the weight section 123 can also be disposed at a predetermined position with good precision, and because of this as well the movable electrode section 124 and fixed electrode 125 can be disposed opposingly with good precision.

In addition, amorphous silicon, aluminum, tungsten, or the like is also acceptable instead of polycrystalline silicon for the material of the movable member. In particular, fabrication matched with an IC process becomes easy in a case where a polycrystalline-silicon thin film or amorphous-silicon thin film is employed. Moreover, it is also acceptable to employ another deposition process such as a plasma enhanced CVD or the like, an evaporation process, or a spattering process, instead of the low-pressured CVD process, as the film-formation method of the movable member.

Still further, it is acceptable if the sacrificial layer is a nitride film such as a silicon nitride film or the like, or PSG, or BSG, or BPSG, instead of a silicon oxide film.

Additionally, according to the above-described sixth through eighth embodiments, the silicon oxide film (sacrificial layer) was formed on the silicon substrate, the thin film for movable-member forming use (polycrystalline-silicon thin film) was formed thereabove, and thereafter, the internal-stress adjusting substance (phosphorus or the like) was introduced so as to suppress deflection of the movable member. However, it is also acceptable to introduce the internal-stress adjusting substance during the formation of the thin film for movable-member forming use (polycrystalline-silicon thin film) to obtain a predetermined concentration distribution in the film-thickness direction, so as to suppress deflection of the movable member. That is to say, in a case where an ion-implantation method is employed, the thin film for movable-member forming use (polycrystalline-silicon thin film) is partially formed, and thereafter, ion-implantation is performed, and further, the thin film for movable-member forming use (polycrystalline-silicon thin film) is further formed thereabove and ion-implantation is performed, and a movable member of a predetermined film thickness is obtained by repeating this. Alternatively, film deposition is performed while controlling the concentration of the impurity (amount of gas) added during deposition of the thin film for movable-member forming use (polycrystalline-silicon thin film); for example, the gas flow rate of, for example, phosphine ($PH_3$) is caused to be changed during the deposition of polycrystalline-silicon.

Ninth Embodiment

A specific ninth embodiment according to the present invention will be described hereinafter with reference to the drawings.

Figure 67:
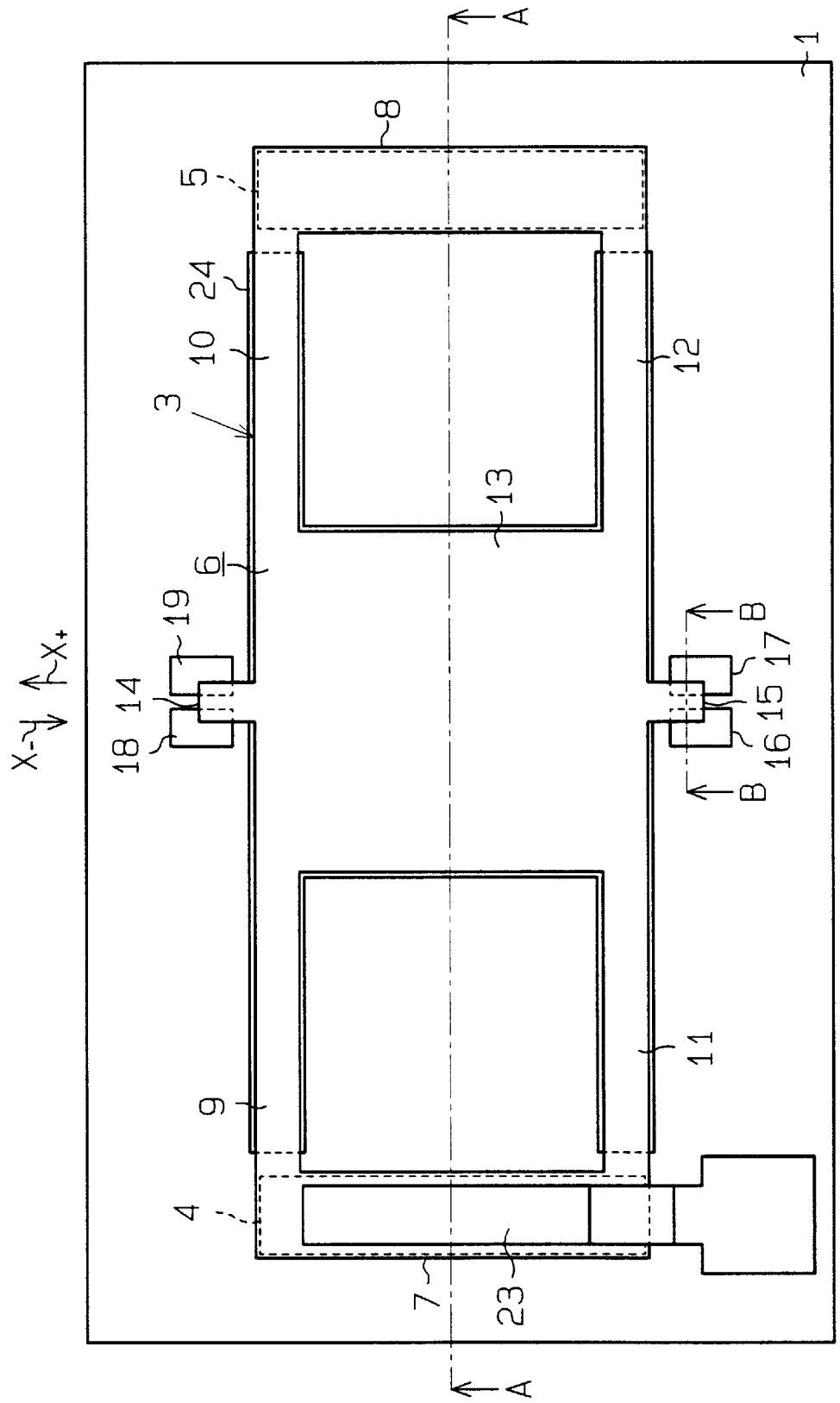
FIG. 67 is a plan view of a semiconductor acceleration sensor according to a ninth embodiment.
Figure 68:
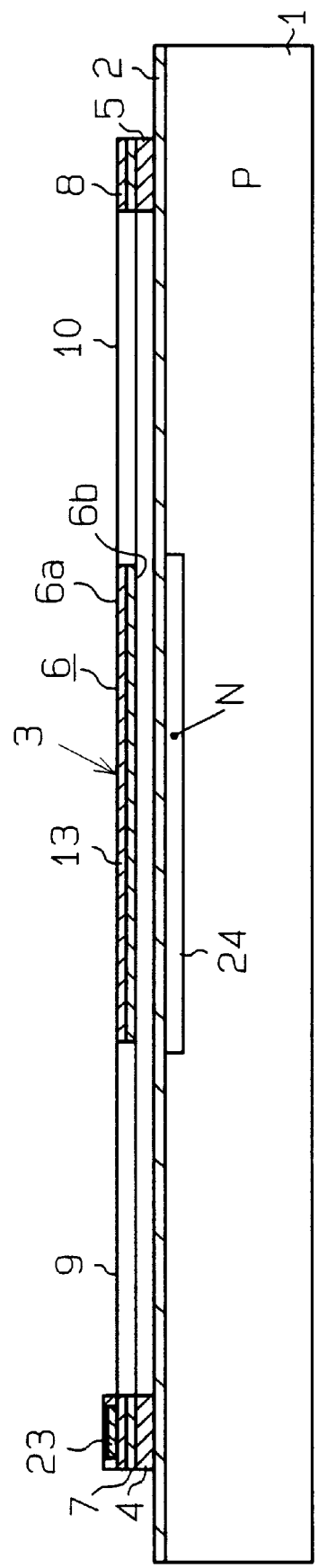
FIG. 68 is a sectional view taken along line A—A of FIG. 67.

FIG. 67 indicates a plan view of a semiconductor acceleration sensor according to this embodiment. Additionally, FIG. 68 indicates a sectional view taken along line A—A of FIG. 67, and FIG. 69 indicates a sectional view taken along line B—B of FIG. 67.

A silicon nitride film 2 as a gate insulation film is formed over the entire surface of a p-type silicon substrate 1 as a semiconductor substrate. This silicon nitride film 2 is for reducing leakage current of the substrate surface as well as suppressing deterioration of transistor characteristics with age.

Anchor sections 4 and 5 are disposed on the silicon substrate 1 (silicon nitride film 2). These anchor sections 4 and 5 comprise a silicon oxide film having a predetermined thickness. The anchor sections 4 and 5 form a belt configuration, and extend linearly and mutually in parallel. On the anchor sections (silicon oxide films) 4 and 5 are disposed anchor sections 7 and 8 comprising a polycrystalline-silicon thin film, and the anchor sections 7 and 8 have dimensions identical to the anchor sections 4 and 5. A movable member 6 of beam structure extends from these anchor sections 7 and 8. The movable member 6 as well comprises a polycrystalline-silicon thin film, similarly to the anchor sections 7 and 8. The movable member 6 and anchor sections 7 and 8 are structured by depositing two polycrystalline-silicon thin films 6a and 6b having differing internal-stress states. That is to say, a two-layer structure is constituted wherein the polycrystalline-silicon thin film 6a is disposed on the polycrystalline-silicon thin film 6b, and internal-stress states are cased to differ by causing film-deposition temperature in a low-pressured CVD process to differ when forming the respective polycrystalline-silicon thin films 6a and 6b. By structuring the movable member 6 with this two-layer structure having differing internal-stress states, the movable member 6 is caused to extend straight above the silicon substrate 1 without being deflected. This matter will be described in detail later.

The movable member 6 comprises beams 9, 10, 11 and 12, a weight section 13, and movable electrode sections 14 and 15 as gate electrode sections. The beam sections 9, 10, 11 and 12 extend from the anchor sections 7 and 8. The weight section 13 of square configuration is supported by these beams 9, 10, 11 and 12. The movable electrode sections 14 and 15 of oblong configuration protrude from the weight section 13 in mutually opposing directions. The movable member 6 is disposed above the silicon substrate 1 (silicon nitride film 2) with a predetermined gap interposed therebetween, so as to be displaceable in a direction perpendicular to the surface of the silicon substrate 1 and a direction parallel to the surface of the silicon substrate 1.

Figure 69:
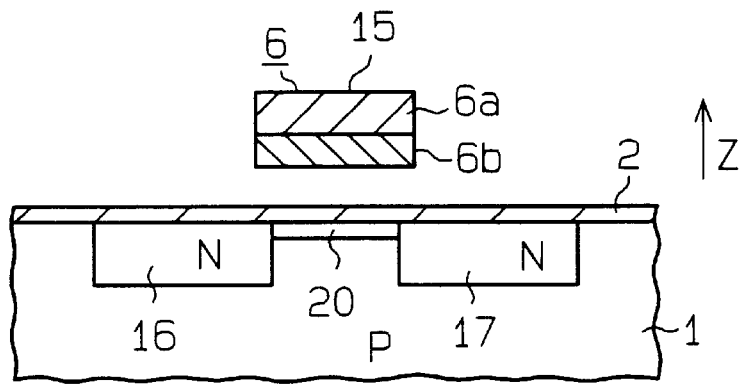
FIG. 69 is a sectional view taken along line B—B of FIG. 67.

As shown in FIG. 69, on the silicon substrate 1 below the movable electrode section 15 of the movable member 6 are formed fixed electrodes 16 and 17 as source and drain regions. The fixed electrodes 16 and 17 are composed of an n-type impurity diffusion region and aligned with respect to the movable electrode section 15 at both sides thereof.

Similarly, as is shown in FIG. 67, on the silicon substrate 1 below the movable electrode section 14 of the movable member 6 are formed fixed electrodes 18 and 19 as source/drain, which are composed of an n-type impurity diffusion region and aligned with respect to the movable electrode section 14 at both sides thereof. As shown in FIG. 69, a channel region 20, which is produced by applying voltage between the silicon substrate 1 and the movable electrode section 15, is formed between the fixed electrodes 16 and 17 on the silicon substrate 1. Accordingly, drain current flows through this channel region 20 by applying voltage between the fixed electrodes 16 and 17. Similarly, a channel region (not illustrated) is formed between the fixed electrodes 18 and 19 on the silicon substrate 1 when voltage is applied between the silicon substrate 1 and the movable electrode section 14. Accordingly, drain current flows through this channel region by applying voltage between the fixed electrodes 18 and 19.

As shown in FIG. 67, the movable member 6 is connected to an aluminum lead 23 via the anchor section 7.

Additionally, as shown in FIG. 67, an underlying electrode 24 composed of an n-type impurity diffusion region is formed on the surface of the silicon substrate 1 in a region without the fixed electrodes 16, 17, 18 and 19 at a portion opposing the movable member 6. This underlying electrode 24 is maintained equipotentially with respect to the potential of the movable member 6, and suppresses electrostatic force generated between the silicon substrate 1 and the movable member 6. Accordingly, electrostatic attraction is restrained from acting on the movable member 6.

Peripheral circuitry (not illustrated) is formed in the periphery of the disposed region of the movable member 6 on the silicon substrate 1. Accordingly, the peripheral circuitry and the aluminum lead 23 are connected and, along with this, the peripheral circuitry and the fixed electrodes 16, 17, 18 and 19 are electrically connected and, moreover, the peripheral circuitry and the underlying electrode 24 are electrically connected.

Operation of this semiconductor acceleration sensor will be described next.

When voltage is applied between the movable member 6 and the silicon substrate 1, and between the fixed electrodes 16 and 17 (18 and 19), the channel region 20 is formed, and current flows between the fixed electrodes 16 and 17 (18 and 19). Herein, in case this acceleration sensor is subjected to acceleration and the movable electrode sections 14 and 15 (movable member 6) are (is) displaced in the X+ direction indicated in FIG. 67 (a direction parallel to the surface of the silicon substrate 1), current flowing between the fixed electrodes 16 and 17 decreases and current flowing between the fixed electrodes 18 and 19 increases due to a change in the surface area (the channel width in transistor terms) of the channel region between the fixed electrodes. Additionally, in case the movable electrode sections 14 and 15 (movable member 6) are (is) displaced in the X− direction indicated in FIG. 67 (a direction parallel to the surface of the silicon substrate 1), current flowing between the fixed electrodes 16 and 17 increases and current flowing between the fixed electrodes 18 and 19 decreases due to a change in the surface area (the channel width in transistor terms) of the channel region between the fixed electrodes. Meanwhile, in a case wherein this acceleration sensor is subjected to acceleration and the movable electrode sections 14 and 15 are displaced in the Z direction indicated in FIG. 69 (a direction perpendicular to the surface of the silicon substrate 1), the carrier concentration of the channel region 20 is diminished due to a change in electrical field strength, and so the foregoing currents are simultaneously diminished.

In this way, this acceleration sensor can detect acceleration of two dimensions by the magnitude and phase of the current change when current flowing between the fixed electrodes 16 and 17 and between the fixed electrodes 18 and 19 changes due to changes in the mutual positions of the movable electrode sections 14 and 15 and the fixed electrodes 16, 17, 18 and 19 due to acceleration.

Next, a method for fabricating the semiconductor acceleration sensor structured in this way will be described with reference to FIG. 70 to FIG. 82. Herein, the movable-member forming region (sensing region) is indicated on the left-hand side of the respective drawings, and a transistor composing a portion of peripheral circuitry is indicated on the right-hand side.

Figure 70:
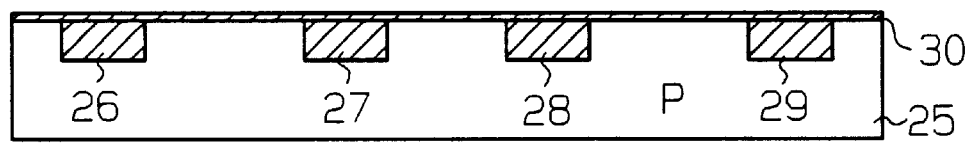
FIG. 70 through FIG. 82 are sectional views for describing steps for fabricating the semiconductor acceleration sensor according to the ninth embodiment.
Figure 71:
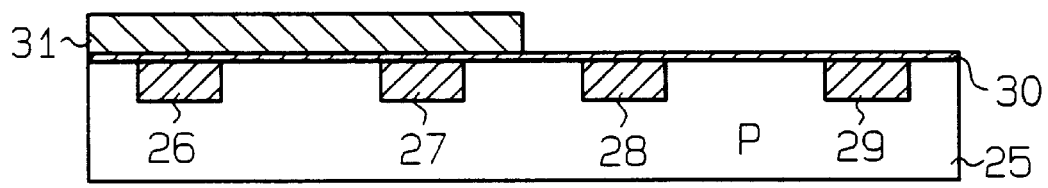

As is shown in FIG. 70, a p-type silicon substrate 25 is prepared, and n-type diffusion regions 26, 27, 28 and 29, which become source/drain wiring regions of the sensor and transistor, are formed by an ion-implantation process or the like through a photolithographic process. Further, a silicon nitride film 30 is formed as a gate insulation film on the entirety of the surface. Then, as shown in FIG. 71, a silicon oxide film 31, a part of which becomes a sacrificial layer, is formed in the movable-electrode forming region (sensing region). It is also acceptable to form the silicon oxide film 31 on the entirety of the substrate and thereafter etch away the silicon oxide film of a region where the transistor-forming region of peripheral circuitry is located.

Figure 72:
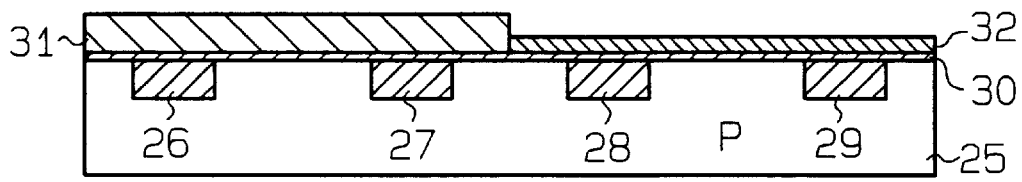

Furthermore, as is shown in FIG. 72, a gate oxide film 32 is formed by gate oxidation in the transistor-forming region of peripheral circuitry.

Next, a polycrystalline-silicon thin film which becomes a movable member is formed utilizing a low-pressured CVD process or the like. This step will be described in detail.

Figure 73:
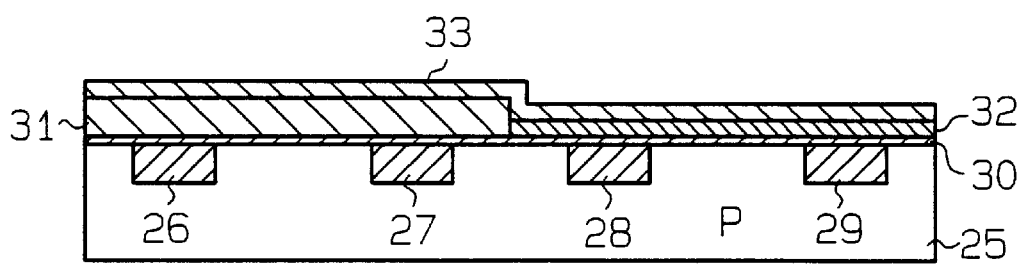
Figure 74:
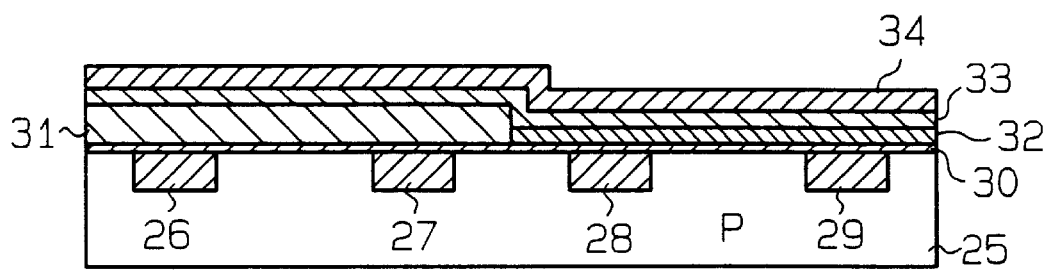

As shown in FIG. 73, silane (SiH$_4$) is introduced into a low-pressured CVD furnace while temperature therein is kept at 550° C. to 580° C., and thereby a first polycrystalline-silicon thin film 33 having tensile stress and a thickness of, for example, 0.5 µm is formed on the silicon substrate 25. Thereafter, as shown in FIG. 74, a second polycrystalline-silicon thin film 34 having compressive stress and a thickness of, for example, 1.5 µm is formed on the first polycrystalline-silicon thin film 33 by causing temperature within the furnace to be set at 600° C. to 630° C. while keeping silane flow.

Figure 75:
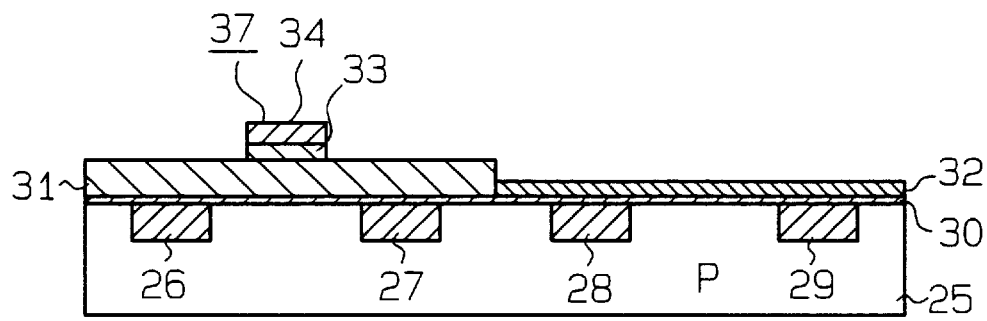

Accordingly, as shown in FIG. 75, the deposited polycrystalline-silicon thin films 33 and 34 are patterned into the configuration of the movable member 6 and the anchor sections 7 and 8 by dry etching or the like through a photolithographic process. In this way, a movable-member forming film (two-layered body) 37 composed of the first and second polycrystalline-silicon thin films 33 and 34 is formed.

Figure 76:
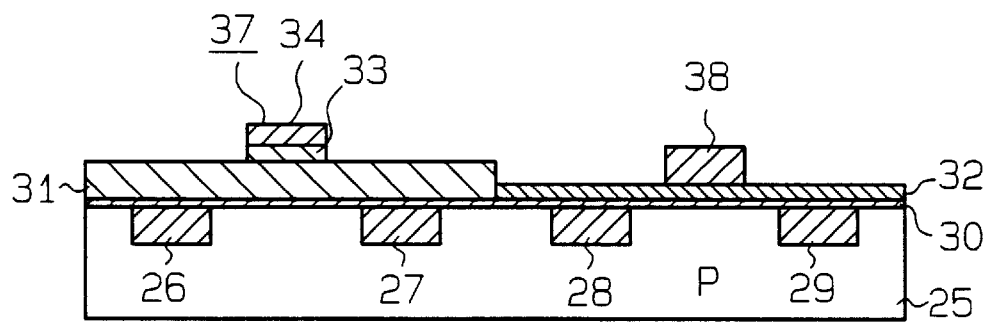

After the movable-member forming film 37 has been formed in this way, polycrystalline silicon is deposited and patterned to form a gate electrode 38 of a transistor of peripheral circuitry by dry etching or the like through a photolithographic process, as shown in FIG. 76.

Figure 77:
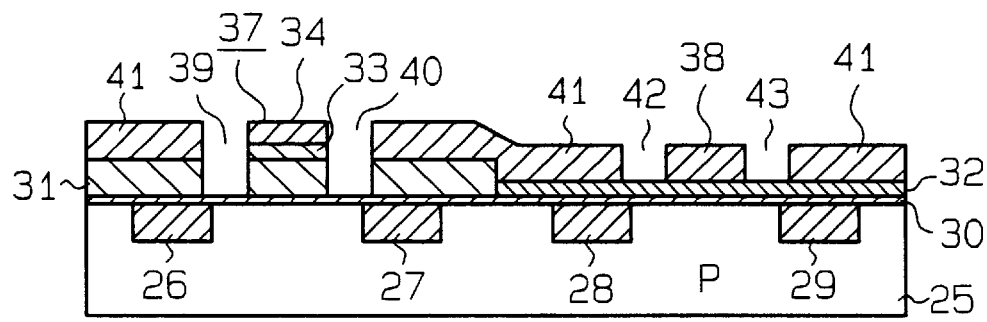

To continue, as shown in FIG. 77, after a photoresist 41 is coated over the substrate 25, openings 39 and 40 are formed on the silicon oxide film 31 through a photolithographic process. Additionally, openings 42 and 43 are also formed on the photoresist 41 through a photolithographic process.

Figure 78:
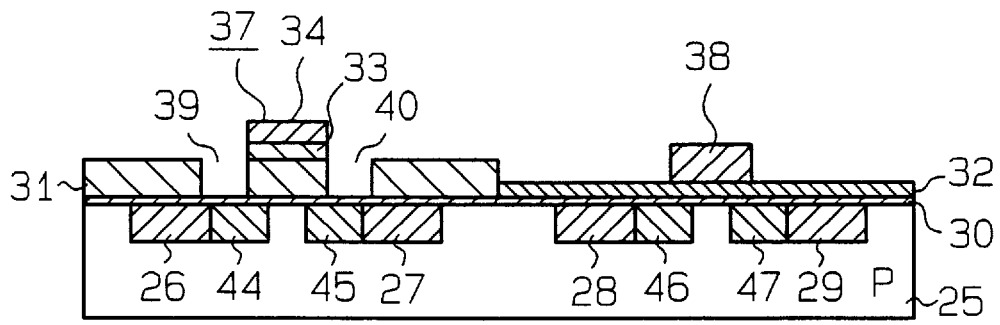

Then, impurities are introduced self-alignmently with respect to the movable-member forming film 37 and gate electrode 38 by ion-implantation or the like from the openings 39 and 40 of the silicon oxide film 31 and the openings 42 and 43 of the photoresist 41, and thereby forming fixed electrodes 44 and 45 composed of an n-type impurity diffusion region and source/drain regions 46 and 47 of the transistor of the peripheral circuitry, as shown in FIG. 78. In FIG. 78, the fixed electrodes 44 and 45 of the sensor are disposed in self-alignment with the movable-member forming film 37, and the source/drain regions 46 and 47 of the transistor of the peripheral circuitry are disposed in self-alignment with the gate electrode 38.

Figure 79:
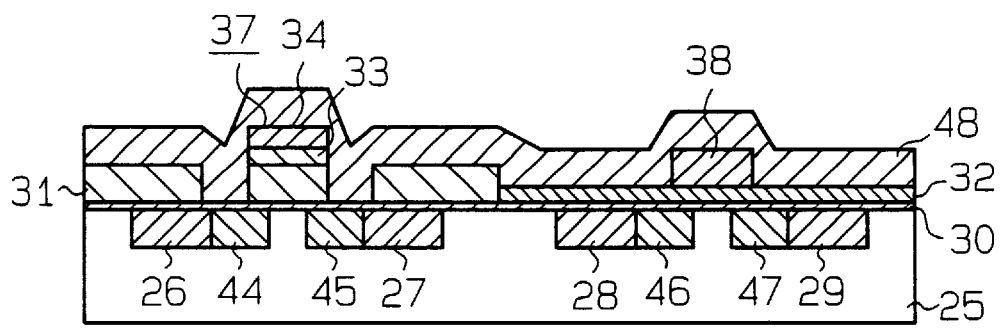
Figure 80:
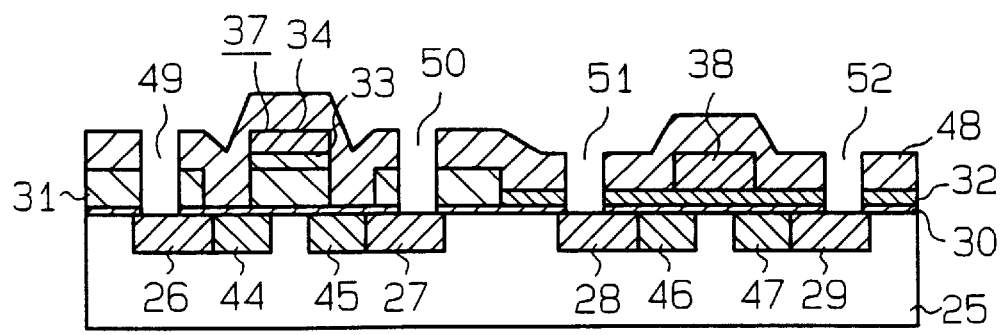

Next, as shown in FIG. 79, an interlayer insulation film 35 is formed to electrically isolate the movable-member forming film 37 and aluminum leads and the gate electrode 38 and aluminum leads. Then, as shown in FIG. 80, contact holes 49, 50, 51 and 52 for electrically connecting the diffusion regions for wiring use 26, 27, 28 and 29 and the aluminum leads are formed in the interlayer insulation film 48 through a photolithographic process.

Figure 81:
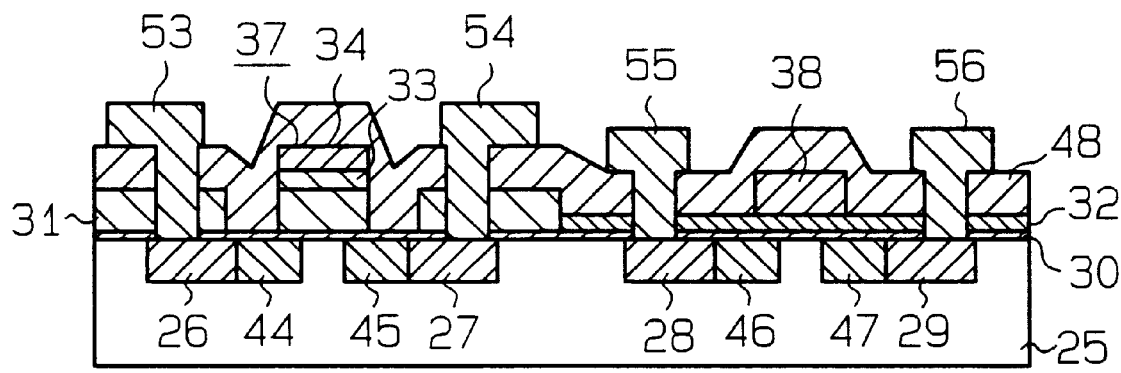
Figure 82:
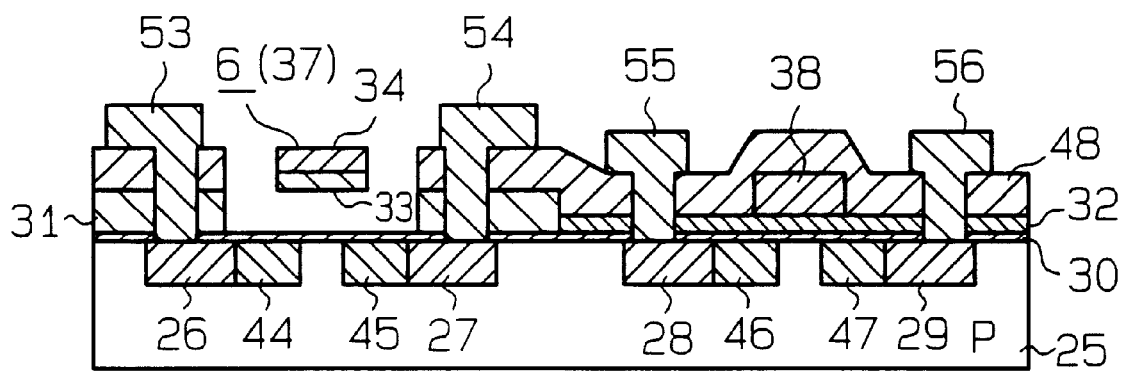

Furthermore, as shown in FIG. 81, aluminum which is lead material is deposited, and aluminum leads 53, 54, 55, 56, and the like are formed through a photolithographic process. Subsequently, as shown in FIG. 82, a portion of the interlayer insulation film 48 and a portion of the silicon oxide film 31 below the movable-member forming film 37 are etched using a hydrofluoric acid-based etchant. As a result thereof, the movable member 6 of beam structure is disposed above the silicon substrate 25 via an air gap.

In this way, a fabricating process for the MIS transistor type semiconductor acceleration sensor is completed.

Deflection of the movable member 6 is suppressed by depositing the polycrystalline-silicon thin films 33 and 34 having differing internal-stress states when film-formation of the movable member 6 is performed.

A deflection-suppressing effect for the movable member 6 will be described hereinafter with reference to FIG. 83 and FIG. 84.

Figure 83:
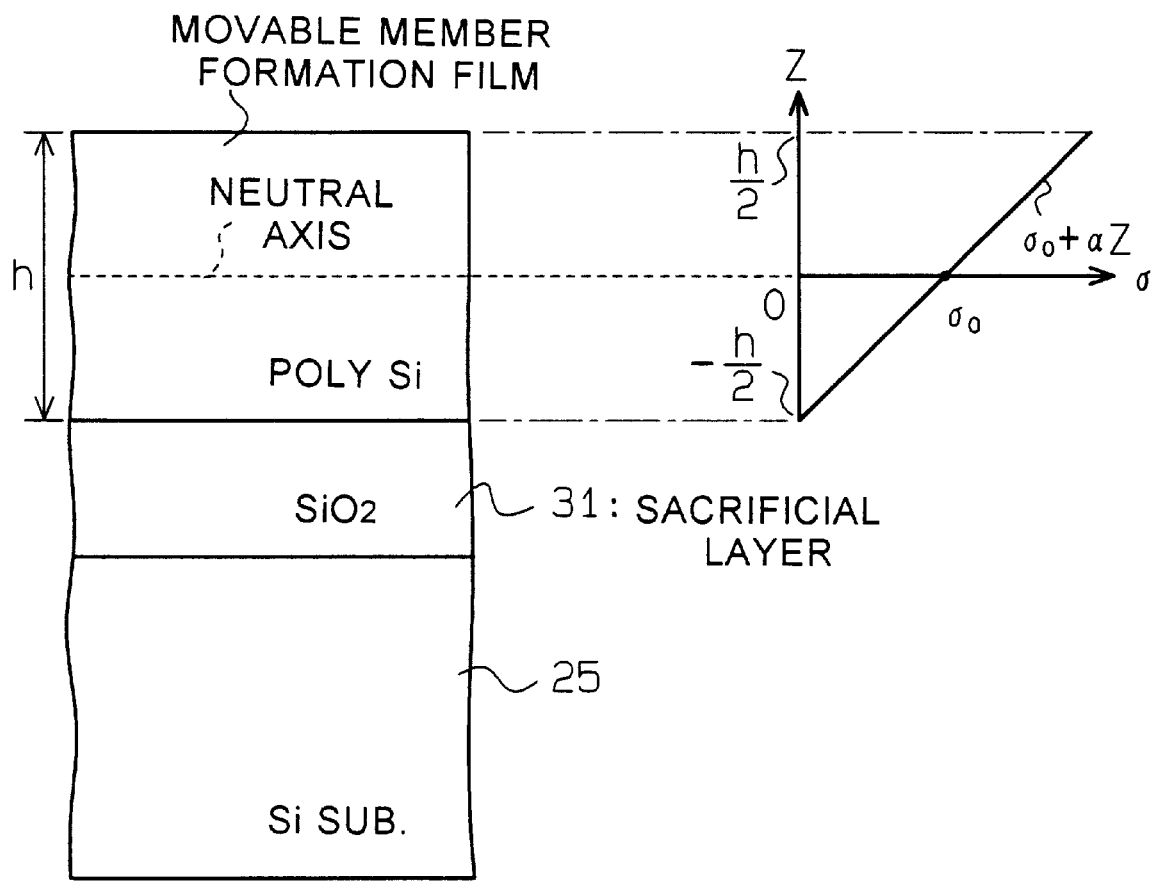
FIG. 83 is an explanatory diagram for describing a stress state of a movable member.
Figure 84:
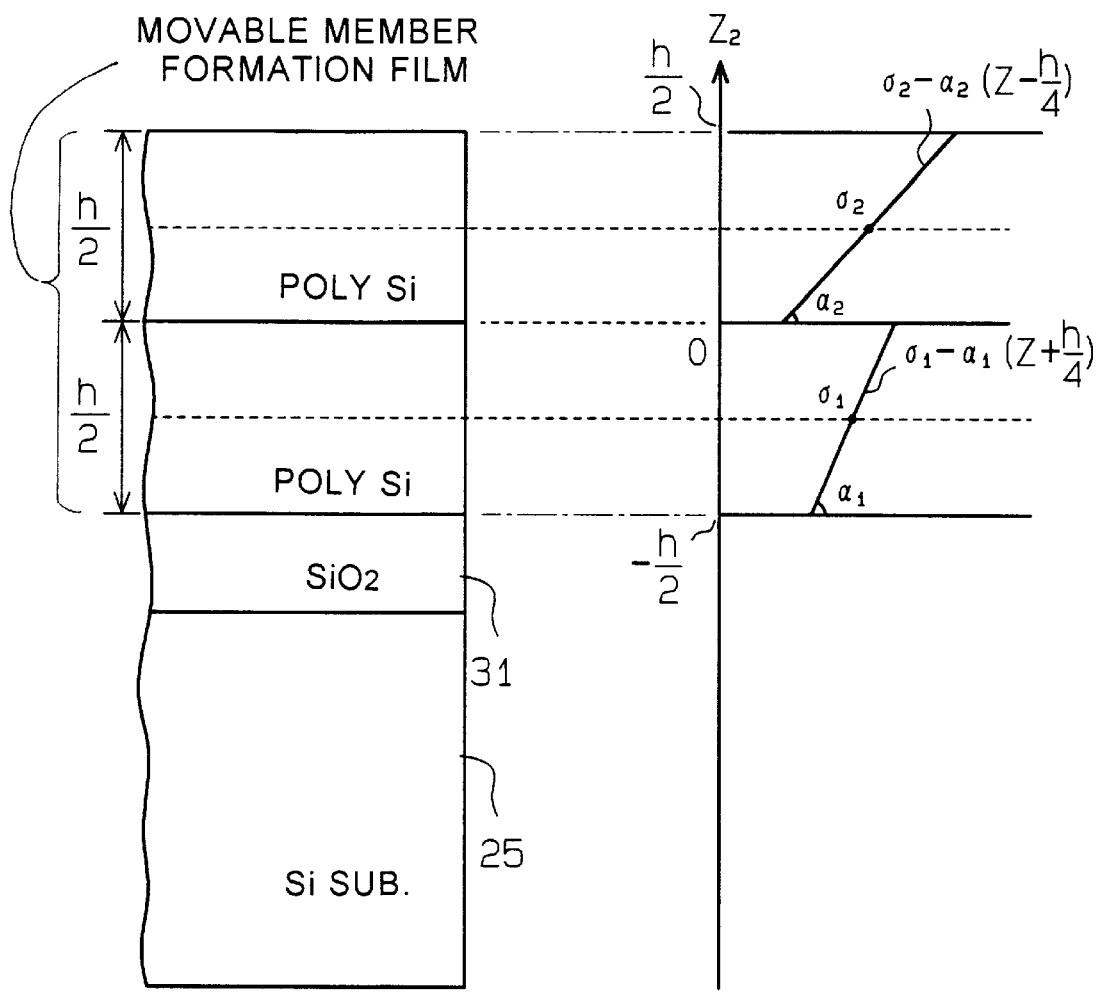
FIG. 84 is an explanatory diagram for describing a stress state of a movable member.

As shown in FIG. 83, in a case where the polycrystalline-silicon thin film of thickness h is formed on the silicon-oxide film 31 (sacrificial layer), internal stress in the direction of film thickness is assumed by a linear function in the film-thickness direction. That is to say, when it is assumed that internal stress is distributed with a gradient α, stress at the neutral axis is taken to be σ$_0$, and the direction of film thickness is taken to be the Z axis, stress distribution on the direction of film thickness Z is expressed as σ$_z$=σ$_0$+αZ. At this time, the bending moment M generated on the neutral axis is represented as follows.

$$M = \int_{-\frac{h}{2}}^{\frac{h}{2}} (\sigma_z Z) dZ \qquad (8)$$

$$= \int_{-\frac{h}{2}}^{\frac{h}{2}} Z(\sigma_0 + \alpha Z) dZ$$

Utilizing this, in case the polycrystalline-silicon thin film of thickness h/2 is formed on the silicon oxide film 31 (sacrificial layer) at a film-forming temperature of 550° C. to 580° C., it is assumed that internal stress is distributed with a gradient of α$_1$; and in case the polycrystalline-silicon thin film of thickness h/2 is formed on the silicon oxide film 31 (sacrificial layer) at a film-forming temperature of 600° C. to 630° C., it is assumed that internal stress is distributed with a gradient of α$_2$. Stress when these two films have been combined is as shown in FIG. 84.

Herein, when the movable member is considered to be a stack of two films of identical thickness, internal stress at position Z ($-h/2 \leq Z \leq 0$) is expressed as:

$$\sigma = \sigma_1 - \alpha_1\left(Z + \frac{h}{4}\right) \quad (9)$$

and stress at position Z ($0 \leq Z \leq h/2$) is expressed as:

$$\sigma = \sigma_2 - \alpha_2\left(Z - \frac{h}{4}\right) \quad (10)$$

Accordingly, bending moment M1 in this case can be determined as follows.

$$M1 = \int_{-\frac{h}{2}}^{\frac{h}{2}} (\sigma_z Z) dZ \quad (11)$$

$$= \int_{-\frac{h}{2}}^{0} \left[\sigma_1 - \alpha_1\left(Z + \frac{h}{4}\right)\right] Z dZ + \int_{0}^{\frac{h}{2}} \left[\sigma_2 - \alpha_2\left(Z - \frac{h}{4}\right)\right] Z dZ$$

$$= -1/8(\sigma_1 - \sigma_2)h^2 - 1/96(\alpha_1 + \alpha_2)h^3$$

In this way, in a case where two films ($\sigma_1, \alpha_1$) and ($\sigma_2, \alpha_2$) have been deposited, a situation such as in equation (11) is obtained, and deflection can be eliminated or reduced when the several values of $\sigma_1$, $\alpha_1$, $\sigma_2$, and $\alpha_2$ for causing the bending moment M to become "0" or to approach "0" are determined. That is to say, the internal-stress states (initial value and gradient of stress in a case where internal stress in the film-thickness direction has been modeled by a linear function in the film-thickness direction) of the two films can be controlled and deflection can be reduced by establishing the film-forming temperature and the like of the two films at a appropriate value.

When the deflection-suppressing effect for the movable member 6 is considered from the standpoint of tensile stress and compressive stress, the following is obtained. The movable member (polycrystalline-silicon thin film) is formed by a low-pressured CVD process or the like, but the film varies widely from tensile stress to strong compressive stress according to film-forming conditions. For example, one condition is film-forming temperature: internal stress tends toward tensile stress when film-forming temperature is low, and tends toward compressive stress when temperature is high. Deflection of the movable member is suppressed utilizing this property.

In any case, deflection is suppressed by canceling-out internal stress in the stack of thin films.

Further, the internal stress of the two films can also be controlled by the establishing the ratio of thickness of the two films in the two films of differing gradients of stress distribution at a suitable value.

In this way, according to the present embodiment, the silicon oxide film 31 (sacrificial layer) is formed on the silicon substrate 1 (semiconductor substrate). In addition, the plurality of polycrystalline-silicon thin films 33 and 34 (thin films for movable-member forming use) having differing in internal-stress states are deposited on this silicon oxide film 31, and the silicon oxide film 31 below the polycrystalline-silicon thin films 33 and 34 is etched away. As a result, the movable member 6 is composed of a stack of polycrystalline-silicon thin films 33 and 34 having differing in internal-stress states, and deflection of the movable member 6 is suppressed by a canceling-out action for internal stress in the polycrystalline-silicon thin film 33 and 34 for structuring the movable member 6. Consequently, acceleration can be detected with favorable accuracy while uniformly maintaining the gap between the movable member 6 and the silicon substrate 25.

Additionally, the degree of freedom in the control of the internal stress in the film-thickness direction can be maintained and stress alleviation becomes easier by causing film thickness and so on to be a suitable value.

Furthermore, when long-term, high-temperature heat treatment (for example 24 hours at 1,150° C.) is performed as a procedure to cause internal stress in the film-thickness direction of the movable member 6 to become smaller, transistors and the like which make up peripheral circuitry are damaged. According to the present embodiment, deflection of the movable member 6 can be prevented without performing long-term, high-temperature heat treatment (without damaging transistors in peripheral circuitry).

Tenth Embodiment

Next, a tenth embodiment will be described mainly on points of difference from the ninth embodiment.

The foregoing ninth embodiment was structured with two layers of film overlapped in all regions as the movable member 6. According to the present embodiment, two mutually contiguous films are structured with the surface area of one film caused to differ from the surface area of the other film, as shown in FIG. 85.

Figure 85:
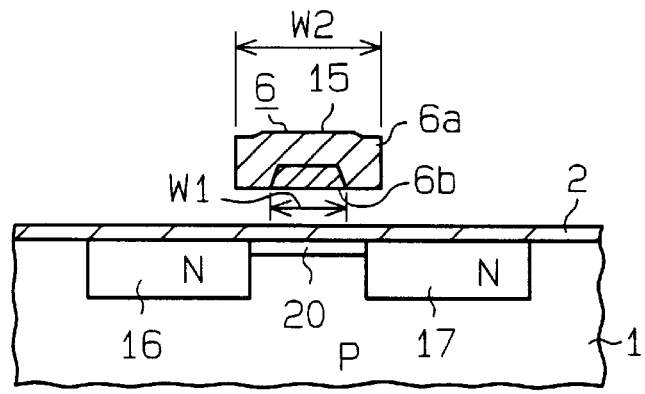
FIG. 85 is a sectional view of a semiconductor acceleration sensor according to a tenth embodiment.
Figure 86:
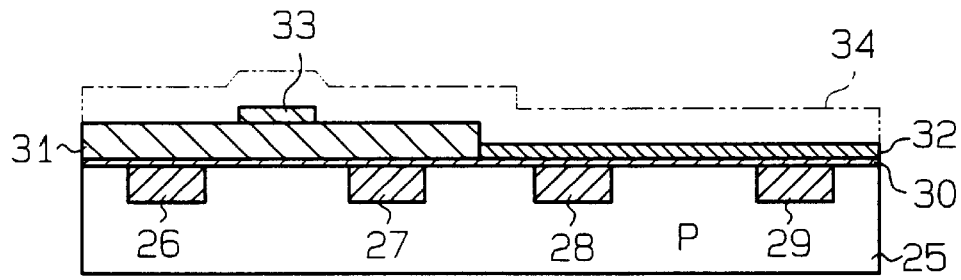
FIG. 86 is a sectional view for describing a step for fabricating the semiconductor acceleration sensor according to the tenth embodiment.

That is to say, FIG. 85 corresponds to FIG. 69 for the ninth embodiment. Accordingly, width of a film 6b of a lower side is taken to be W1, and width of a film 6a of an upper side is taken to be W2 (>W1). During fabrication, as shown in FIG. 86, a polycrystalline-silicon thin film 33 is formed on an entirety of the surface, and thereafter is patterned by dry etching or the like through a photolithographic process. Thereafter, a polycrystalline-silicon thin film 34 is formed and patterned in the configuration of a movable member.

By doing this, a device with favorable controllability for reducing deflection is obtained.

Additionally, according to the present embodiment, in the relationship between the width W1 of the lower-side film 6b and the width W2 of the upper-side film 6a, W2 is taken to be greater than W1 (W2>W1), and so in comparison with a case where the relationship is taken to be (W2<W1), it is possible to pattern the narrow-width film 33 formed firstly in a desired configuration, and form the upper-side film thereon, pattern the upper-side film to a desired configuration, and machine the movable member with favorable precision by dry etching or the like. That is to say, in a case taken to be W2<W1, it is difficult to selectively pattern only the upper-side film to a desired configuration after the configuration of the lower-side film is determined. However, according to the present embodiment, machining of the movable member becomes easier.

Figure 87:
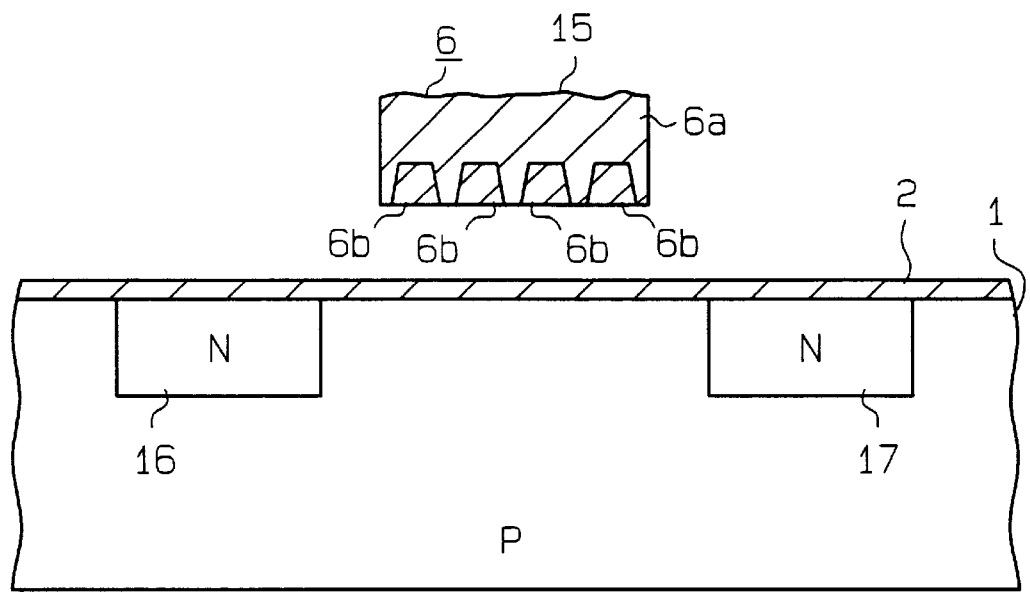
FIG. 87 is a sectional view of a semiconductor acceleration sensor according to an application of the tenth embodiment.

As a sample application of the present embodiment, it is acceptable for the film 6b of the lower-layer side to be a configuration having a multiplicity (in FIG. 87, four) of separations as shown in FIG. 87.

Additionally, it is acceptable for the lower-side film of the films making up the movable member 6 to be wider than the upper-side film. That is to say, it is acceptable to form the wider film firstly.

Moreover, FIG. 85 indicates a sectional view and indicates only difference in film width, but it is acceptable to cause the lower-side film 6b having a predetermined width W1 to extend into two-dimensional space (on a plane), and it is acceptable to cause a plurality of films of belt configuration to extend vertically and horizontally as cross stripes in plane pattern.

Additionally, it is acceptable for the plurality of thin films for movable-member forming use having differing internal-stress states to be films of differing types of material, and to perform stress adjustment for the movable member by causing the surface areas of two mutually contiguous thin films to differ. In this case, silicon (polycrystalline silicon or amorphous silicon), aluminum, chromium, titanium, nickel, an insulating material such as silicon oxide and silicon nitride, or the like can be employed as the differing types of material, producing a thin-film stacking body comprising a combination of these differing types of material. In this case as well, stress adjustment can easily be performed.

Eleventh Embodiment

Next, an eleventh embodiment will be described mainly on points of difference from the ninth embodiment.

Figure 88:
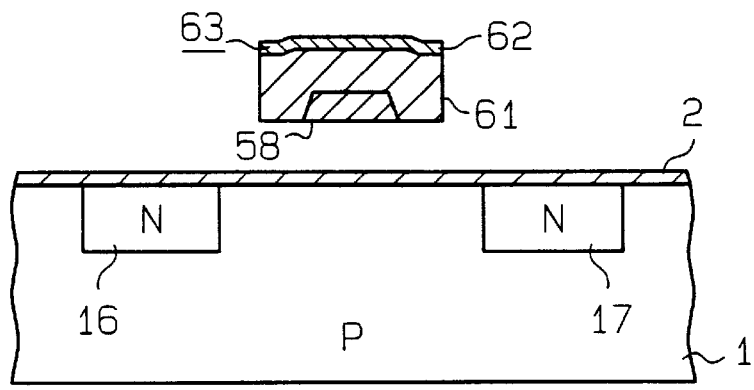
FIG. 88 is a sectional view of a semiconductor acceleration sensor according to an eleventh embodiment.

According to the present embodiment, as shown in FIG. 88, three layers of film are formed when polycrystalline silicon for a movable member 63 is deposited. In this case, a bending moment can be caused to become smaller while maintaining a still greater degree of freedom.

Specifically, the movable member 63 is made up of two types of film having differing internal-stress states, with one film sandwiched between the other film.

Figure 89:
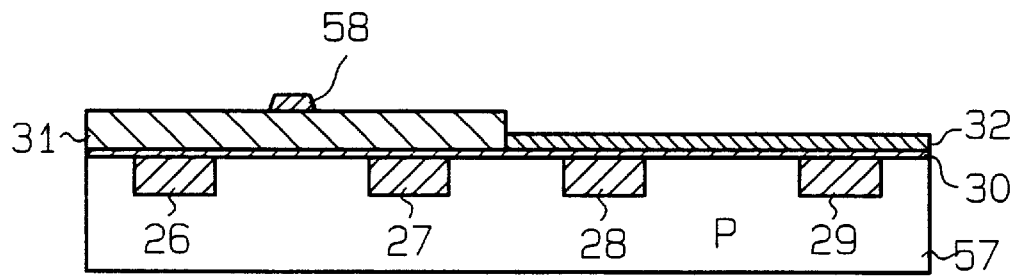
FIG. 89 through FIG. 91 are sectional views for describing steps for fabricating the semiconductor acceleration sensor according to the eleventh embodiment.
Figure 90:
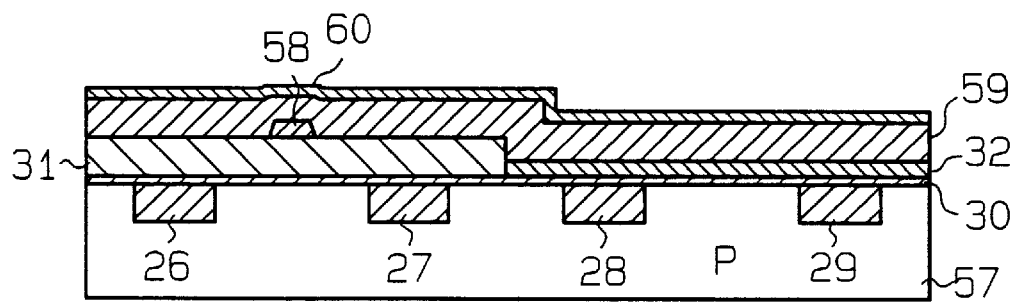
Figure 91:
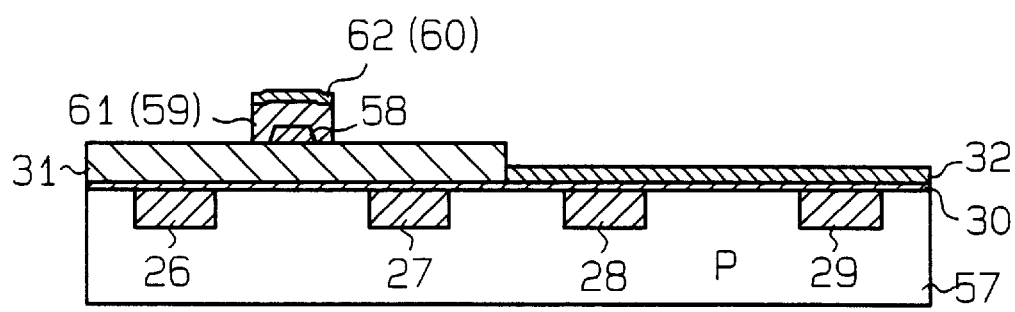

That is to say, the movable member (polycrystalline-silicon thin film) is formed utilizing a low-pressured CVD process, but forming of this movable member is performed as shown in FIG. 89 to FIG. 91.

Firstly, as shown in FIG. 89, silane (SiH$_4$) is introduced into a low-pressured CVD furnace while the furnace is at 550° C. to 580° C., and a polycrystalline-silicon thin film 58 having tensile stress and a thickness of for example 0.5 $\mu$m is formed on a silicon substrate 57. Thereafter, the polycrystalline-silicon thin film 58 is patterned to a predetermined configuration by dry etching or the like through a photolithographic process. Thereafter, a polycrystalline-silicon thin film 59 having compressive stress and a thickness of for example 1.0 $\mu$m is formed on the patterned polycrystalline-silicon thin film 58 by causing the temperature within the furnace to be 600° C. to 630° C. while keeping silane flow, as shown in FIG. 90. Further, silane (SiH$_4$) is introduced under conditions identical to the time of the polycrystalline-silicon thin film 58 (i.e., a state where the furnace is at 550° C. to 580° C.), and a polycrystalline-silicon thin film 60 having tensile stress and a thickness of for example 0.5 $\mu$m is formed on the polycrystalline-silicon thin film 59.

Then, as shown in FIG. 91, the polycrystalline-silicon thin films 59 and 60 are patterned by dry etching or the like through a photolithographic process. By means of this, a multi-layer structure of the first polycrystalline-silicon thin film 58 and second polycrystalline-silicon thin film 61 (the film 59) and third polycrystalline-silicon thin film 62 (the film 60) is formed.

Steps thereinafter are similar to the steps for fabricating the ninth embodiment (FIG. 76 through FIG. 82).

As a result of this, the bending moment becomes smaller due to a canceling-out action for the several films, and deflection when becoming the movable member of beam structure is suppressed. Consequently, acceleration can be detected with favorable accuracy while uniformly maintaining the gap between the movable member 63 and the silicon substrate 1. Additionally, the degree of freedom in the control of the internal stress in the film-thickness direction can be improved and stress alleviation becomes easier.

As a sample application of the present embodiment, it is acceptable to adopt a structure wherein four or more layers of film having differing internal-stress states are deposited as the movable member 63.

Additionally, it is acceptable for the plurality of thin films for movable-member forming use having differing internal-stress states to be films of differing types of material, and to perform stress adjustment for the movable member by causing a film of one material to be sandwiched between other films of another material. In this case, silicon (polycrystalline silicon or amorphous silicon), aluminum, chromium, titanium, nickel, an insulating material such as silicon oxide and silicon nitride, or the like can be employed as the differing types of material, producing a thin-film stacking structure comprising a combination of these differing types of material. In this case as well, reduction of deflection can easily be attempted by employing films having greatly differing internal-stress states.

Twelfth Embodiment

Next, a twelfth embodiment will be described mainly on points of difference from the ninth, tenth, and eleventh embodiments.

According to the ninth and tenth embodiments, film-forming for movable member was performed with changing the film-forming temperature in the CVD process once, and according to the eleventh embodiment, film-forming for movable member was performed with changing the film-forming temperature in the CVD process twice. However, according to the present embodiment, a movable member is structured by a plurality of polycrystalline-silicon thin films having differing internal-structure states with changing the film-forming condition (temperature, pressure or the like) three or more times.

Figure 92:
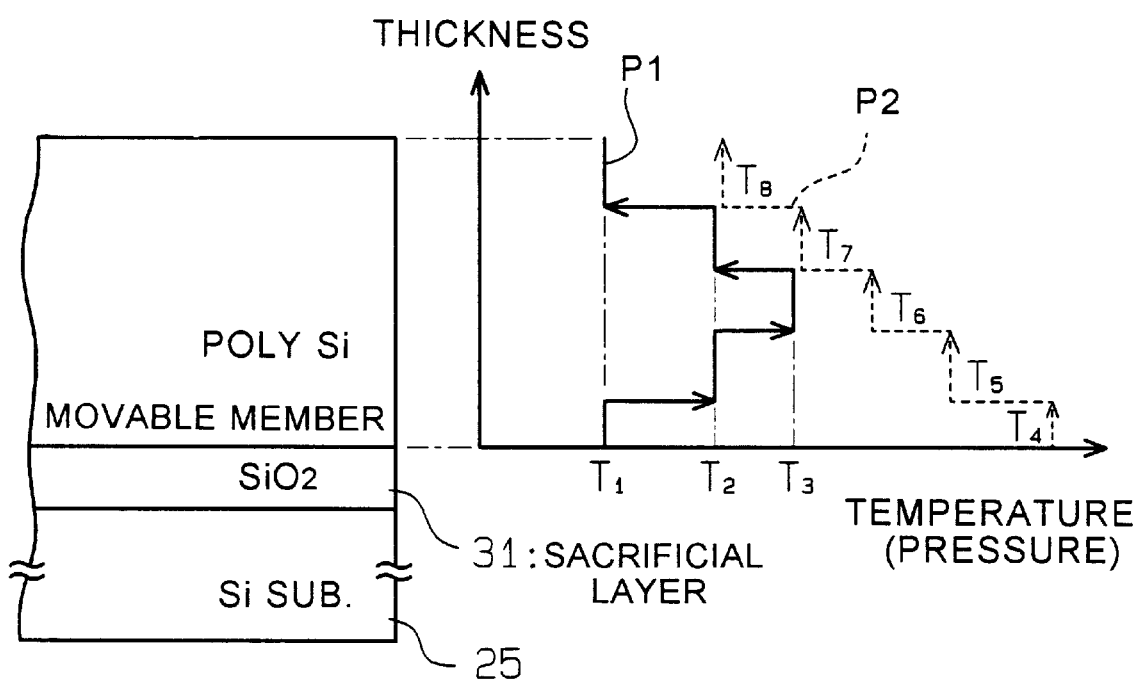
FIG. 92 is an explanatory diagram for describing steps for fabricating a semiconductor acceleration sensor according to a twelfth embodiment.

That is to say, as shown in FIG. 92, film-forming temperature in the CVD process is caused to be changed stepwisely during film deposition. In specific terms, film-forming temperature is caused to be changed as $T_1 \rightarrow T_2 \rightarrow T_3 \rightarrow T_2 \rightarrow T_1$ as a first temperature pattern P1, yielding a stacking structure of films of five layers. Alternatively, film-forming temperature is caused to be changed as $T_4 \rightarrow T_5 \rightarrow T_6 \rightarrow T_7 \rightarrow T_8$ as a second temperature pattern P2, yielding a stacking structure of films of five layers.

According to the present embodiment, a polycrystalline-silicon thin film having differing internal-stress states can be formed even when pressure within the deposition chamber, instead of film-forming temperature, is caused to be changed.

Thirteenth Embodiment

Next, a thirteenth embodiment will be described mainly on points of difference from the ninth through twelfth embodiments.

Figure 93:
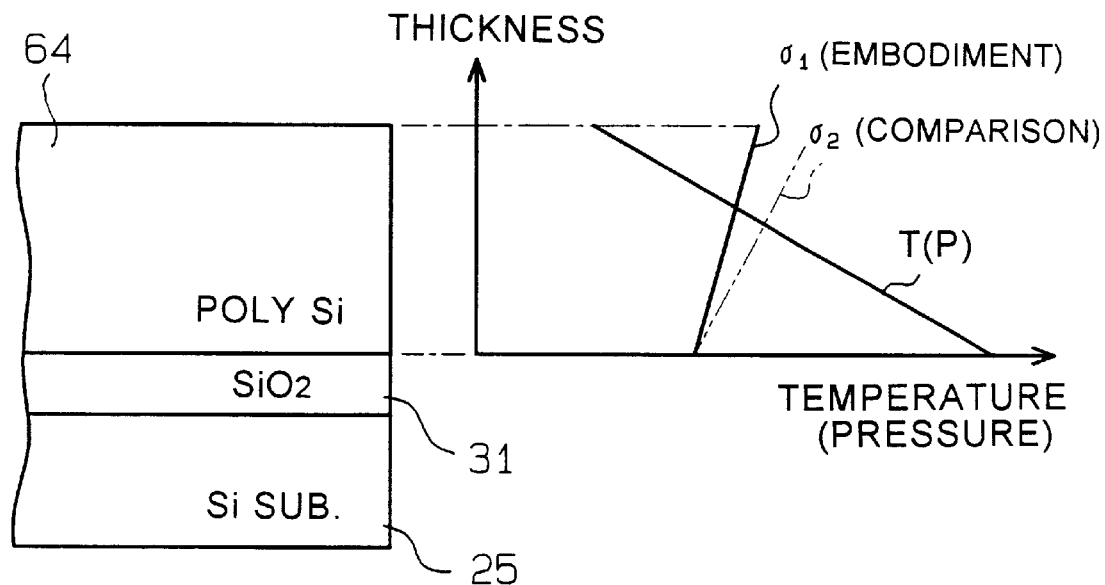
FIG. 93 is an explanatory diagram for describing steps for fabricating a semiconductor acceleration sensor according to a thirteenth embodiment.

According to the ninth through twelfth embodiments, a multiplicity films (a stack of films) having differing internal-stress states was deposited by causing film-forming temperature or film-forming pressure to be varied stepwise, but according to the present embodiment, film-forming of a polycrystalline-silicon thin film 64 with a CVD process is performed while causing film-forming temperature or film-forming pressure to continuously be varied, as shown in FIG. 93. A state of internal stress according to the present embodiment is indicated by $\sigma_1$ in FIG. 93.

That is to say, a temperature-changing pattern T (or pressure-changing pattern P) according to the present embodiment indicated by a solid line in FIG. 93 is set such that, during deposition of polycrystalline-silicon thin film for forming a movable member, the film-forming temperature is continuously (i.e., linearly) varied from 550° C. to 650° C., for example. When film-forming is performed under a condition wherein temperature is constant (comparison), the internal-stress state becomes stress $O_2$ indicated by a double broken line in FIG. 93. However, according to the embodiment, since film-forming temperature is varied, stress indicated by $\sigma_1$ in FIG. 93 is obtained, the bending moment is caused to become smaller, and thus deflection can be suppressed.

By doing this, the degree of freedom in the control of the internal stress in the film-thickness direction can be improved and stress alleviation becomes easier.

Figure 94:
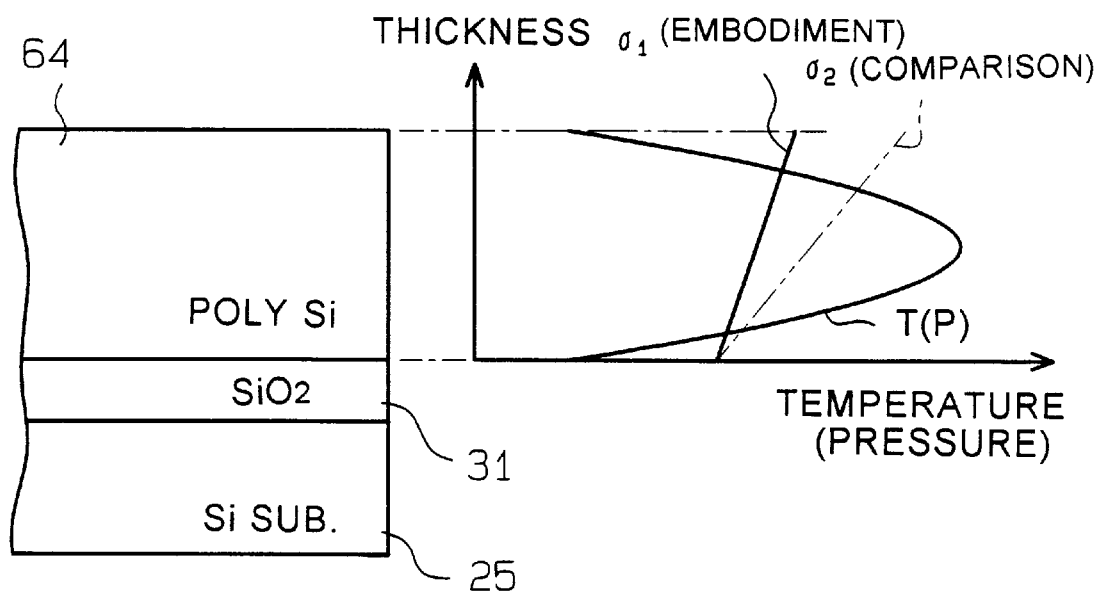
FIG. 94 is an explanatory diagram for describing another steps for fabricating a semiconductor acceleration sensor according to the thirteenth embodiment.

Another temperature-changing pattern is indicated in FIG. 94. That is to say, it is acceptable to change film-forming temperature curvilinearly, so as to be for example 550° C.→630° C.→550° C., and moreover so that temperature becomes the maximum value at a time when the deposited thin-film has a thickness corresponding to the neutral axis. Additionally, it is acceptable to vary pressure instead of temperature in this case as well.

Furthermore, film-forming temperature and pressure were given as film-forming conditions, but gas flow rate, ratio of gas flow rates in a CVD process, applied voltage during spattering, and so on, are also acceptable.

In this way, according to the present embodiment, the silicon oxide film 31 (sacrificial layer) is formed on the silicon substrate 25 (semiconductor substrate) and, along with this, the polycrystalline-silicon thin film (thin film for movable-member forming use) 64 formed while varying a film-forming condition such as temperature, pressure, or the like in a CVD process is deposited on this sacrificial layer 31, and the sacrificial layer 31 below the polycrystalline-silicon thin film (thin film for movable-member forming use) 64 is etched away. In a process for fabricating such as this, deflection of the movable member can be reduced by changing a film-forming condition for the polycrystalline-silicon thin film (thin film for movable-member forming use) 64 so that the bending moment at the neutral axis of the movable member becomes smaller.

Furthermore, amorphous silicon, aluminum, tungsten, or the like is also acceptable instead of polycrystalline silicon for the material of the movable member, and it is also acceptable for the material of the structuring films for the movable member to be identical or different. Herein, when films of material of differing types are employed as the plurality of thin films for movable-member forming use, films having greatly differing internal-stress states can be obtained.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin film includes implanting a stress-adjusting substance into said upper surface, and said implanting of said stress-adjusting substance includes controlling distribution of concentration of said stress-adjusting substance implanted in said thickness direction to induce a second stress distribution canceling said distribution of stress.

2. A method according to claim 1, wherein said controlling of said concentration distribution includes controlling an acceleration voltage during said implanting.

3. A method according to claim 1, wherein said controlling of said concentration distribution includes changing species to be implanted during said implanting, said species exhibiting projected ranges different from each other.

4. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin film includes implanting a stress-adjusting substance into said upper surface, and said stress-adjusting substance is selected from the group consisting of an impurity atom which shows the same conductivity type as said thin film, an atom making up said thin film, and an inert atom.

5. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin film includes locally etching said upper surface.

6. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin film is performed after applying a temperature greater than a maximum temperature that the thin-film structure body will be subjected to during use.

7. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin-film includes implanting a stress-adjusting substrate into said upper surface, annealing is performed after said implanting of said stress-adjusting substrate, and a temperature of said annealing is set higher than the maximum temperature during actual utilization of said thin-film structure body and is set lower than a sintering temperature of a metal disposed on said substrate.

8. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin film is performed on less than all of said upper surface of said thin film.

9. A method for fabricating a thin-film structure body, comprising:

disposing a sacrificial layer on a substrate;

forming a thin film above said substrate with said sacrificial layer interposed therebetween;

modifying an upper surface of said thin film after a formation of said thin film is completed so that distribution of stress existing in a thickness direction of said thin film is controlled to reduce a bending moment exerted on said thin film; and removing said sacrificial layer to make said thin film movable with respect to said substrate;

wherein said modifying of said upper surface of said thin film and said removing of said sacrificial layer are performed using an identical mask.

10. A method for fabricating a thin-film structure body, comprising:

disposing a sacrificial layer on a substrate;

forming a thin film above said substrate with said sacrificial layer interposed therebetween by depositing a lower film and thereon an upper film having a different internal stress state from said lower film, thereby forming said thin film, said lower film and said upper film being composed of a homogeneous material; and removing said sacrificial layer to make said thin film movable with respect to said substrate;

wherein said depositing of said lower and upper films includes varying a deposition temperature between said lower and upper films.

11. A method for fabricating a thin-film structure body, comprising:

disposing a sacrificial layer on a substrate;

forming a thin film above said substrate with said sacrificial layer interposed therebetween by depositing a lower film and thereon an upper film having a different internal stress state from said lower film, thereby forming said thin film, said lower film and said upper film being composed of a homogeneous material; and removing said sacrificial layer to make said thin film movable with respect to said substrate;

wherein said depositing of said lower and upper films includes varying a deposition pressure between said lower and upper films.

12. A method for fabricating a thin-film structure body, comprising:

forming a semiconductor element on a substrate, having an impurity diffusion region;

forming a sacrificial layer on said substrate;

forming a thin film material on said sacrificial layer;

patterning said thin-film material using a mask, whereby a configuration of said thin-film structure body is determined;

implanting impurities into a surface of said patterned thin-film material while said semiconductor element is covered with said sacrificial layer to prevent said impurities from being implanted in said semiconductor element; and removing said sacrificial layer to cause a space to be formed between said substrate and said patterned thin-film materials.

13. A method for fabricating a thin-film structure body, comprising the steps of:

forming a sacrificial layer on a semiconductor substrate; and forming a thin film on said sacrificial layer such that said thin film has a distribution of an impurity concentration in a film-thickness direction by ion-implantation performed during a formation or subsequently to the formation of said thin film, whereby deflection of a thin film after removing of said sacrificial layer is suppressed.

14. A method according to claim 13, wherein said concentration distribution in said film-thickness direction is obtained by causing acceleration voltage during said ion-implantation to be changed.

15. A method according to claim 13, wherein said concentration distribution in said film-thickness direction is obtained by changing an implanted substance during said ion-implantation.

16. A method according to claim 13, wherein said thin film is of polycrystalline silicon or amorphous silicon.

17. A method for fabricating a thin-film structure body, comprising:

forming a sacrificial layer on a semiconductor substrate;

depositing a plurality of thin films having differing internal-stress states on said sacrificial layer so as to form a stack of thin films, said plurality of thin films being composed of a homogeneous material; and etching said sacrificial layer below said stack to thereby cause said stack movable with respect to said substrate;

wherein all of said plurality of thin films are collectively made of the same homogeneous material.

18. A method for fabricating a thin-film structure body, comprising:

forming a sacrificial layer on a semiconductor substrate;

depositing a plurality of thin films having differing internal-stress states on said sacrificial layer so as to form a stack of thin films, said plurality of thin films being composed of a homogeneous material; and etching said sacrificial layer below said stack to thereby cause said stack movable with respect to said substrate;

wherein stress adjustment within said stack is performed by causing widths parallel to said semiconductor substrate of two mutually contiguous thin films to differ.

19. A method for fabricating a thin-film structure body, comprising:

forming a sacrificial layer on a semiconductor substrate;

depositing a plurality of thin films having differing internal-stress states on said sacrificial layer so as to form a stack of thin films, said plurality of thin films being composed of a homogeneous material; and etching said sacrificial layer below said stack to thereby cause said stack movable with respect to said substrate;

wherein said plurality of thin films are amorphous silicon.

20. A semiconductor sensor comprising:

a semiconductor substrate; and a movable member of beam structure disposed above said semiconductor substrate with a predetermined gap interposed therebetween, wherein:

said movable member is structured by laminating a plurality of thin films having differing internal stress states so as to form a stack of thin films, said plurality of thin films being composed of a homogeneous material; and stress adjustment within said stack is performed by causing widths parallel to said semiconductor substrate of two mutually contiguous thin films to differ.

* * * * *